US012774919B2

(12) United States Patent
Yuan et al.

(10) Patent No.: US 12,774,919 B2
(45) Date of Patent: Oct. 27, 2026

(54) VIBRATION SENSORS WITH AIR PRESSURE BALANCE

(71) Applicant: SHENZHEN SHOKZ CO., LTD., Shenzhen (CN)

(72) Inventors: Yongshuai Yuan, Shenzhen (CN); Wenjun Deng, Shenzhen (CN); Yujia Huang, Shenzhen (CN); Wenbing Zhou, Shenzhen (CN); Fengyun Liao, Shenzhen (CN); Xin Qi, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 368 days.

(21) Appl. No.: 18/353,049

(22) Filed: Jul. 14, 2023

(65) Prior Publication Data

US 2023/0358602 A1 Nov. 9, 2023

Related U.S. Application Data

(63) Continuation of application No. PCT/CN2021/129153, filed on Nov. 5, 2021.

(30) Foreign Application Priority Data

Jun. 18, 2021 (CN) ......................... 202121366390.6
Jul. 16, 2021 (WO) ................ PCT/CN2021/106947
(Continued)

(51) Int. Cl.
*G01H 13/00* (2006.01)
*G01H 11/06* (2006.01)
(Continued)

(52) U.S. Cl.
CPC ............. *G01H 13/00* (2013.01); *G01H 11/06* (2013.01); *H04R 1/283* (2013.01);
(Continued)

(58) Field of Classification Search
CPC .... B81B 2201/0257; B81B 2201/0285; B81B 2203/0127; G01H 11/06; G01H 13/00;
(Continued)

(56) References Cited

U.S. PATENT DOCUMENTS 4,012,604 A 3/1977 Speidel
4,211,898 A 7/1980 Atoji et al.
(Continued)

FOREIGN PATENT DOCUMENTS

CN 203407016 U 1/2014
CN 203748006 U 7/2014
(Continued)

OTHER PUBLICATIONS

Wang, Yongpo et al., Study On Shock And Vibration Sensing Characteristics Of A Bionic Otoliths, Chinese Journal of Sensors and Actuators, 33(5): 655-660, 2020.
(Continued)

*Primary Examiner* — David L Singer
(74) *Attorney, Agent, or Firm* — METIS IP LLC

(57) ABSTRACT

A vibration sensor includes an acoustic transducer, a vibration component, and a housing. The vibration component is connected to the acoustic transducer. The housing is configured to accommodate the acoustic transducer and the vibration component. The vibration component and the acoustic transducer form a plurality of acoustic cavities, including a first acoustic cavity spatially connected to the acoustic transducer. The vibration component includes a first hole part through which the first acoustic cavity is spatially connected to other acoustic cavities. By opening the first hole part in the vibration component, an air pressure difference between the plurality of acoustic cavities is balanced to prevent damage to internal components of the vibration sensor due to excessive pressure difference.

16 Claims, 22 Drawing Sheets

(30) Foreign Application Priority Data

Aug. 11, 2021 (CN) ......................... 202121875653.6
Aug. 11, 2021 (WO) ................ PCT/CN2021/112014
Aug. 11, 2021 (WO) ................ PCT/CN2021/112017
Aug. 19, 2021 (WO) ................ PCT/CN2021/113419

(51) Int. Cl.
*H04R 1/04* (2006.01)
*H04R 1/28* (2006.01)
*H04R 7/04* (2006.01)

(52) U.S. Cl.
CPC ................ *B81B 2201/0257* (2013.01); *B81B 2201/0285* (2013.01); *B81B 2203/0127* (2013.01); *H04R 1/04* (2013.01); *H04R 7/04* (2013.01)

(58) Field of Classification Search
CPC . H04R 1/04; H04R 1/08; H04R 1/222; H04R 1/245; H04R 1/283; H04R 17/02; H04R 19/00; H04R 19/04; H04R 7/04; H04R 9/08
See application file for complete search history.

(56) References Cited

U.S. PATENT DOCUMENTS 4,596,903 A 6/1986 Yoshizawa
4,885,781 A 12/1989 Seidel
5,146,435 A 9/1992 Bernstein
5,533,381 A 7/1996 Seale
5,852,229 A 12/1998 Josse et al.
5,940,347 A 8/1999 Raida et al.
6,667,189 B1 12/2003 Wang et al.
8,599,025 B2 12/2013 Cipriano
9,433,357 B2 9/2016 Yuen et al.
9,661,411 B1 5/2017 Han et al.
10,141,007 B1 11/2018 Kim et al.
10,527,484 B2 1/2020 Bottomly
10,722,405 B2 7/2020 Pepin et al.
11,601,073 B2 3/2023 Karami et al.
11,662,248 B2 5/2023 Yuan et al.
11,698,292 B2 7/2023 Deng et al.
12,072,228 B2 8/2024 Yuan et al.
2001/0012371 A1 8/2001 Baumhauer et al.
2002/0124656 A1 9/2002 McIntosh
2003/0123692 A1 7/2003 Ueki
2004/0140415 A1 7/2004 Watson
2006/0219016 A1 10/2006 Wang et al.
2009/0085442 A1 4/2009 Kozinsky et al.
2009/0211838 A1 8/2009 Bilan
2010/0089665 A1 4/2010 Tanaka
2011/0216933 A1 9/2011 Lan
2011/0235841 A1 9/2011 Tanaka et al.
2011/0266919 A1 11/2011 Ikehara et al.
2013/0276541 A1 10/2013 Busch et al.
2014/0028459 A1 1/2014 Solomon
2014/0112507 A1 4/2014 Van Halteren
2014/0119577 A1 5/2014 Gao et al.
2014/0233756 A1 8/2014 Inoda
2015/0016656 A1 1/2015 Chen et al.
2015/0276529 A1 10/2015 Wiesbauer et al.
2015/0350792 A1 12/2015 Grosh et al.
2015/0377693 A1 12/2015 Rose
2016/0014485 A1 1/2016 Chu et al.
2016/0069734 A1 3/2016 Harry, Jr.
2016/0316300 A1 10/2016 Qi et al.
2017/0006382 A1 1/2017 Luzzato et al.
2018/0058915 A1 3/2018 Mögelin et al.
2018/0131347 A1 5/2018 Rhee et al.
2018/0160209 A1 6/2018 Ogata et al.
2019/0098423 A1* 3/2019 Zechner ................. H04R 1/288
2019/0174244 A1 6/2019 Kim et al.
2019/0182597 A1 6/2019 Ko et al.
2019/0335271 A1* 10/2019 Post ......................... H04R 1/38
2020/0252716 A1* 8/2020 Pedersen ............... B81B 3/0027
2020/0281558 A1 9/2020 Bian et al.
2020/0322730 A1 10/2020 Kamiya et al.
2020/0413177 A1 12/2020 Zhang
2021/0051409 A1 2/2021 Duan et al.
2021/0160608 A1 5/2021 Zhang et al.
2021/0167275 A1 6/2021 Kim et al.
2021/0297782 A1 9/2021 Nakashima et al.
2021/0297788 A1 9/2021 Chou et al.
2021/0302227 A1 9/2021 Chen et al.
2021/0382085 A1 12/2021 Bretthauer et al.
2022/0127135 A1 4/2022 Mogelin et al.
2022/0345830 A1 10/2022 Banerjee et al.
2022/0349745 A1* 11/2022 Hong ..................... H04R 19/04
2022/0377480 A1* 11/2022 Hong .................. H04R 31/006
2022/0386038 A1 12/2022 Du et al.
2022/0386039 A1 12/2022 Krajewski et al.
2023/0046902 A1 2/2023 Yuan et al.
2023/0269506 A1 8/2023 Fang et al.
2024/0377243 A1 11/2024 Yuan et al.

FOREIGN PATENT DOCUMENTS

CN 104284272 A 1/2015
CN 104300831 A 1/2015
CN 104374498 A 2/2015
CN 104378724 A 2/2015
CN 104602172 A 5/2015
CN 105072551 A 11/2015
CN 204887455 U 12/2015
CN 205547358 U 9/2016
CN 106454651 A 2/2017
CN 106954164 A 7/2017
CN 106982399 A 7/2017
CN 206728276 U 12/2017
CN 107948888 A 4/2018
CN 108337617 A 7/2018
CN 108471258 A 8/2018
CN 109141696 A 1/2019
CN 208386931 U 1/2019
CN 208434106 U 1/2019
CN 110022045 A 7/2019
CN 209105452 U 7/2019
CN 209314103 U 8/2019
CN 209526834 U * 10/2019 ............... H04R 1/08
CN 209526836 U 10/2019
CN 209526837 U 10/2019
CN 209526861 U 10/2019
CN 209526879 U 10/2019
CN 209526886 U 10/2019
CN 209659621 U * 11/2019 ............. H04R 19/04
CN 110536220 A 12/2019
CN 110603818 A 12/2019
CN 110631685 A 12/2019
CN 209945545 U 1/2020
CN 110972045 A * 4/2020 ............. H04R 19/04
CN 111031424 A 4/2020
CN 109819390 B 5/2020
CN 111131988 A * 5/2020 ............. H04R 19/04
CN 210513399 U * 5/2020 ............. G01H 11/06
CN 210513400 U * 5/2020 ............. G01H 11/06
CN 210609600 U 5/2020
CN 210641062 U * 5/2020 ............. H04R 19/00
CN 210641073 U * 5/2020 ............. H04R 19/00
CN 210958708 U 7/2020
CN 211085470 U 7/2020
CN 111510834 A 8/2020
CN 111556419 A 8/2020
CN 111741418 A 10/2020
CN 111818409 A 10/2020
CN 111988717 A 11/2020
CN 211930817 U 11/2020
CN 211930818 U 11/2020
CN 211930820 U 11/2020
CN 211930871 U * 11/2020 ............. H04R 19/00
CN 212086490 U * 12/2020 ............. H04R 19/04
CN 212110308 U 12/2020
CN 212324362 U * 1/2021 ............. H04R 19/04

(56) References Cited

FOREIGN PATENT DOCUMENTS

| | | | | | |
|---|---|---|---|---|---|
| CN | 212486781 | U | | 2/2021 | |
| CN | 212572961 | U | * | 2/2021 | ............ H04R 19/04 |
| CN | 112565993 | A | | 3/2021 | |
| CN | 112565995 | A | | 3/2021 | |
| CN | 212785847 | U | | 3/2021 | |
| CN | 112601169 | A | | 4/2021 | |
| CN | 112714389 | A | | 4/2021 | |
| CN | 213186548 | U | | 5/2021 | |
| CN | 213280084 | U | | 5/2021 | |
| CN | 111131988 | B | | 6/2021 | |
| CN | 112995866 | A | | 6/2021 | |
| CN | 213342678 | U | | 6/2021 | |
| CN | 213403413 | U | | 6/2021 | |
| CN | 213485163 | U | | 6/2021 | |
| CN | 111065009 | B | | 7/2021 | |
| CN | 213783592 | U | | 7/2021 | |
| CN | 113259795 | A | | 8/2021 | |
| CN | 113259818 | A | | 8/2021 | |
| CN | 216852329 | U | | 6/2022 | |
| CN | 115706907 | A | | 2/2023 | |
| DE | 102015217741 | A1 | | 3/2017 | |
| EP | 1067513 | A1 | | 1/2001 | |
| EP | 2505003 | B1 | | 1/2020 | |
| JP | H02155400 | A | | 6/1990 | |
| JP | H07244168 | A | | 9/1995 | |
| JP | H08195995 | A | | 7/1996 | |
| JP | 2008150072 | A | | 7/2008 | |
| JP | 2018186572 | A | | 11/2018 | |
| RU | 198558 | U1 | | 7/2020 | |
| TW | 201924468 | A | | 6/2019 | |
| WO | 2007111405 | A1 | | 10/2007 | |
| WO | 2017199176 | A1 | | 11/2017 | |
| WO | 2020000594 | A1 | | 1/2020 | |
| WO | 2021031497 | A1 | | 2/2021 | |
| WO | 2021031498 | A1 | | 2/2021 | |

OTHER PUBLICATIONS

International Search Report in PCT/CN2021/129153 mailed on Feb. 23, 2022, 7 pages.

International Search Report in PCT/CN2021/106947 mailed on Apr. 13, 2022, 8 pages.

International Search Report in PCT/CN2021/112014 mailed on Jan. 19, 2022, 8 pages.

International Search Report in PCT/CN2021/112017 mailed on May 5, 2022, 6 pages.

International Search Report in PCT/CN2021/113419 mailed on Mar. 28, 2022, 7 pages.

Zhou, Jianmin, Design Method to Improve the Sensitivity of MEMS Microphone, Integrated Circuit Application, 2014, 6 pages.

Wang, Hongbin et al., Appliance of the Senser Technology in the Yang-Stgle Fazzy Variable, Physical Experiment of College, 2003, 7 pages.

Office Action in Russian Application No. 2022121169 mailed on Mar. 10, 2023, 14 pages.

Notice of Preliminary Rejection in Korean Application No. 10-2022-7032951 mailed on Oct. 29, 2024, 12 pages.

First Office Action in Chinese Application No. 202110809269.4 mailed on May 23, 2025, 19 pages.

Sun, Quansheng, Capacitive MEMS Microphones with a Low-stress Ultra-thin Vibrating Membrane, Full-Text Database of Excellent Master's Dissertations in China, 2021, 65 pages.

Office Action in Indian Application No. 202217044660 mailed on Oct. 10, 2025, 6 pages.

Ki Woong Seong et al., A Vibro-Acoustic Hybrid Implantable Microphone for Middle Ear Hearing Aids and Cochlear Implants, Sensors, 2019, 14 pages.

Notice of Preliminary Rejection in Korean Application No. 10-2022-7033038 mailed on Apr. 30, 2024, 14 pages.

First Office Action in Chinese Application No. 202110919047.8 mailed on Mar. 25, 2025, 16 pages.

Fang, Huabin et al., Study of Micro Vibration Pickup Sensor Fabricated by MEMS Technique, Electronic Components & Materials, 25(7): 69-71, 2006.

First Office Action in Chinese Application No. 202110751143.6 mailed on Mar. 20, 2025, 16 pages.

Du, Yangbo, Main Factors Influencing Dynamic Loudspeaker Tone Quality, Audio Engineering, 41(9/10): 45-48, 2017.

The Second Office Action in Chinese Application No. 202110751143.6 mailed on Jul. 10, 2025, 15 pages.

Notice of Rejection in Japanese Application No. 2022-559379 mailed on Feb. 13, 2024, 10 pages.

Office Action in Russian Application No. 2022121511 mailed on Mar. 17, 2023, 22 pages.

Zhang, Qichang et al., Nonlinear in Vibration Energy Collection Application in The Field, Nonlinear Dynamics and Applications, Tianjin University Press, 2021, 10 Pages.

Notice of Rejection in Japanese Application No. 2022-559379 mailed on Oct. 23, 2023, 8 pages.

* cited by examiner

500

(a)

(b)

(a)

(b)

3600

3700

VIBRATION SENSORS WITH AIR PRESSURE BALANCE

CROSS-REFERENCE TO RELATED APPLICATIONS

This application is a Continuation of International Application No. PCT/CN2021/129153, filed on Nov. 5, 2021, which claims priority to the Chinese Application No. 202121366390.6, filed on Jun. 18, 2021, the International Application No. PCT/CN2021/106947, filed on Jul. 16, 2021, the Chinese Application No. 202121875653.6, filed on Aug. 11, 2021, the International Application No. PCT/CN2021/112014, filed on Aug. 11, 2021, the International Application No. PCT/CN2021/112017, filed on Aug. 11, 2021, and the International Application No. PCT/CN2021/113419, filed on Aug. 19, 2021, the entire contents of each of which are incorporated herein by reference.

TECHNICAL FIELD

The present disclosure relates to the field of sensors, and in particular to vibration sensors.

BACKGROUND

The vibration sensor is an energy conversion device that converts vibration signals into electrical signals. The vibration sensor usually includes an acoustic transducer and a vibration component for sound pickup. When the vibration component vibrates in the housing, the air pressure difference of the acoustic cavities on both sides of the vibration component may hinder the vibration of the vibration component and cause damage to the internal components (e.g., the acoustic transducer) of the vibration sensor, thereby affecting the working stability of the vibration sensor.

Therefore, it is desirable to provide a vibration sensor that can well eliminate the air pressure difference on both sides of the vibration component, thereby improving the vibration performance of the vibration component and the working stability of the vibration sensor.

SUMMARY

One of the embodiments of the present disclosure provides a vibration sensor. The vibration sensor includes an acoustic transducer, a vibration component, and a housing. The housing is configured to accommodate the acoustic transducer and the vibration component, and generate vibrations based on an external vibration signal. The vibration component and the acoustic transducer form a plurality of acoustic cavities including a first acoustic cavity. The first acoustic cavity is spatially connected to the acoustic transducer. The vibration component causes a sound pressure change of the first acoustic cavity in response to the vibrations of the housing. The acoustic transducer generates an electrical signal based on the sound pressure change of the first acoustic cavity. The vibration component includes a first hole part. The first acoustic cavity is spatially connected to the other acoustic cavities of the plurality of acoustic cavities through the first hole part.

BRIEF DESCRIPTION OF THE DRAWINGS

The present disclosure is further illustrated in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

Figure 1:
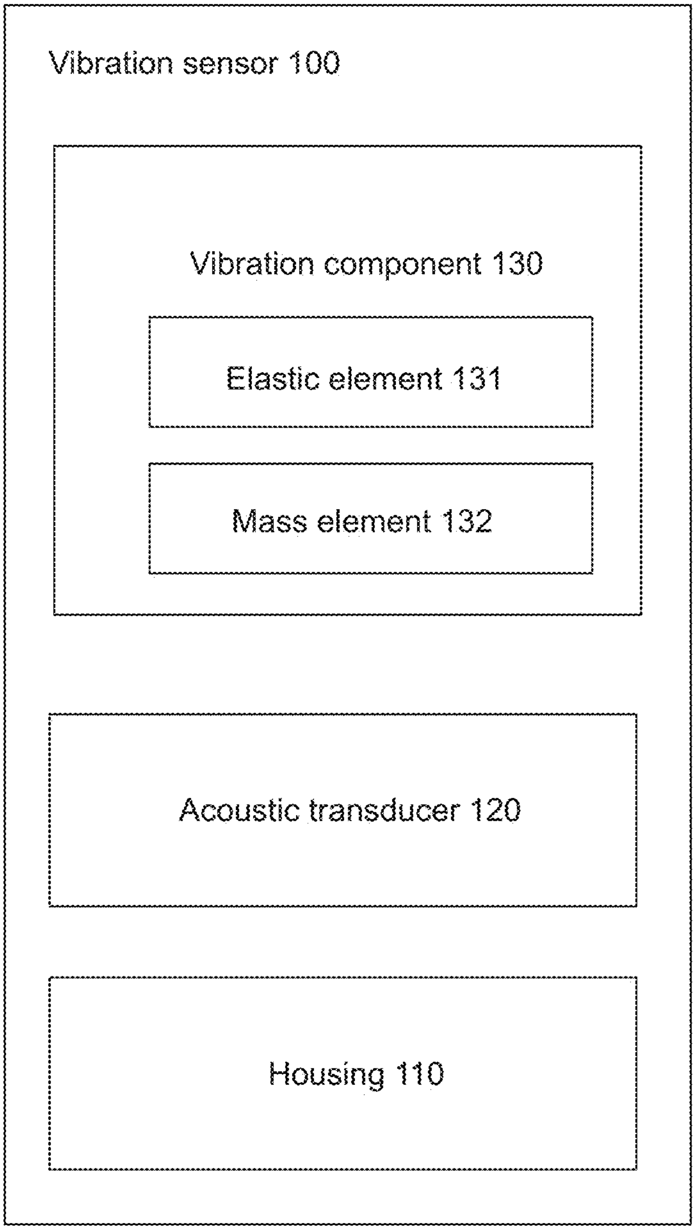
FIG. 1 is a block diagram illustrating a vibration sensor according to some embodiments of the present disclosure.

In order to more clearly illustrate the technical solutions related to the embodiments of the present disclosure, a brief introduction of the drawings referred to the description of the embodiments is provided below. Obviously, the drawings described below are only some examples or embodiments of the present disclosure. Those having ordinary skills in the art, without further creative efforts, may apply the present disclosure to other similar scenarios according to these drawings. Unless obviously obtained from the context or the context illustrates otherwise, the same numeral in the drawings refers to the same structure or operation.

It should be understood that “system”, “device”, “unit” and/or “module” as used herein is a method for distinguishing different components, elements, parts, portions, or assemblies of different levels. However, the words may be replaced by other expressions if other words can achieve the same purpose.

As indicated in the disclosure and claims, the terms “a”, “an”, “an” and/or “the” are not specific to the singular form and may include the plural form unless the context clearly indicates an exception. Generally speaking, the terms “comprising” and “including” only suggest the inclusion of clearly identified steps and elements, and these steps and elements do not constitute an exclusive list, and the method or device may also contain other steps or elements.

The flowchart is used in the present disclosure to illustrate the operations performed by the system according to the embodiments of the present disclosure. It should be understood that the preceding or following operations are not necessarily performed in the exact order. Instead, various steps may be processed in reverse order or simultaneously. Meanwhile, other operations may be added to these procedures, or a certain step or steps may be removed from these procedures.

The present disclosure provides a vibration sensor. In some embodiments, the vibration sensor includes an acoustic transducer, a vibration component, and a housing. The housing is configured to accommodate the acoustic transducer and the vibration component, and generate vibrations based on an external vibration signal. The vibration component is configured to transmit the external vibration signal to the acoustic transducer to generate an electrical signal. The vibration component and the acoustic transducer form a plurality of acoustic cavities including a first acoustic cavity. The first acoustic cavity is spatially connected to the acoustic transducer. The vibration component causes a sound pressure change of the first acoustic cavity in response to the vibrations of the housing. The acoustic transducer generates the electrical signal based on the sound pressure change of the first acoustic cavity. In some embodiments, the vibration component includes a first hole part. The first acoustic cavity is spatially connected to the other acoustic cavities (e.g., a second acoustic cavity) of the plurality of acoustic cavities through the first hole part. The first hole part may enable the first acoustic cavity and the other acoustic cavities located on both sides of the vibration component to be spatially connected, to adjust air pressures of the first acoustic cavity and the other acoustic cavities of the plurality of acoustic cavities, balance an air pressure difference of the two acoustic cavities, and prevent internal components of the vibration sensor from being damaged due to an excessive pressure difference.

In some embodiments, a third hole part may be arranged on the housing. The third hole part enables an external environment and the acoustic cavity inside the housing to be spatially connected, thereby reducing the resistance of the vibration component during vibration and improving the sensitivity of the vibration sensor. In some embodiments, the third hole part and the first hole part are distributed in a staggered manner along a direction (also referred to as a first direction) perpendicular to a vibration direction of the vibration component, so that an airflow passing through the third hole part does not directly enter the first hole part, a rate of air pressure change on a side of the vibration component facing the third hole part may is too fast, thus the vibration component may sense subtle vibrations in time, and the detection effect of the vibration sensor may be guaranteed.

FIG. 1 is a block diagram illustrating a vibration sensor according to some embodiments of the present disclosure. As shown in FIG. 1, in some embodiments, a vibration sensor 100 may include a housing 110, an acoustic transducer 120, and a vibration component 130. In some embodiments, the housing 110 is configured to accommodate the acoustic transducer 120 and the vibration component 130, and generate vibrations based on an external vibration signal. In some embodiments, the vibration component 130 and the acoustic transducer 120 form a plurality of acoustic cavities including a first acoustic cavity. The first acoustic cavity is spatially connected to the acoustic transducer 120. When vibrations occur in the external environment, the housing 110 generates the vibrations based on the vibration signal in the external environment. The vibration component 130 causes a sound pressure change of the first acoustic cavity in response to the vibrations of the housing 110. The acoustic transducer 120 generates an electrical signal based on the sound pressure change of the first acoustic cavity. In some embodiments, the vibration component 130 includes an elastic element 131 and a mass element 132. The mass element 132 may be physically connected to the elastic element 131. The elastic element 132 may be connected to the housing 110 or a structure (e.g., a substrate) of the acoustic transducer 120. In some embodiments, the vibration component 130 may include a first hole part. The first hole part may be configured to spatially connect the first acoustic cavity and other acoustic cavities. The first hole part may enable the first acoustic cavity and the other acoustic cavities located on both sides of the vibration component to be spatially connected, to adjust air pressures of the two acoustic cavities, balance an air pressure difference of the two acoustic cavities, and prevent the vibration sensor 100 from being damaged. In some embodiments, the first hole part may be located at the elastic element 131 or the mass element 132. For example, the first hole part may be located in a region on the elastic element 131 not covered by the mass element 132. As another example, the first hole part may penetrate through the elastic element 131 and the mass element 132 simultaneously.

The vibration sensor 100 may be applied to a mobile device, a wearable device, a virtual reality (VR) device, an augmented reality (AR) device, or the like, or any combination thereof. In some embodiments, the mobile device may include a smartphone, a tablet computer, a personal digital assistant (PDA), a gaming device, a navigation device, or the like, or any combination thereof. In some embodiments, the wearable device may include a smart bracelet, an earphone, a hearing aid, a smart helmet, a smart watch, smart clothing, a smart backpack, a smart accessory, or the like, or any combination thereof. In some embodiments, the VR device and/or the AR device may include a VR helmet, VR glasses, a VR patch, an AR helmet, AR glasses, an AR patch, or the like, or any combination thereof.

Figure 2:
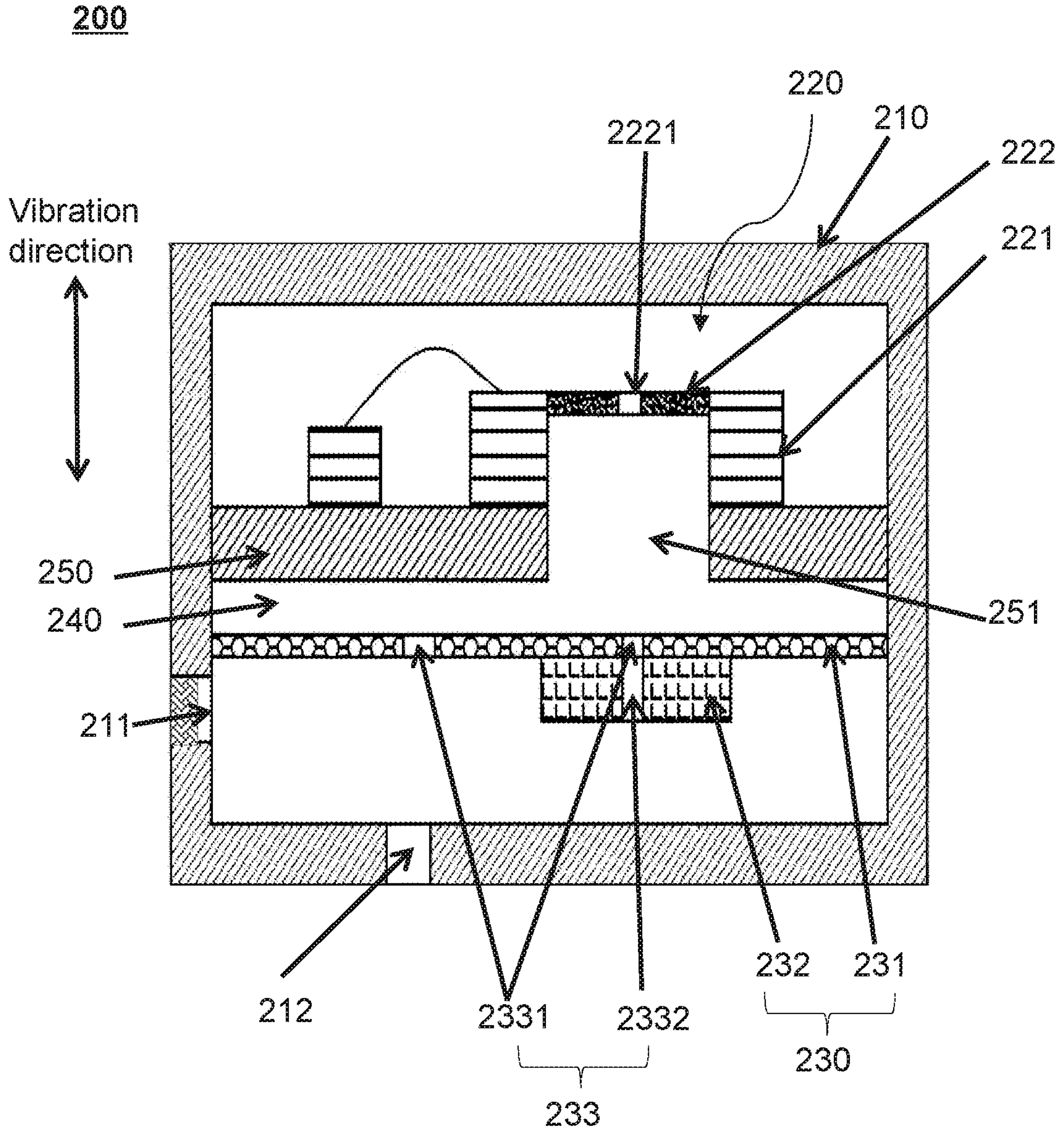
FIG. 2 is a schematic diagram illustrating a structure of a vibration sensor according to some embodiments of the present disclosure.

FIG. 2 is a schematic diagram illustrating a structure of a vibration sensor according to some embodiments of the present disclosure. As shown in FIG. 2, in some embodiments, a vibration sensor 200 may include a housing 210, an acoustic transducer 220, and a vibration component 230. The acoustic transducer 220 and the vibration component 230 may be located in the housing 210. In some embodiments, s shape of the housing 210 may be a cuboid, a quasi-cuboid, a cylinder, a sphere, or any other shape. In some embodiments, the housing 210 may enclose an accommodating space, and the acoustic transducer 220 and the vibration component 230 may be arranged in the accommodating space. In some embodiments, the housing 210 may be made of a material with a certain hardness, so that the housing 210 may protect the acoustic transducer 220 and the vibration component 230. In some embodiments, the materials for manufacturing the housing 210 may include but are not limited to a PCB material (e.g., an FR-1 phenolic paper substrate, an FR-2 phenolic paper substrate, an FR-3 epoxy paper substrate, an FR-4 epoxy glass cloth board, a CEM-1 epoxy glass cloth-paper composite board, a CEM-3 epoxy glass cloth-glass stand board, etc.), an acrylonitrile-butadiene-styrene copolymer (ABS), polystyrene (PS), high impact polystyrene (HIPS), polypropylene (PP), polyethylene terephthalate (PET), polyester (PES), polycarbonate (PC), polyamide (PA), polyvinylchloride (PVC), polyurethane (PU), polyvinylidenechloride, polyethylene (PE), polymethyl methacrylate (PMMA), polyetheretherketone (PEEK), phenolic resin (PF), urea-formaldehyde (UF) resin, melamine-formaldehyde resin (MF), and some metals, alloys (e.g., an aluminum alloy, chrome-molybdenum steel, a scandium alloy, a magnesium alloy, a titanium alloy, a magnesium-lithium alloy, a nickel alloy, etc.), any material of glass fibers or carbon fibers, or a combination of thereof. It should be noted that in some embodiments, the housing 210 may be a complete housing structure, or a combination of a plurality of housing structures, and the above two forms of the housing 210 may be alternatives. For example, the acoustic transducer 220 has a first housing, the vibration component 230 is connected to the acoustic transducer 220, and a second housing is connected to the first housing to form a space for accommodating the vibration component 230. The specific structure and components of the housing 210 may also be applicable to other embodiments.

In some embodiments, the housing 210, the vibration component 230, and the acoustic transducer 220 may form a plurality of acoustic cavities including a first acoustic cavity 240. In some embodiments, the acoustic transducer 220 may include a sound pickup device 221 and a substrate 250. The substrate 250 may be connected to the housing 210 through a peripheral side of the substrate 250. The sound pickup device 221 may be located on a side of the substrate 250 away from the vibration component 230. In some embodiments, the substrate 250 may include a sound pickup hole 251. The first acoustic cavity 240 may be spatially connected to the acoustic transducer 220 through the sound pickup hole 251. The acoustic transducer 220 may obtain a sound pressure change of the first acoustic cavity 240, and convert the sound pressure change of the first acoustic cavity 240 into an electrical signal. In some embodiments, the sound pickup device 221 may include a capacitive transducer, a piezoelectric transducer, or other transducers according to the transducer principle, which is not limited in the present disclosure.

In some embodiments, the vibration component 230 may include an elastic element 231 and a mass element 232. A peripheral side of the elastic element 231 may be connected to an inner wall of the housing 210. The mass element 232 may be located on an upper side (i.e., a side facing the substrate 250 in the figure) or a lower side (i.e., a side away from the substrate 250 in the figure) of the elastic element 231.

When the vibration component 230 vibrates, an air pressure difference of the acoustic cavities on both sides of the vibration component 230 may hinder the vibration of the vibration component 230, and damage internal components (e.g., the acoustic transducer 220, etc.) of the vibration sensor 200, thereby affecting the working stability of the vibration sensor 200. In some embodiments, the vibration component 230 may include a first hole part 233. The first acoustic cavity 240 may be spatially connected to the other acoustic cavities of the plurality of acoustic cavities through the first hole part 233. The first hole part 233 may be spatially connected to the first acoustic cavity 240 and the other acoustic cavities located on both sides of the vibration component 230, to adjust air pressures of the first acoustic cavity and the other acoustic cavities, balance an air pressure difference between the acoustic cavities, and prevent the vibration sensor 200 from being damaged. In some embodiments, the other acoustic cavities of the plurality of acoustic cavities may be different from cavities formed between the first acoustic cavity 240, the vibration component 230, and the housing 210, such as an acoustic cavity formed by the side of the vibration component 230 away from the substrate 250 and the housing 210. In some embodiments, the first hole part 233 may include a first sub-hole part 2331. The first sub-hole part 2331 may be arranged in a region on the elastic element 231 not covered by the mass element 232, so that the first acoustic cavity 240 may be spatially connected to the other acoustic cavities of the plurality of acoustic cavities. In some embodiments, a hole part may be arranged on both the elastic element 231 and the mass element 232, so that the first acoustic cavity 240 may be spatially connected to the other acoustic cavities of the plurality of acoustic cavities. For example, the first hole part 233 may include a first sub-hole part 2331 and a second sub-hole part 2332. The first sub-hole part 2331 may be arranged on the elastic element 231, the second sub-hole part 2332 may be arranged on the mass element 232, and the second sub-hole part 2332 may be spatially connected to the first sub-hole part 2331. In some embodiments, a size of the first sub-hole part 2331 and a size of the second sub-hole part 2332 may be the same or different. The specific descriptions regarding the first hole part 233 may be found in the relevant descriptions in FIG. 24 and FIG. 25, which are not repeated here.

In some embodiments, the elastic element 231 may be a film-shaped structure allowing air to pass through, i.e., the elastic element 231 may be a gas-permeable film. The elastic element 231 is configured to allow air to pass through, so that the first acoustic cavity 240 and the other acoustic cavities located on both sides of the elastic element 231 may be spatially connected, to adjust the air pressure of the two acoustic cavities, balance the air pressure difference of the two acoustic cavities, and prevent the vibration sensor 200 from being damaged. In some embodiments, a material of the elastic element 231 may be a material that produces elastic deformation in a certain range. Specifically, the elastic element 231 may be made of at least one of the following materials: polytetrafluoroethylene (PTFE), expanded polytetrafluoroethylene (ePTFE), polyethersulfone (PES), polyvinylidene fluoride (PVDF), polyethylene Propylene (PP), polyethylene terephthalate (PETE), nylon, nitrocellulose (NC), mixed cellulose (MCE), etc. In some embodiments, a thickness of the elastic element 231 may be in a range of 0.05 μm-100 μm. Specifically, the thickness of the elastic element 231 may be related to the material of the elastic element 231. For example, when ePTFE is selected as the material of the elastic element 231, a thickness of ePTFE may be in a range of 0.5 μm-100 μm, and a preferred thickness of an ePTFE film may be in a range of 1 μm-10 μm, such as 2 μm, 5 μm, 7 μm, etc. In some embodiments, preferably, a minimum air permeability of the ePTFE film may be controlled not to be less than 10 L/hr, to ensure a good air permeability, while the ePTFE film may provide a certain degree of waterproof performance to protect the internal components. In some embodiments, a material of the mass element 232 may be the same as the material of the elastic element 231. For example, both the mass element and the elastic element 231 may be made of a gas-permeable material. In some embodiments, the material of the mass element 232 may be different from the material of the elastic element 231. For example, the elastic element 231 may be made of the gas-permeable material, and the mass element 232 may be made of a hard material (e.g., iron, copper, silicon, etc.).

In some embodiments, a shape of the elastic element 231 may include circular, rectangular, triangular, or irregular figures, etc. In some embodiments, the shape of the elastic element 231 may be set according to an actual situation, which is not limited in the present disclosure. In some embodiments, a shape of the mass element 232 may be a regular such as a cylinder, a truncated cone, a cone, a cube, or a triangle, or an irregular structure. In some embodiments, the material of the mass element 232 may be one or more of copper, tin, other alloys, or a composite material thereof. In some embodiments, the vibration sensor 200 may be applied to a MEMS device. In the process of the MEMS device, the mass element 232 may be a single-layer material, such as Si, Cu, etc., or a double-layer or multi-layer composite material, such as $Si/SiO_2$, $SiO_2/Si$, $Si/SiN_x$, $SiN_x/Si/SiO_2$, etc. In some embodiments, the elastic element 231 may be made of the single-layer material, such as Si, $SiO_2$, $SiN_x$, SiC, etc., or the double-layer or multi-layer composite material, such as $Si/SiO_2$, $SiO_2/Si$, $Si/SiN_x$, $SiN_x/Si/SiO_2$, etc along a thickness direction of the elastic element 231. The details may be found in the relevant descriptions in FIGS. 17-23, which is not repeated here.

In the process of assembling the vibration sensor 200, a welding process may be used, and gas in the acoustic cavities on both sides of the substrate 250 of the housing 210 may have a pressure change during welding, which may cause a phenomenon of uneven pressure inside the housing 210, and cause damage to the components of the vibration sensor 200, such as cracking and deformation, thereby affecting the performance of the vibration sensor 200. In some embodiments, a second hole part 211 may be arranged on the housing 210. The first acoustic cavity 240, the other acoustic cavities of the plurality of acoustic cavities, and the acoustic transducer 220 may be spatially connected to the outside through the second hole part 211. During the assembly process of the vibration sensor 200, the second hole part 211 may deliver the gas inside the housing 210 to the outside. Thus, by setting the second hole part 211, when the vibration component 230 and the acoustic transducer 220 are assembled, failure of the vibration component 230 (e.g., the elastic element 231) and the acoustic transducer 220 due to an excessive air pressure difference between inner and outer spaces of the housing 210 may be avoided, thereby reducing the difficulty of assembling the vibration sensor 200. In some embodiments, the second hole part 211 may be located at a portion of the housing 210 corresponding to the first acoustic cavity 240. The second hole part 211 may be spatially connected to the first acoustic cavity 240, the first acoustic cavity 240 may be spatially connected to the other acoustic cavities through the first hole part 233, and the first acoustic cavity 240 may be spatially connected to a cavity where the acoustic transducer 220 is located through a diaphragm structure with a gas-permeable effect at the sound pickup hole 251, so that air pressures of the first acoustic cavity 240, the other acoustic cavities, and the cavity where the acoustic transducer 220 is located may be balanced with an external air pressure. In some embodiments, the second hole part 211 may be located at a portion of the housing 210 corresponding to the other acoustic cavities. For example, the second hole part 211 may be located at a portion of the housing 210 corresponding to the acoustic cavity formed by the housing 210 and a side of the vibration component 230 away from the acoustic transducer 220. In some embodiments, the second hole part 211 may be located at a portion of the housing 210 corresponding to the cavity where the acoustic transducer 220 is located.

In some embodiments, air conduction sound in the environment may affect the use performance of the vibration sensor 200. In order to reduce the impact of the air conduction sound in the environment, after the vibration sensor 200 is manufactured or before the vibration sensor 200 is applied to an electronic device, the second hole part 211 may be sealed with a sealing material, so as not to affect the performance of the vibration sensor 200. In some embodiments, the second hole part 211 may be sealed by means of using a sealant, bonding a sealing tape, adding a sealing plug, or the like.

When the vibration component 230 vibrates, the inside of the housing 210 may be a closed space, which may generate vibration resistance to the vibrations of the vibration component 230, which is not conducive to the vibration component 230 driving the gas in the acoustic cavity to vibrate, thereby affecting the sensitivity of the vibration sensor 200. In some embodiments, a third hole part may be arranged on the housing 210. The third hole part 212 may enable the external environment and the acoustic cavity inside the housing 210 to be spatially connected, thereby reducing the vibration resistance of the vibration component 230 and improving the sensitivity of the vibration sensor 200. In some embodiments, the third hole part 212 and the first hole part 233 may be distributed in a misalignment manner along a direction perpendicular to the vibration direction of the vibration component 230. The misalignment of the third hole part 212 and the first hole part 233 may prevent an airflow passing through the third hole part 212 from directly entering the first hole part 233, so that a rate of air pressure change on a side of the vibration component facing the third hole part may not be too fast, thus the vibration component may sense subtle vibrations in time, and the pickup effect of the vibration sensor on the external vibration signal may be guaranteed. In some embodiments, the third hole part 212 may be located at a portion the housing 210 corresponding to the first acoustic cavity 240. The third hole part 212 may be spatially connected to the first acoustic cavity 240, the first acoustic cavity 240 may be spatially connected to the other acoustic cavities, and the first acoustic cavity 240 may be spatially connected to a cavity where the acoustic transducer 220 is located through a diaphragm structure with a gas-permeable effect at the sound pickup hole 251, so that the air pressures of the first acoustic cavity 240, the other acoustic cavities, and the cavity where the acoustic transducer 220 is located may be balanced with the external air pressure. In some embodiments, the third hole part 212 may be located at a portion of the housing 210 corresponding to the other acoustic cavities. For example, the third hole part 212 may be located at a portion of the housing 210 corresponding to the acoustic cavity formed by the housing 210 and a side of the vibration component 230 away from the acoustic transducer 220. In some embodiments, the third hole part 212 may be located at a portion of the housing 210 corresponding to the cavity where the acoustic transducer 220 is located. In order to enable the third hole part 212 to better reduce the vibration resistance of the vibration component 230, in some embodiments, a diameter of the third hole part 212 may be greater than 2 μm. In order to improve the isolation capability of the third hole part 212 to better prevent an entry of moisture, dust, and other substances from the outside, in some embodiments, the diameter of the third hole part 212 may be less than 40 μm. In order to enable the third hole part 212 to better reduce the vibration resistance of the vibration component 230, and ensure waterproof and dustproof effects of the third hole parts 212, in some embodiments, the diameter of the third hole part 212 may be in a range of 2 μm-40 μm. In some embodiments, the diameter of the third hole part 212 may be in a range of 5 μm-20 μm. In some embodiments, the diameter of the third hole part 212 may be in a range of 8 μm-15 μm.

In some embodiments, the acoustic transducer 220 may include a diaphragm 222 located at the sound pickup hole 251 of the substrate 250. The diaphragm 222 refers to a device of the acoustic transducer 220 configured to receive a sound pressure change of the first acoustic cavity 240. In some embodiments, a fourth hole part may be arranged on the diaphragm 222. The cavity where the acoustic transducer 220 is located may be spatially connected to the first acoustic cavity 240 through the fourth hole part 2221, and spatially connected to the external environment through the second hole part 211 or the third hole part 212, thereby balancing the air pressure between the cavity where the acoustic transducer 220 is located and the external environment and facilitating the assembly of the vibration sensor 200. A size of the fourth hole part 2221 may refer to the descriptions of the third hole part 212. In some embodiments, the diaphragm 222 may be a gas-permeable film made of a gas-permeable material. The descriptions regarding the gas-permeable material may be found in the specific descriptions of the elastic element 231.

Figure 3:
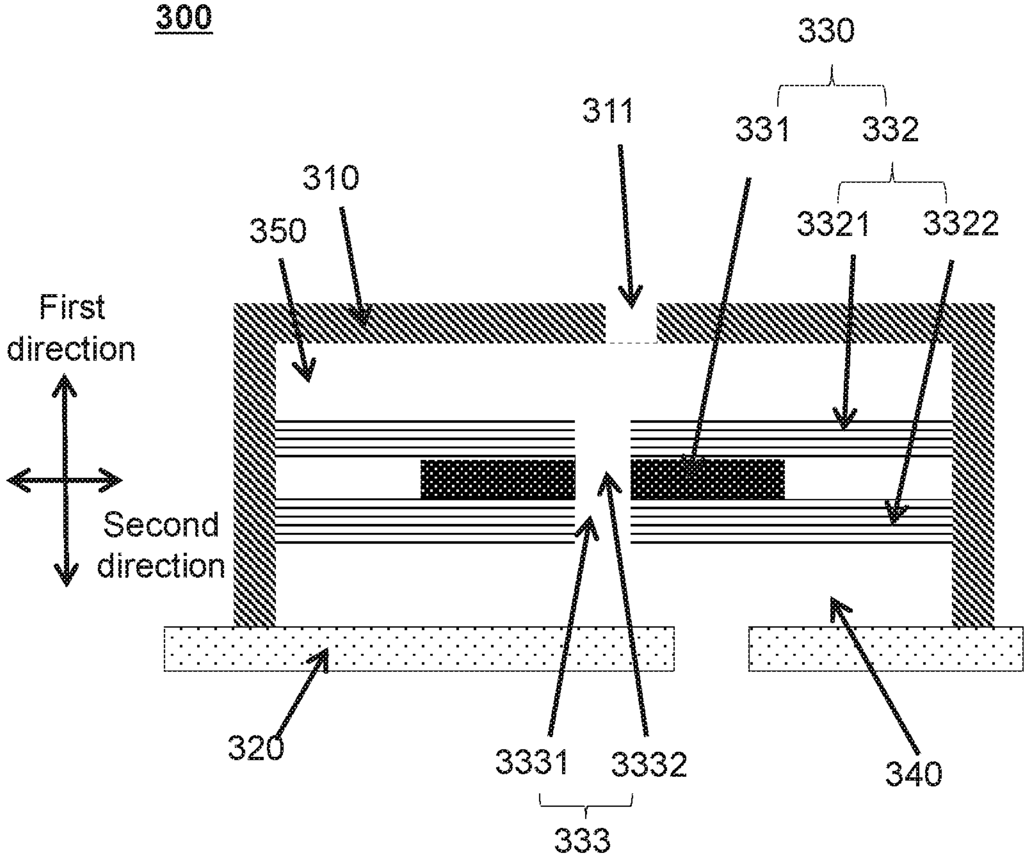
FIG. 3 is a schematic diagram illustrating a partial structure of a vibration sensor according to some embodiments of the present disclosure.

FIG. 3 is a schematic diagram illustrating a partial structure of a vibration sensor according to some embodiments of the present disclosure. A structure of a vibration sensor 300 shown in FIG. 3 may be substantially the same as the structure of the vibration sensor 200 shown in FIG. 2. The difference between the vibration sensor 300 and the vibration sensor 200 lies in that a structure of a vibration component 330 shown in FIG. 3 may be different from the structure of the vibration component 230 shown in FIG. 2. A housing 310, an acoustic transducer (not shown in the figure), a second hole part (not shown in the figure), a third hole part 311, a substrate 320, a diaphragm (not shown in the figure) shown in FIG. 3 may be respectively similar to the housing 210, the second hole part 211, the third hole part 212, the substrate 250, and the diaphragm 222 shown in FIG. 2, which are not repeated here.

In some embodiments, the vibration component 330 may include a mass element 331 and an elastic element 332, wherein the elastic element 332 may include a first elastic element 3321 and a second elastic element 3322. In some embodiments, the first elastic element 3321 and the second elastic element 3322 may be film-shaped structures. In some embodiments, the first elastic element 3321 and the second elastic element 3322 may be approximately symmetrically distributed with respect to the mass element 331 in a first direction. The first elastic element 3321 and the second elastic element 3322 may be connected to the housing 310. For example, the first elastic element 3321 may be located on a side of the mass element 331 away from the substrate 320. A lower surface of the first elastic element 3321 may be connected to an upper surface of the mass element 331, and a peripheral side of the first elastic element 3321 may be connected to an inner wall of the housing 310. The second elastic element 3322 may be located on a side of the mass element 331 facing the substrate 320. An upper surface of the second elastic element 3322 may be connected to a lower surface of the mass element 331, and a peripheral side of the second elastic element 3322 may be connected to the inner wall of the housing 310. It should be noted that the film-shaped structures of the first elastic element 3321 and the second elastic element 3322 may be regular, such as rectangles and circles, and/or irregular structures, and the shapes of the first elastic element 3321 and the second elastic element 3322 may be adaptively adjusted according to a cross-sectional shape of the housing 310.

In some embodiments, a volume of an acoustic cavity (e.g., the second acoustic cavity 350) formed between the first elastic element 3321 and the housing 310 may be greater than or equal to a volume of the first acoustic cavity 340 formed between the second elastic element 3322, the housing 310, and the substrate 320, so that the volume of the first acoustic cavity 340 is equal to or approximately equal to the volume of the second acoustic cavity 350, thereby improving symmetry of the vibration sensor 300. Specifically, there may be air inside the first acoustic cavity 340 and the second acoustic cavity 350, and when the vibration component 330 vibrates relative to the housing 310, the vibration component 330 may compress the air inside the two acoustic cavities. The first acoustic cavity 340 and the second acoustic cavity 350 may be approximately regarded as two air springs, and the volume of the second acoustic cavity 350 is greater than or equal to the volume of the first acoustic cavity 340, so that coefficients of the air springs caused by the compressed air during vibration of the vibration component 330 may be approximately equal, thereby improving the symmetry of the elastic elements (including the air springs) on the upper and lower sides of the mass element 331.

In some embodiments, the vibration component 330 may include a first hole part 333, and the first acoustic cavity 340 may be spatially connected to the second acoustic cavity 350 through the first hole part 333. In some embodiments, the first hole part 333 may include a first sub-hole part 3331. The first sub-hole part 3331 may be located in a region on the first elastic element 3321 and the second elastic element 3322 not covered by the mass element 331, so that the first acoustic cavity 340 may be spatially connected to the other acoustic cavities (e.g., the second acoustic cavity 350). In some embodiments, the first sub-hole part 3331 of the first elastic element 3321 and the first sub-hole part 3331 of the second elastic element 3322 may be arranged in a staggered manner. The staggered manner may be understood as that a projection of the first sub-hole part 3331 of the first elastic element 3321 on the second elastic element 3322 is not overlapped with the first sub-hole part 3331 of the second elastic element 3322. In some embodiments, the first sub-hole part 3331 of the first elastic element 3321 and the first sub-hole part 3331 of the second elastic element 3322 may also be oppositely arranged. The opposite arrangement may be understood as that the projection of the first sub-hole part 3331 of the first elastic element 3321 on the second elastic element 3322 overlaps with the first sub-hole part 3331 of the second elastic element 3322. In some embodiments, hole parts may be arranged on the first elastic element 3321, the second elastic element 3322, and the mass element 331, so that the first acoustic cavity 340 may be spatially connected to the other acoustic cavities. For example, the first hole part 333 may include two first sub-hole part 3331 and one second sub-hole part 3332. The two first sub-hole parts 3331 may be respectively arranged on the first elastic element 3321 and the second elastic element 3322. The second sub-hole part 3332 may be located on the mass element 331. The two first sub-hole parts 3331 may be respectively located at two ends of the second sub-hole part 3332 and spatially connected to the second sub-hole part 3332. In some embodiments, sizes of the two first sub-hole parts 3331 may be the same or different. The size of the first sub-hole part 2331 and the size of the second sub-hole part 2332 may be the same or different. The details regarding the first hole part 333 may be found in the relevant descriptions in FIG. 24 and FIG. 25, which are not repeated here.

In some embodiments, the vibration component 330 may be made of a gas-permeable material. For example, in some embodiments, the material of the mass element 331 may be the same as the material of the elastic element 332, and both the mass element 331 and the elastic element 332 may be made of the gas-permeable material. In some embodiments, the material of the mass element 331 may be different from the material of the elastic element 332. For example, the elastic element 332 may be made of the gas-permeable material, and the mass element 331 may be made of a hard material (e.g., iron, copper, silicon, etc.).

Figure 4:
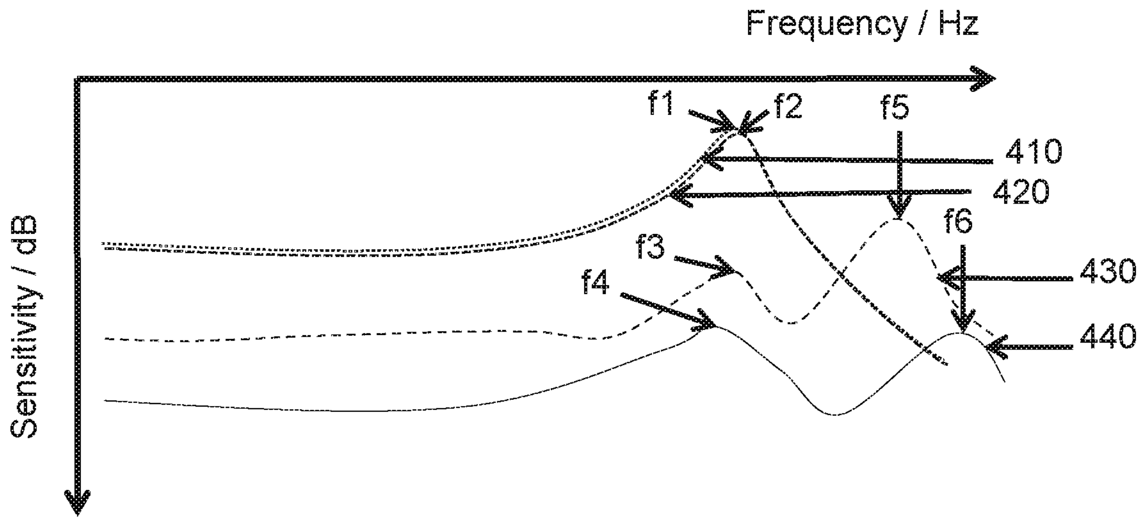
FIG. 4 is a schematic diagram illustrating frequency response curves of vibration sensors according to some embodiments of the present disclosure.

FIG. 4 is a schematic diagram illustrating frequency response curves of vibration sensors according to some embodiments of the present disclosure. As shown in FIG. 4, a horizontal axis represents a frequency in Hz, and a vertical axis represents the sensitivity of the vibration sensors in dB. A curve 410 represents the sensitivity of a vibration sensor including an elastic element in a first direction. A curve 420 represents the sensitivity of a vibration sensor including two approximately symmetrical elastic elements (e.g., the first elastic element 3321 and the second elastic element 3322 shown in FIG. 3) in the first direction. A curve 430 represents the sensitivity of the vibration sensor including the elastic element in a second direction. A curve 440 represents the sensitivity of the vibration sensor including the two approximately symmetrical elastic elements (e.g., the first elastic element 3321 and the second elastic element 3322 shown in FIG. 3) in the second direction. A material and a shape of the elastic element of the vibration sensor in the curve 410 (or the curve 430) may be the same as a material and a shape of the two elastic elements of the vibration sensor in the curve 420 (or the curve 440). The difference lies in that a thickness of the elastic element of the vibration sensor in the curve 410 (or the curve 430) may be approximately equal to a total thickness of the two elastic elements of the vibration sensor in the curve 420 (or the curve 440). It should be noted that the "approximately" herein refer to an error of the two involved is not over 50%.

Comparing the curve 410 and the curve 420, it can be seen that in a specific frequency range (e.g., below 3000 Hz), the sensitivity (the curve 410 in FIG. 410) of the vibration sensor with one elastic element in the first direction and the sensitivity (the curve 420 in FIG. 4) of the vibration sensor with two approximately symmetrical elastic elements in the first direction may be approximately equal. It can also be understood that in the specific frequency range (e.g., below 3000 Hz), a count and a distribution of the elastic elements included in the vibration sensor may have less influence on the sensitivity of the vibration sensor in the first direction. In addition, in the curve 410 and the curve 420, $f_1$ refers to a resonant frequency of a resonant peak of the vibration sensor with one elastic element in the first direction, and $f_2$ refers to a resonant frequency of a resonant peak of the vibration sensor with two approximately symmetrical elastic elements in the first direction. The resonant frequency $f_1$ of the resonant peak of the vibration sensor with one elastic element in the first direction and the resonant frequency $f_2$ of the resonant peak of the vibration sensor with two approximately symmetrical elastic elements in the first direction may be approximately equal. That is to say, in the specific frequency range, the sensitivity of the vibration sensor with one elastic element in the first direction and the sensitivity of the vibration sensor with two approximately symmetrical elastic elements in the first direction may be approximately equal. Considering that the vibration sensor is a non-ideal device, the resonant frequency of the vibration sensor in the first direction may have a mapping (also referred to as a component) in the second direction. Correspondingly, in the curve 430, $f_3$ represents a mapping (it can also be understood as the component of the resonant frequency in the first direction) of the resonant frequency of the vibration sensor with one elastic element in the first direction in a frequency response curve of the second direction, and $f_5$ represents the resonant frequency of the vibration sensor with one elastic element in the second direction. In the curve 440, $f_4$ represents the mapping of the resonant frequency of the vibration sensor with two elastic elements in the first direction in the frequency response curve of the second direction, and $f_6$ represents the resonant frequency of the vibration sensor with two approximately symmetrical elastic elements in the second direction. Due to the existence of a mapping relationship, the resonant frequency $f_3$ in the third curve 430 and the resonant frequency $f_1$ in the first curve 410 may be approximately equal, and the resonant frequency $f_4$ in the fourth curve 440 and the resonant frequency $f_2$ in the second curve 420 may be approximately equal. Comparing curve 430 and curve 440, it can be seen that in the specific frequency range (e.g., below 3000 Hz), the sensitivity (the curve 430 in FIG. 4) of the vibration sensor with one elastic element in the second direction may be greater than the sensitivity (the curve 440 in FIG. 4) of the vibration sensor with two approximately symmetrical elastic elements in the second direction. It can also be understood that, in the specific frequency range (e.g., below 3000 Hz), the count and the distribution of the elastic elements included in the vibration sensor may have a relatively great impact on the sensitivity of the vibration sensor in the second direction. In addition, it can be seen from the combination of curve 430 and curve 440 that when $f_1$ and $f_2$ are approximately equal (or $f_3$ and $f_4$ are approximately equal), in the specific frequency range (e.g., below 3000 Hz), the resonant frequency $f_5$ corresponding to the resonant peak of the vibration sensor with one elastic element in the second direction may be obviously less than the resonant frequency $f_6$ corresponding to the resonant peak of the vibration sensor with two approximately symmetrical elastic elements in the second direction. In some embodiments, by arranging two approximately symmetrical elastic elements in the vibration sensor, the resonant frequency of the resonant peak of the vibration sensor in the second direction may be in a higher frequency range, thereby reducing the sensitivity of the vibration sensor in a low and medium frequency range away from the resonant frequency. Further, in the specific frequency range (3000 Hz), the sensitivity (the curve 440 in FIG. 4) of the vibration sensor with two approximately symmetrical elastic elements in the second direction may be flatter relative to the sensitivity (the curve 430 in FIG. 4) of the vibration sensor with one elastic element in the second direction.

it can be known from the above analysis that by arranging the approximately symmetrical first elastic element and the second elastic element in the vibration sensor, in the specific frequency range (e.g., below 3000 Hz), a difference between the sensitivity of the vibration sensor in the second direction and the sensitivity of the vibration sensor in the first direction may be increased on the premise of reducing the sensitivity of the vibration sensor in the second direction without substantially changing the sensitivity of the vibration sensor in the first direction, thereby improving a direction selectivity of the vibration sensor and enhancing noise interference resistance of the vibration sensor. In some embodiments, in order to further reduce the sensitivity in the second direction, in the specific frequency range (e.g., below 3000 Hz), a ratio of the resonant frequency $f_6$ corresponding to the resonant peak of the vibration sensor with two approximately symmetrical elastic elements in the second direction to the resonant frequency $f_5$ corresponding to the resonant peak of the vibration sensor with one elastic element in the second direction may be greater than 2. In some embodiments, in the specific frequency range (e.g., below 3000 Hz), the ratio of the resonant frequency $f_6$ corresponding to the resonant peak of the vibration sensor with two approximately symmetrical elastic elements in the second direction to the resonant frequency $f_5$ corresponding to the resonant peak of the vibration sensor with one elastic element in the second direction may be greater than 3.5. In some embodiments, in the specific frequency range (e.g., below 3000 Hz), the ratio of the resonant frequency $f_6$ corresponding to the resonant peak of the vibration sensor with two approximately symmetrical elastic elements in the second direction to the resonant frequency $f_5$ corresponding to the resonant peak of the vibration sensor with one elastic element in the second direction may be greater than 5. In some embodiments, a ratio of the resonant frequency $f_6$ corresponding to the resonant peak of the vibration sensor with two approximately symmetrical elastic elements in the second direction to the resonant frequency $f_2$ corresponding to the resonant peak of the vibration sensor with two approximately symmetrical elastic elements in the first direction may be greater than 1. In some embodiments, the ratio of the resonant frequency $f_6$ corresponding to the resonant peak of the vibration sensor with two approximately symmetrical elastic elements in the second direction to the resonant frequency $f_2$ corresponding to the resonant peak of the vibration sensor with two approximately symmetrical elastic elements in the first direction may be greater than 1.5. In some embodiments, the ratio of the resonant frequency $f_6$ corresponding to the resonant peak of the vibration sensor with two approximately symmetrical elastic elements in the second direction to the resonant frequency $f_2$ corresponding to the resonant peak of the vibration sensor with two approximately symmetrical elastic elements in the first direction may be greater than 2.

Figure 5:
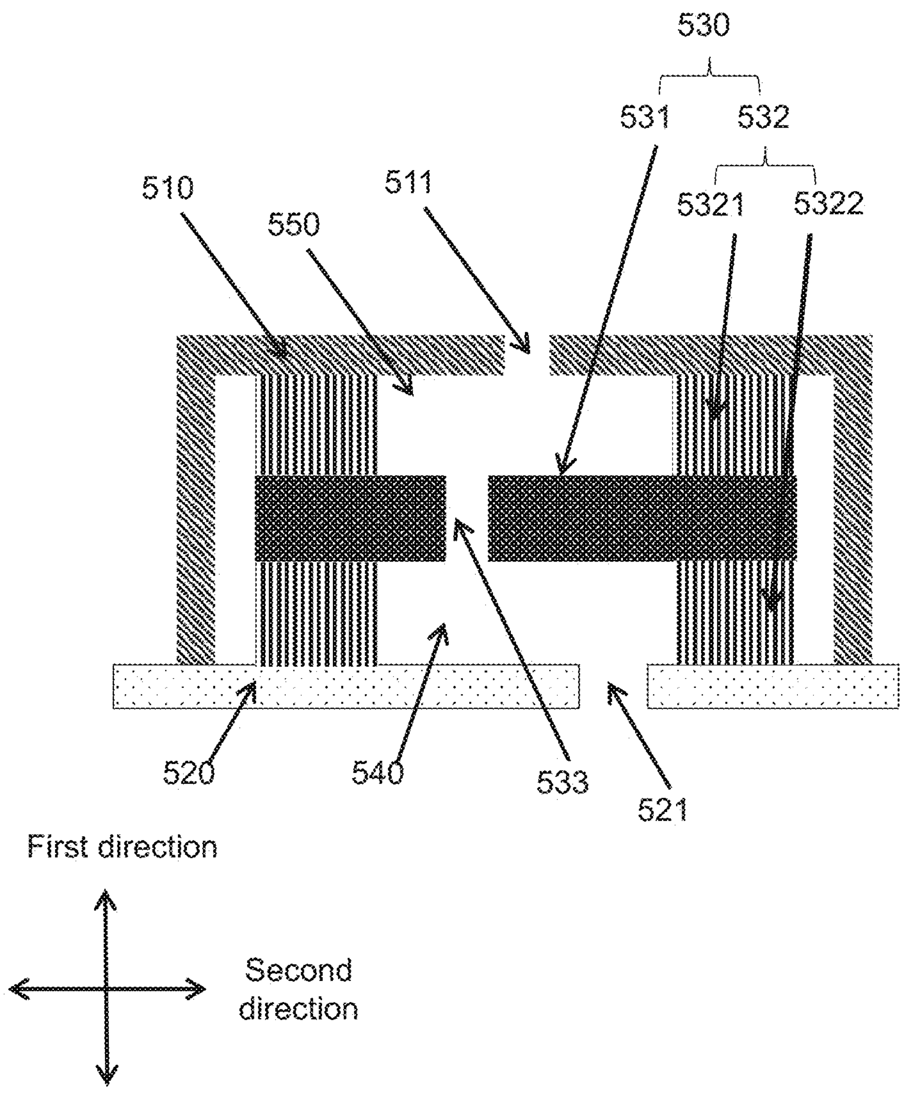
FIG. 5 is a schematic diagram illustrating a structure of a vibration sensor according to some embodiments of the present disclosure.

FIG. 5 is a schematic diagram illustrating a structure of a vibration sensor according to some embodiments of the present disclosure. As shown in FIG. 5, a vibration sensor 500 may include a housing 510, an acoustic transducer, and a vibration component 530. The vibration sensor 500 shown in FIG. 5 may be the same as or similar to the vibration sensor 300 shown in FIG. 3. For example, the housing 510 of the vibration sensor 500 may be the same as or similar to the housing 310 of the vibration sensor 300. As another example, a first acoustic cavity 540 of the vibration sensor 500 may be the same as or similar to the first acoustic cavity 340 of the vibration sensor 300. As another example, a substrate 520 of the vibration sensor 500 may be the same as or similar to the substrate 320 of the vibration sensor 300. The descriptions regarding more structures of the vibration sensor 500, such as a second acoustic cavity 550, a sound pickup hole 521, a mass element 531, the substrate 520, etc. may be found in FIG. 2, FIG. 3, and relevant descriptions thereof, which is not repeated here.

In some embodiments, the main difference between the vibration sensor shown in FIG. 5 and the vibration sensor 300 shown in FIG. 3 lies in that a first elastic element 5321 and a second elastic element 5322 of the vibration sensor 500 may be columnar structures. The first elastic element 5321 and the second elastic element 5322 may respectively extend along a thickness direction of the mass element 531 and be connected to the housing 510 or the substrate 520 on an upper surface of the acoustic transducer. In some embodiments, the first elastic element 5321 and the second elastic element 5322 may be approximately symmetrically distributed in a first direction with respect to the mass element 531. In some embodiments, the first elastic element 5321 may be located on a side of the mass element 531 away from the substrate 520, a lower surface of the first elastic element 5321 may be connected to an upper surface of the mass element 531, and an upper surface of the first elastic element 5321 may be connected to an inner wall of the housing 510. In some embodiments, the second elastic element 5322 may be located on a side of the mass element 531 facing the substrate 520, an upper surface of the second elastic element 5322 may be connected to a lower surface of the mass element 531, and a lower surface of the second elastic element 5322 may be connected to the substrate 520 on the upper surface of the acoustic transducer. It should be noted that the columnar structures of the first elastic element 5321 and the second elastic element 5322 may be regular such as cylinders and square columns, and/or irregular structures, and shapes of the first elastic element 5321 and the second elastic element 5322 may be adaptively adjusted according to a cross-sectional shape of the housing 510.

In some embodiments, a first hole part 533 may be arranged on the mass element 531, and the first acoustic cavity 540 may be spatially connected to the second acoustic cavity 550 through the first hole part 533. In some embodiments, the first hole part 533 may be located in a region the mass element 531 not covered by the first elastic element 5321 and the second elastic element 5322, so that the first acoustic cavity 540 may be spatially connected to other acoustic cavities (e.g., the second acoustic cavity). The specific descriptions regarding the first hole part 533 may be found in the relevant descriptions in FIG. 24 and FIG. 25, which are not repeated here. In some embodiments, the mass element 531 may be made of a gas-permeable material.

In some embodiments, a second hole part (not shown in the figure) may be arranged on the housing 510, and the first acoustic cavity 540, the other acoustic cavities, and the acoustic transducer may be spatially connected to the outside through the second hole part. During the assembly process of the vibration sensor 500, the second hole part may deliver gas inside the housing 510 to the outside. In this way, by setting the second hole part, when the vibration component 530 and the acoustic transducer are assembled, failure of the vibration component 530 (e.g., the elastic element 532) and the acoustic transducer due to an excessive air pressure difference between inner and outer spaces of the housing 510 may be avoided, thereby reducing the difficulty of assembling the vibration sensor 500. In some embodiments, air conduction sound in the environment may affect the use performance of the vibration sensor 500. In order to reduce the impact of the air conduction sound in the environment, after the vibration sensor 500 is prepared or before the vibration sensor 500 is applied to an electronic device, the second hole part may be sealed with a sealing material, so as not to affect the performance of the vibration sensor 500. In some embodiments, the second hole part may be sealed by means of using a sealant, bonding a sealing tape, adding a sealing plug, or the like. The descriptions regarding the second hole part may be found in the relevant descriptions in FIG. 2, which is not repeated here.

In some embodiments, a third hole part 511 may be arranged on the housing 510, and the third hole part 511 may enable the external environment and the acoustic cavity inside the housing 510 to be spatially connected, thereby reducing vibration resistance of the vibration component 130 and improving the sensitivity of the vibration sensor 500. The descriptions regarding the third hole part 511 may be found in the relevant descriptions in FIG. 2, which is not repeated here.

Figure 6:
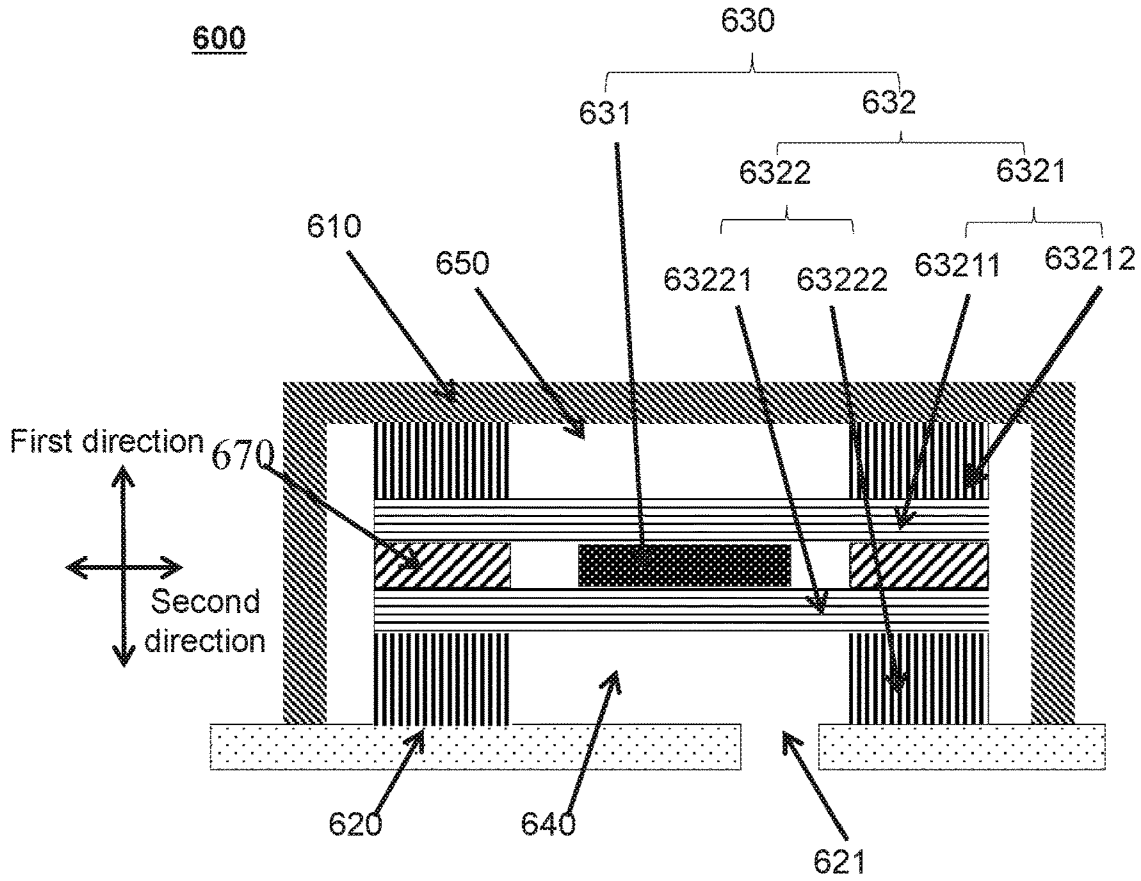
FIG. 6 is a schematic diagram illustrating a structure of a vibration sensor according to some embodiments of the present disclosure.

FIG. 6 is a schematic diagram illustrating a structure of a vibration sensor according to some embodiments of the present disclosure. As shown in FIG. 6, a vibration sensor 600 may include a housing 610, an acoustic transducer, and a vibration component 630. The vibration sensor 600 shown in FIG. 6 may be the same as or similar to the vibration sensor 300 shown in FIG. 3. For example, the housing 610 of the vibration sensor 600 may be the same as or similar to the housing 310 of the vibration sensor 300. As another example, a first acoustic cavity 640 of the vibration sensor 600 may be the same as or similar to the first acoustic cavity 340 of the vibration sensor 300. As another example, a substrate 620 of the vibration sensor 600 may be the same as or similar to the substrate 320 of the vibration sensor 300. The descriptions regarding more structures of the vibration sensor 600, such as a second acoustic cavity 650, a sound pickup hole 621, a mass element 631, the substrate 620, etc. may be found in FIG. 3 and relevant descriptions thereof, which are not repeated here.

In some embodiments, compared with the vibration sensor 300, the first elastic element 6321 of the vibration sensor 600 may include a first sub-elastic element 63211 and a second sub-elastic element 63212. The first sub-elastic element 63211 may be connected to the housing 610 corresponding to the acoustic cavity through the second sub-elastic element 63212. The first sub-elastic element 63211 may be connected to an upper surface of the mass element 631. As shown in FIG. 6, the upper surface of the mass element 631 may be connected to a lower surface of the first sub-elastic element 63211, an upper surface of the first sub-elastic element 63211 may be connected to a lower surface of the second sub-elastic element 63212, and an upper surface of the second sub-elastic element 63212 may be connected to an inner wall of the housing 610. In some embodiments, a peripheral side of the first sub-elastic element 63211 and a peripheral side of the second sub-elastic element 63212 may coincide or approximately coincide. In some embodiments, the second elastic element 6322 of the vibration sensor 600 may include a third sub-elastic element 63221 and a fourth sub-elastic element 63222. The third sub-elastic element 63221 may be connected to an acoustic transducer corresponding to the acoustic cavity through the fourth sub-elastic element 63222. The third sub-elastic element 63221 may be connected to a lower surface of the mass element 631. As shown in FIG. 6, the lower surface of the mass element 631 may be connected to an upper surface of the third sub-elastic element 63221, a lower surface of the third sub-elastic element 63221 may be connected to an upper surface of the fourth sub-elastic element 63222, and a lower surface of 63222 of the fourth sub-elastic element may be connected to the acoustic transducer through the substrate 620 on the upper surface of the acoustic transducer. In some embodiments, a peripheral side of the third sub-elastic element 63221 and a peripheral side of the fourth sub-elastic element 63222 may coincide or approximately coincide.

In some embodiments, the peripheral side of the first sub-elastic element 63211 and the peripheral side of the second sub-elastic element 63212 (or the peripheral side of the third sub-elastic element 63221 and the peripheral side of the fourth sub-elastic element 63222) may not coincide. For example, when the first sub-elastic element 63211 is a film structure and the second sub-elastic element 63212 is a columnar structure, the peripheral side of the first sub-elastic element 63211 may be connected to the inner wall of the housing 610, and a gap may be arranged between the peripheral side of the second sub-elastic element 63212 and the inner wall of the housing 610.

In some embodiments, the first sub-elastic element 63211 and the third sub-elastic element 63221 may be approximately symmetrically distributed with respect to the mass element 631 in the first direction. Sizes, shapes, materials, or thicknesses of the first sub-elastic element 63211 and the third sub-elastic element 63221 may be the same. In some embodiments, the second sub-elastic element 63212 and the fourth sub-elastic element 63222 may be approximately symmetrically distributed with respect to the mass element 631 in the first direction. Sizes, shapes, materials, or thicknesses of the second sub-elastic element 63212 and the fourth sub-elastic element 63222 may be the same. In some embodiments, the sizes, the shapes, the materials, or the thicknesses of the first sub-elastic element 63211 and the second sub-elastic element 63212 (or the third sub-elastic element 63221 and the fourth sub-elastic element 63222) may be the same. For example, the first sub-elastic element 63211 and the second sub-elastic element 63212 may be made of polytetrafluoroethylene. In some embodiments, the sizes, the shapes, the materials, or the thicknesses of the first sub-elastic element 63211 and the second sub-elastic element 63212 (or the third sub-elastic element 63221 and the fourth sub-elastic element 63222) may be different. For example, the first sub-elastic element 63211 may be the film structure, and the second sub-elastic element 63212 may be the columnar structure.

In some embodiments, the vibration sensor 600 may further include a fixing piece 670. The fixing piece 670 may be distributed along the peripheral side of the mass element 631. The fixing piece 670 may be located between the first sub-elastic element 63211 and the third sub-elastic element 63221, and an upper surface and a lower surface of the fixing piece 670 may be respectively connected to the first sub-elastic element 63211 and the third sub-elastic element 63221. In some embodiments, the fixing piece 670 may be a separate structure. For example, the fixing piece 670 may be a columnar structure with approximately the same thickness as the mass element 631. The upper surface of the fixing piece 670 may be connected to the lower surface of the first sub-elastic element 63211, and the lower surface of the fixing piece 670 may be connected to the upper surface of the third sub-elastic element 63221. In some embodiments, the fixing piece 670 may also be a structure integrated with other structures. For example, the fixing piece 670 may be the columnar structure integrated with the first sub-elastic element 63211 or the third sub-elastic element 63221. In some embodiments, the fixing piece 670 may also be the columnar structure penetrating through the first sub-elastic element 63211 or the third sub-elastic element 63221. For example, the fixing piece 670 may penetrate through the first sub-elastic element 63211 and be connected to the second sub-elastic element 63212. In some embodiments, a structure of the fixing piece 670 may be other types of structures besides the columnar structure, e.g., a ring structure, or the like. In some embodiments, when the fixing piece 670 is the ring structure, the fixing piece 670 may be evenly distributed on the peripheral side of the mass element 631, the upper surface of the fixing piece 670 may be connected to the lower surface of the first sub-elastic element 63211, and the lower surface of the fixing piece 670 may be connected to the upper surface of the third sub-elastic element 63221.

In some embodiments, the thickness of the fixing piece 670 and the thickness of the mass element 631 may be the same. In some embodiments, the thickness of the fixing piece 670 and the thickness of the mass element 631 may be different. For example, the thickness of the fixing piece 670 may be greater than the thickness of the mass element 631. In some embodiments, the material of the fixing piece 670 may be an elastic material, e.g., foam, plastic, rubber, silicone, or the like. In some embodiments, the material of the fixing piece 670 may also be a rigid material, e.g., metal, a metal alloy, or the like. Preferably, the material of the fixing piece 670 may be the same as that of the mass element 631. In some embodiments, the fixing piece 670 may also serve as an additional mass element, thereby adjusting the resonant frequency of the vibration sensor, and adjusting (e.g., reducing) a difference between the sensitivity of the vibration sensor in the second direction and the sensitivity of the vibration sensor in the first direction.

In some embodiments, the vibration component 630 may further include a first hole part (not shown in the figure), and the first acoustic cavity 640 may be spatially connected to the second acoustic cavity 650 through the first hole part 333. In some embodiments, the first hole part may include first sub-hole parts (not shown in the figure). The two first sub-hole parts may be respectively arranged in a region on the first sub-elastic element 63211 and the third sub-elastic element 63221 not covered by the mass element 631, the second sub-elastic element 63212, or the fourth sub-elastic element 63222, so that the first acoustic cavity 640 may be spatially connected to the other acoustic cavities (e.g., the second acoustic cavity 650) of the plurality of acoustic cavities. The two first sub-hole parts may be arranged in a staggered manner, or may be oppositely arranged. In some embodiments, hole parts may also be arranged on the first sub-elastic element 63211, the third sub-elastic element 63221, and the mass element 631, so that the first acoustic cavity 640 may be spatially connected to the other acoustic cavities of the plurality of acoustic cavities. It should be noted that regions where the hole parts are arranged may not be covered by the second sub-elastic element 63212 or the fourth sub-elastic element 63222. For example, the first hole part may include two first sub-hole parts and one second sub-hole part. The two first sub-hole parts may be respectively arranged on the first sub-elastic element 63211 and the third sub-elastic element 63221. The second sub-hole part may be located on the mass element 631. The two first sub-hole parts may be respectively located at two ends of the second sub-hole part and spatially connected to the second sub-hole part. In some embodiments, sizes of the two first sub-hole parts may be the same or different. The sizes of the first sub-hole parts and a size of the second sub-hole part may be the same or different. The descriptions regarding the first hole part may be found in the relevant descriptions in FIG. 24 and FIG. 25, which are not repeated here. In some embodiments, the vibration component 630 may also be made of a gas-permeable material. For example, in some embodiments, a material of the mass element 631 and a material of the elastic element 632 (e.g., the first sub-elastic element 63211 and the third sub-elastic element 63221) may be the same, and both the mass element 631 and the elastic element 632 may be made of the gas-permeable material. In some embodiments, the material of the mass element 631 may be different from the material of the elastic element 632. For example, the elastic element 632 (e.g., the first sub-elastic element 63211 and the third sub-elastic element 63221) may be made of the gas-permeable material, and the mass element 631 may be made of a hard material (e.g., iron, copper, silicon, etc.).

In some embodiments, a second hole part (not shown in the figure) may be arranged on the housing 610, and the first acoustic cavity 640, the other acoustic cavities of the plurality of acoustic cavities, and the acoustic transducer may be spatially connected to the outside through the second hole part. During the assembly process of the vibration sensor 600, the second hole part may deliver gas inside the housing 610 to the outside. In this way, by setting the second hole part, when the vibration component 630 and the acoustic transducer are assembled, failure of the vibration component 630 (e.g., the elastic element 632) and the acoustic transducer due to an excessive air pressure difference between inner and outer spaces of the housing 610 may be avoided, thereby reducing the difficulty of assembling the vibration sensor 600. In some embodiments, air conduction sound in the environment may affect the use performance of the vibration sensor 600. In order to reduce the impact of air conduction sound in the environment, after the vibration sensor 600 is prepared or before the vibration sensor 600 is applied to an electronic device, the second hole part may be sealed with a sealing material, so as not to affect the performance of the vibration sensor 600. In some embodiments, the second hole part may be blocked by means of using a sealant, bonding of a sealing tape, adding a sealing plug, or the like. The descriptions regarding the second hole part may be found in the relevant descriptions in FIG. 2, which is not repeated here.

In some embodiments, a third hole part (not shown in the figure) may be arranged on the housing 610. The third hole part may enable the external environment and the acoustic cavity inside the housing 610 to be spatially connected, thereby reducing the vibration resistance of the vibration component 630, and improving the sensitivity of the vibration sensor 600. The descriptions regarding the third hole part may be found in the relevant descriptions in FIG. 2, which is not repeated here.

Figure 7:
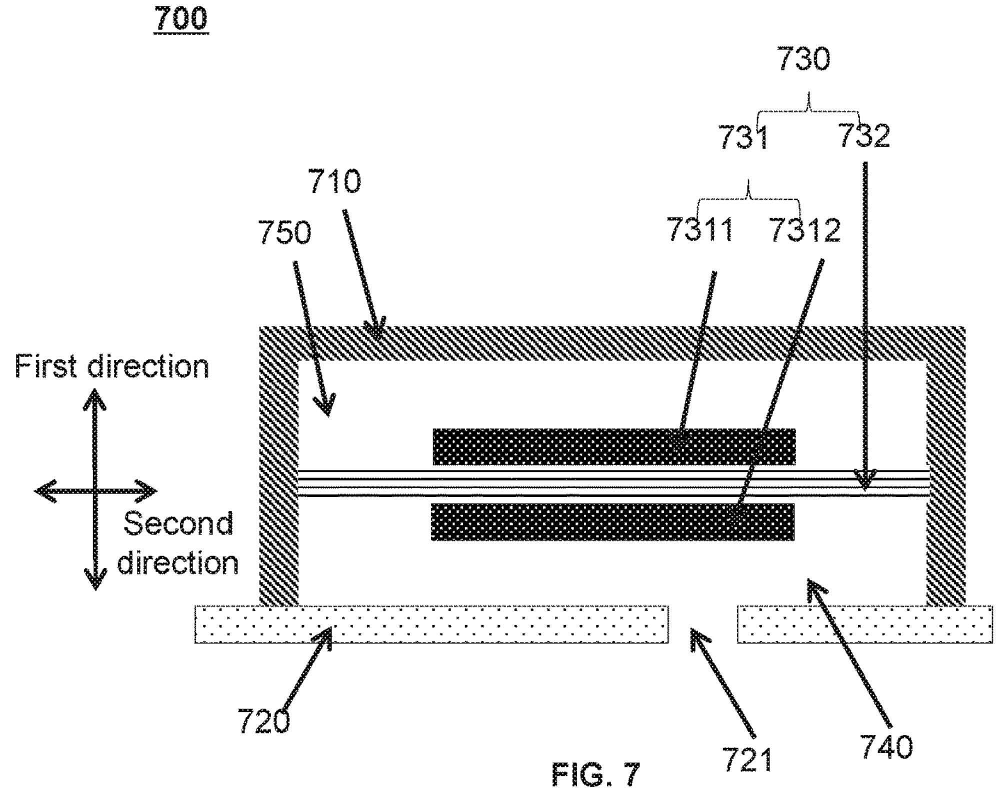
FIG. 7 is a schematic diagram illustrating a structure of a vibration sensor according to some embodiments of the present disclosure.

FIG. 7 is a schematic diagram illustrating a structure of a vibration sensor according to some embodiments of the present disclosure. As shown in FIG. 7, a vibration sensor 700 may include a housing 710, an acoustic transducer, and a vibration component 730. The vibration sensor 700 shown in FIG. 7 may be the same as or similar to the vibration sensor 300 shown in FIG. 3. For example, a housing 710 of the vibration sensor 700 may be the same as or similar to the housing 310 of the vibration sensor 300. As another example, a first acoustic cavity 740 of the vibration sensor 700 may be the same as or similar to the first acoustic cavity 340 of the vibration sensor 300. As another example, a substrate 720 of the vibration sensor 700 may be the same as or similar to the substrate 320 of the vibration sensor 300. The descriptions regarding more structures of the vibration sensor 700, such as a second acoustic cavity 750, a sound pickup hole 721, an acoustic transducer (not shown in the figure), the substrate 720, etc. may be found in FIG. 2, FIG. 3 and relevant descriptions thereof.

In some embodiments, the difference between the vibration sensor 700 and the vibration sensor 300 lies in the structure of the vibration component. The vibration component 730 of the vibration sensor 700 may include at least one elastic element 732 and two mass elements (e.g., a first mass element 7311 and a second mass element 7312). In some embodiments, the mass element 731 may include the first mass element 7311 and the second mass element 7312. The first mass element 7311 and the second mass element 7312 may be symmetrically arranged with respect to the at least one elastic element 732 in a first direction. In some embodiments, the first mass element 7311 may be located on a side of the at least one elastic element 732 away from the substrate 720, and a lower surface of the first mass element 7311 may be connected to an upper surface of the at least one elastic element 732. The second mass element 7312 may be located on a side of the at least one elastic element 732 facing the substrate 720, and an upper surface of the second mass element 7312 may be connected to a lower surface of the at least one elastic element 732. In some embodiments, sizes, shapes, materials, or thicknesses of the first mass element 7311 and the second mass element 7312 may be the same. In some embodiments, the first mass element 7311 and the second mass element 7312 may be symmetrically arranged with respect to the at least one elastic element 732 in the first direction, so that a center of gravity of the mass element 731 may approximately coincide with a centroid of the at least one elastic element 732, and when the vibration component 730 generates vibrations in response to vibrations of the housing 710, vibrations of the mass element 731 in a second direction may be reduced, thereby reducing a response sensitivity of the vibration component 730 to the vibrations of the housing 710 in the second direction, and improving a direction selectivity of the vibration sensor 700.

In some embodiments, the first mass element 7311 and the second mass element 7312 may be distributed on opposite sides of the at least one elastic element 732 in the first direction. The first mass element 7311 and the second mass element 7312 may be approximated as an integral mass element, and a center of gravity of the integral mass element may approximately coincide with the centroid of the at least one elastic element 732, so that in a target frequency range (e.g., below 3000 Hz), a response sensitivity of the vibration component 730 to the vibrations of the housing in the first direction may be higher than a response sensitivity of the vibration component 730 to the vibrations of the housing 710 in the second direction. In some embodiments, a difference between the response sensitivity of the vibration component 730 to the vibrations of the housing 710 in the second direction and the response sensitivity of the vibration component 730 to the vibrations of the housing 710 in the first direction may be in a range of −20 dB-−60 dB. In some embodiments, the difference between the response sensitivity of the vibration component 730 to the vibrations of the housing 710 in the second direction and the response sensitivity of the vibration component 730 to the vibrations of the housing 710 in the first direction may be in a range of −25 dB-−50 dB. In some embodiments, the difference between the response sensitivity of the vibration component 730 to the vibrations of the housing 710 in the second direction and the response sensitivity of the vibration component 730 to the vibrations of the housing 710 in the first direction may be in a range of −30 dB-40 dB.

In some embodiments, during a working process of the vibration sensor 700, the response sensitivity of the vibration component 730 to the vibrations of the housing 710 in the second direction may be reduced by reducing the vibrations generated by the vibration component 730 in the second direction, thereby improving the direction selectivity of the vibration sensor 700, and reducing interference of a noise signal to a sound signal.

In some embodiments, the centroid of the at least one elastic element 732 may coincide with or approximately coincide with the center of gravity of the mass element 731. In some embodiments, when the vibration component 730 generates the vibrations in response to the vibrations of the housing 710, the centroid of the at least one elastic element 732 may coincide with or approximately coincide with the center of gravity of the mass element 731, and the vibrations of the mass element 731 in the second direction may be reduced on the premise that the response sensitivity of the vibration component 730 to the vibrations of the housing 710 in the first direction is basically constant; thereby reducing the response sensitivity of the vibration component 730 to the vibrations of the housing 710 in the second direction, and improving the direction selectivity of the vibration sensor 700. In some embodiments, the response sensitivity of the vibration component 730 to the vibrations of the housing 710 in the first direction may be changed (e.g., improved) by adjusting a thickness and an elastic coefficient of the elastic element 732, a mass and a size of the mass element 731, etc.

In some embodiments, a distance between the centroid of the at least one elastic element 732 and the center of gravity of the mass element 731 in the first direction may not be greater than ⅓ of the thickness of the mass element 731. In some embodiments, the distance between the centroid of the at least one elastic element 732 and the center of gravity of the mass element 731 in the first direction may not be greater than ½ of the thickness of the mass element 731. In some embodiments, the distance between the centroid of the at least one elastic element 732 and the center of gravity of the mass element 731 in the first direction may not be greater than ¼ of the thickness of the mass element 731. In some embodiments, a distance between the centroid of the at least one elastic element 732 and the center of gravity of the mass element 731 in the second direction may not be greater than ⅓ of a side length or a radius of the mass element 731. In some embodiments, the distance between the centroid of the at least one elastic element 732 and the center of gravity of the mass element 731 in the second direction may not be greater than ½ of the side length or the radius of the mass element 731. In some embodiments, the distance between the centroid of the at least one elastic element 732 and the center of gravity of the mass element 731 in the second direction may not be greater than ¼ of the side length or the radius of the mass element 731. For example, when the mass element 731 is a cube, the distance between the centroid of the at least one elastic element 732 and the center of gravity of the mass element 731 in the second direction may not be greater than ⅓ of the side length of the mass element 731. As another example, when the mass element 731 is a cylinder, the distance between the centroid of the at least one elastic element 732 and the center of gravity of the mass element 731 in the second direction may not be greater than ⅓ of a circular radius of the upper surface (or the lower surface) of the mass element 731.

In some embodiments, when the centroid of the at least one elastic element 732 coincides or approximately coincides with the center of gravity of the mass element 731, the resonant frequency of the vibrations of the vibration component 730 in the second direction may shift to a high frequency without changing the resonant frequency of the vibrations of the vibration component 730 in the first direction. In some embodiments, when the centroid of the at least one elastic element 732 coincides with or approximately coincides with the center of gravity of the mass element 731, the resonant frequency of the vibrations of the vibration component 730 in the first direction may remain substantially constant. For example, the resonant frequency of the vibrations of the vibration component 730 in the first direction may be a frequency in a relatively strong frequency range (e.g., 20 Hz-2000 Hz, 2000 Hz-3000 Hz, etc.) that is perceived by human ears. The resonant frequency of the vibrations of the vibration component 730 in the second direction may shift to a high frequency, so as to be in a relatively weak frequency range (e.g., 5000 Hz-3000 Hz, 1 kHz-14 kHz, etc.) that is perceived by the human ears. As the resonant frequency of the vibrations of the vibration component 730 in the second direction shifts to the high frequency, and the resonant frequency of the vibrations of the vibration component 730 in the first direction remains substantially constant, a ratio of the resonant frequency of the vibrations of the vibration component 730 in the second direction to the resonant frequency of the vibrations of the vibration component 730 in the first direction may be greater than or equal to 2. In some embodiments, the ratio of the resonant frequency of the vibrations of the vibration component 730 in the second direction to the resonant frequency of the vibrations of the vibration component 730 in the first direction may also be greater than or equal to other values. For example, the ratio of the resonant frequency of the vibrations of the vibration component 730 in the second direction to the resonant frequency of the vibrations of the vibration component 730 in the first direction may also be greater than or equal to 1.5.

In some embodiments, the vibration component 730 may further include a first hole part (not shown in the figure), and the first acoustic cavity 740 may be spatially connected to the second acoustic cavity 750 through the first hole part. In some embodiments, the first hole part may include a first sub-hole part (not shown in the figure). The first sub-hole part may be arranged in a region on the elastic element 732 not covered by the first mass element 7311 and the second mass element 7312, so that the first acoustic cavity 740 may be spatially connected to the other acoustic cavities (e.g., the second acoustic cavity 750) of the plurality of acoustic cavities. In some embodiments, hole parts may also be arranged on the first mass element 7311, the second mass element 7312, and the elastic element 732, so that the first acoustic cavity 740 may be spatially connected to the other acoustic cavities of the plurality of acoustic cavities. For example, the first hole part may include one first sub-hole part and two second sub-hole parts (not shown in the figure). The two second sub-hole parts may be respectively arranged on the first mass element 7311 and the second mass element 7312. The first sub-hole part may be located on the elastic element 732, and the two second sub-hole parts may be respectively located at two ends of the first sub-hole part and spatially connected to the first sub-hole part. In some embodiments, sizes of the two second sub-hole parts may be the same or different. A size of the first sub-hole part and the sizes of the second sub-hole parts may be the same or different. The descriptions regarding the first hole part may be found in the relevant descriptions in FIG. 24 and FIG. 25, which are not repeated here. In some embodiments, the vibration component 730 may also be made of a gas-permeable material. For example, in some embodiments, a material of the mass element 731 may be the same as a material of the elastic element 732, and both of the mass element 731 and the elastic element 732 may be made of the gas-permeable material. In some embodiments, the material of the mass element 731 may be different from the material of the elastic element 732. For example, the elastic element 732 may be made of the gas-permeable material, and the mass element 731 may be made of a hard material (e.g., iron, copper, silicon, etc.).

In some embodiments, a second hole part (not shown in the figure) may be arranged on the housing 710, and the first acoustic cavity 740, the other acoustic cavities of the plurality of acoustic cavities, and the acoustic transducer may be spatially connected to the outside through the second hole part. During the assembly process of the vibration sensor 700, the second hole part may deliver gas inside the housing 710 to the outside. In this way, by setting the second hole part, when the vibration component 730 and the acoustic transducer are assembled, failure of the vibration component 730 (e.g., the elastic element 732) and the acoustic transducer due to an excessive air pressure difference between inner and outer spaces of the housing 710 may be avoided, thereby reducing the difficulty of assembling the vibration sensor 700. In some embodiments, air conduction sound in the environment may affect the use performance of the vibration sensor 700. In order to reduce the impact of the air conduction sound in the environment, after the vibration sensor 700 is prepared or before the vibration sensor 700 is applied to an electronic device, the second hole part may be sealed with a sealing material, so as not to affect the performance of the vibration sensor 700. In some embodiments, the second hole part may be blocked by means of using a sealant, bonding of a sealing tape, adding a sealing plug, or the like. The descriptions regarding the second hole part may be found in the relevant descriptions in FIG. 2, which is not repeated here.

In some embodiments, a third hole part (not shown in the figure) may be arranged on the housing 710, and the third hole part may enable the external environment and the acoustic cavity inside the housing 710 to be spatially connected, thereby reducing vibration resistance of the vibration component 730, and improving the sensitivity of the vibration sensor 700. The descriptions regarding the third hole part may be found in the relevant descriptions in FIG. 2, which is not repeated here.

Figure 8:
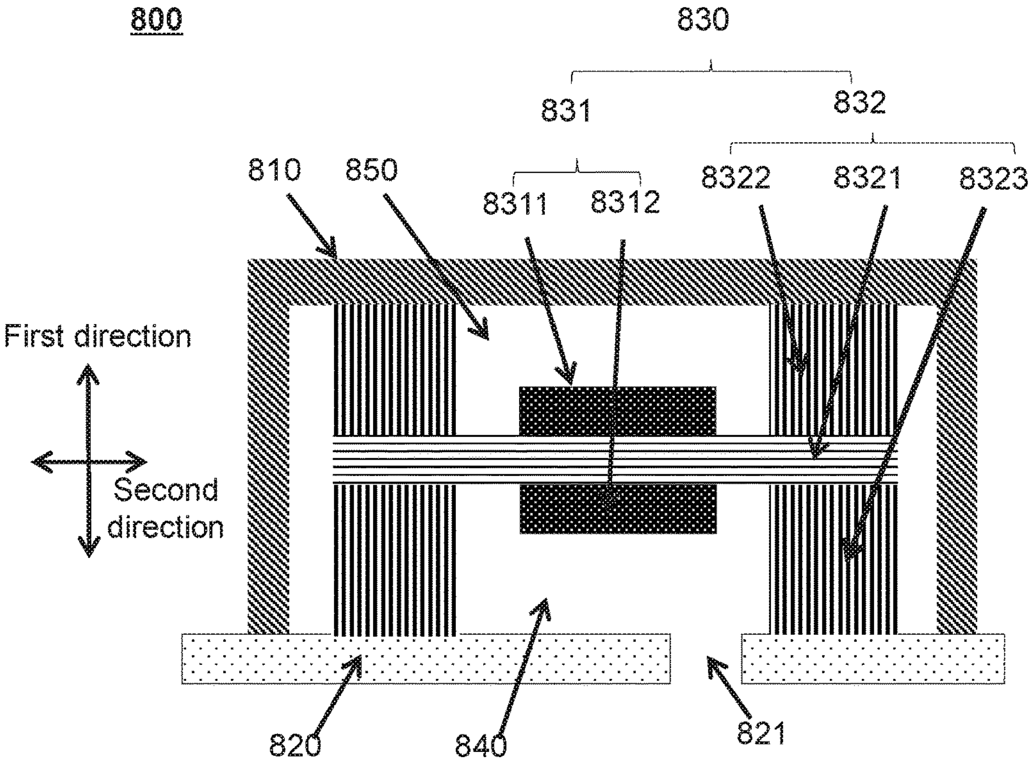
FIG. 8 is a schematic diagram illustrating a structure of a vibration sensor according to some embodiments of the present disclosure.

FIG. 8 is a schematic diagram illustrating a structure of a vibration sensor according to some embodiments of the present disclosure. As shown in FIG. 8, a vibration sensor 800 may include a housing 810, an acoustic transducer, and a vibration component 830. The vibration sensor 800 shown in FIG. 8 may be the same as or similar to the vibration sensor 700 shown in FIG. 7. For example, the housing 810 of the vibration sensor 800 may be the same as or similar to the housing 710 of the vibration sensor 700. As another example, a first acoustic cavity 840 of the vibration sensor 800 may be the same as or similar to the first acoustic cavity 740 of the vibration sensor 700. As another example, the acoustic transducer of the vibration sensor 800 may be the same as or similar to the acoustic transducer of the vibration sensor 700. The descriptions regarding more structures of the vibration sensor 800, such as a second acoustic cavity 850, a sound pickup hole 821, a mass element 831, a first mass element 8311, a second mass element 8312, a substrate 820, etc. may be found in FIG. 7 and relevant descriptions thereof.

Compared with the vibration sensor 700, an elastic element 832 of the vibration sensor 800 may further include a second elastic element 8322 and a third elastic element 8323. In some embodiments, the first elastic element 8321 may be connected to the housing 810 or the acoustic transducer through the second elastic element 8322 and the third elastic element 8323 respectively. As shown in FIG. 8, the first elastic element 8321 may be a film structure, and the second elastic element 8322 and the third elastic element 8323 may be columnar structures. An upper surface of the first elastic element 8321 may be connected to a lower surface of the second elastic element 8322, and an upper surface of the second elastic element 8322 may be connected to an inner wall of the housing 810. A lower surface of the first elastic element 8321 may be connected to an upper surface of the third elastic element 8323, and a lower surface of the third elastic element 8323 may be connected to the acoustic transducer through the substrate 820 on an upper surface of the acoustic transducer. In some embodiments, peripheral sides of the first elastic element 8321, the second elastic element 8322 and the third elastic element 8323 may coincide or approximately coincide. In some embodiments, the peripheral sides of the first elastic element 8321, the second elastic element 8322 and the third elastic element 8323 may not coincide. For example, when the first elastic element 8321 is the film structure, and the second elastic element 8322 and the third elastic element 8323 are the columnar structures, the peripheral side of the first elastic element 8321 may be connected to the inner wall of the housing 810, and a gap may be arranged between the peripheral sides of the second elastic element 8322 and the third elastic element 8323 and the inner wall of the housing 810.

It should be noted that an arrangement direction of the vibration component (e.g., the vibration component 330 shown in FIG. 3, the vibration component 530 shown in FIG. 5, etc.) of the vibration sensor shown in some embodiments of the present disclosure may be a horizontal arrangement. In some embodiments, the arrangement direction of the vibration component may also be in other directions (e.g., a vertical arrangement or an oblique arrangement). Correspondingly, a first direction and a second direction may change with the mass element (e.g., the vibration component 330 shown in FIG. 3, the vibration component 530 shown in FIG. 5, etc.). For example, when the vibration component 330 (the mass element 331) of the vibration sensor 300 is vertically arranged, it can be approximately considered that the entire vibration component 330 shown in FIG. 3 may rotate 90° clockwise (or counterclockwise). Correspondingly, the first direction and the second direction may also change with the rotation of the vibration component 330. The working principle of the vibration sensor when the vibration component is vertically arranged may be similar to that of the vibration sensor when the vibration component is horizontally arranged, which is not repeated here.

In some embodiments, the vibration component 830 may further include a first hole part (not shown in the figure), and the first acoustic cavity 840 may be spatially connected to the second acoustic cavity 850 through the first hole part. In some embodiments, the first hole part may include a first sub-hole part (not shown in the figure). The first sub-hole part may be arranged in a region on the first elastic element 8321 not covered by the second elastic element 8322, the third elastic element 8323, the first mass element 8311, and the second mass element 8312, so that the first acoustic cavity 840 may be spatially connected to the other acoustic cavities (e.g., the second acoustic cavity 850) of the plurality of acoustic cavities. In some embodiments, hole parts may also be arranged on the first mass element 8311, the second mass element 8312, and the first elastic element 8321, so that the first acoustic cavity 840 may be spatially connected to the other acoustic cavities of the plurality of acoustic cavities. For example, the first hole part may include one first sub-hole part and two second sub-hole parts (not shown in the figure). The two second sub-hole parts may be respectively arranged on the first mass element 8311 and the second sub-hole portion. The first sub-hole part may be located on the first elastic element 8321, and the two second sub-hole parts may be respectively located at both ends of the first sub-hole part and spatially connected to the first sub-hole part. It should be noted that the region where the hole parts are arranged may not be covered by the second elastic element 8322 and the third elastic element 8323. In some embodiments, sizes of the two second sub-hole parts may be the same or different. A size of the first sub-hole part and the sizes of the second sub-hole parts may be the same or different. The descriptions regarding the first hole part may be found in the relevant descriptions in FIG. 24 and FIG. 25, which are not repeated here. In some embodiments, the vibration component 830 may also be made of a gas-permeable material. For example, in some embodiments, a material of the mass element 831 and a material of the elastic element 832 (e.g., the first elastic element 8321) may be the same, and both the mass element 831 and the elastic element 832 may be made of the gas-permeable material. In some embodiments, the material of the mass element 831 may be different from the material of the elastic element 832. For example, the elastic element 832 (e.g., the first elastic element 8321) may be made of the gas-permeable material, and the mass element 831 is made of a hard material (e.g., iron, copper, silicon, etc.).

In some embodiments, a second hole part (not shown in the figure) may be arranged on the housing 810, and the first acoustic cavity 840, the other acoustic cavities of the plurality of acoustic cavities and the acoustic transducer may be spatially connected to the outside through the second hole part. During the assembly process of the vibration sensor 800, the second hole part may deliver gas inside the housing 810 to the outside. In this way, by setting the second hole part, when the vibration component 830 and the acoustic transducer are assembled, failure of the vibration component 830 (e.g., the elastic element 832) and the acoustic transducer due to an excessive air pressure difference between inner and outer spaces of the housing 810 may be avoided, thereby reducing the difficulty of assembling the vibration sensor 800. In some embodiments, air conduction sound in the environment may affect the use performance of the vibration sensor 800. In order to reduce the impact of the air conduction sound in the environment, after the vibration sensor 800 is prepared or before the vibration sensor 800 is applied to an electronic device, the second hole part may be sealed with a sealing material, so as not to affect the performance of the vibration sensor 800. In some embodiments, the second hole part may be blocked by means of using a sealant, bonding of a sealing tape, adding a sealing plug, or the like. The descriptions regarding the second hole part may be found in the relevant descriptions in FIG. 2, which is not repeated here.

In some embodiments, a third hole part (not shown in the figure) may be arranged on the housing 810. The third hole part may enable the external environment and the acoustic cavity inside the housing 810 to be spatially connected, thereby reducing the vibration resistance of the vibration component 830, and improving the sensitivity of the vibration sensor 800. The descriptions regarding the third hole part may be found in the relevant descriptions in FIG. 2, which is not repeated here.

Figure 9:
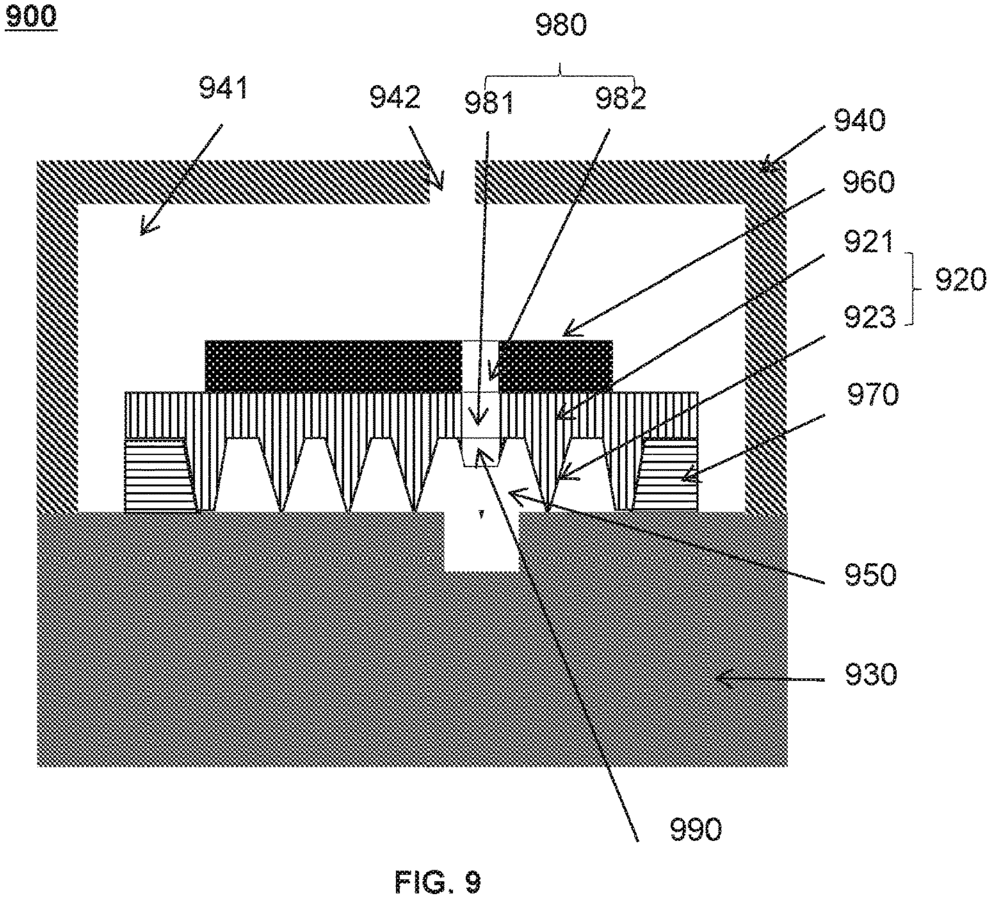
FIG. 9 is a schematic diagram illustrating a structure of a vibration sensor according to some embodiments of the present disclosure.

FIG. 9 is a schematic diagram illustrating a structure of a vibration sensor according to some embodiments of the present disclosure. As shown in FIG. 9, the vibration sensor 900 may include an elastic element 920, an acoustic transducer 930, a housing 940, a mass element 960, and a sealing unit 970. The elastic element 920 and the mass element 960 may form a vibration component. The housing 940 may have an acoustic cavity 941 configured to accommodate one or more components (e.g., the elastic element 920, the mass element 960, and the sealing unit 970) of the vibration sensor 900. In some embodiments, the housing 940 may be a semi-closed housing, and connected to the acoustic transducer 930 to form the acoustic cavity 941. For example, the housing 940 may cover the acoustic transducer 930 to form the acoustic cavity 941.

In some embodiments, the vibration sensor 900 shown in FIG. 9 may be used as a vibration sensor in the field of microphones, e.g., a bone conduction microphone. For example, when applied to the bone conduction microphone, the acoustic transducer 930 may obtain a sound pressure change of the first acoustic cavity 950 and convert the sound pressure change of the first acoustic cavity 950 into an electrical signal. In some embodiments, the elastic element 920 may be arranged on the acoustic transducer (i.e., the acoustic transducer 930), and the first acoustic cavity 950 may be formed between the elastic element 920 and the acoustic transducer.

The elastic element 920 may include an elastic film 921. Convex structures 923 may be arranged on a surface (also referred to as an inner surface) of a side of the elastic film 921 near the acoustic transducer 930. The convex structures 923 and the elastic film 921 (forming a first sidewall of the first acoustic cavity 950) and the acoustic transducer 930 (forming a second sidewall of the first acoustic cavity 950) may jointly form the first acoustic cavity 950.

In some embodiments, the vibration component may include a first hole part 980, and the first acoustic cavity 950 may be spatially connected to other acoustic cavities through the first hole part 980. In some embodiments, the first hole part 980 may include a first sub-hole part 981. The first sub-hole part 981 may be arranged in a region on the elastic film 921 of the elastic element 981 not covered by the mass element 960, so that the first acoustic cavity 950 may be spatially connected to the other acoustic cavities (e.g., the acoustic cavity 941) of the plurality of acoustic cavities. In some embodiments, hole parts may also be arranged on both the elastic element 981 and the mass element 960, so that the first acoustic cavity 950 may be spatially connected to the other acoustic cavities of the plurality of acoustic cavities. For example, the first hole part 980 may include a first sub-hole part 981 and a second sub-hole part 982. The first sub-hole part 981 may be arranged at a position between two adjacent convex structures 923 on the elastic film 921. The second sub-hole part 982 may be located on the mass element 960. The second sub-hole part 982 may be spatially connected to the first sub-hole part 981. In some embodiments, the convex structures 923 may include a fifth hole part 990. The fifth hole part 990 may penetrate through the convex structures 923 along a first direction. The first hole part 980 may be spatially connected to the fifth hole part 990. In some embodiments, a size of the first sub-hole part 981, a size of the second sub-hole part 982, and a size of the fifth hole part 990 may be the same or different. The descriptions regarding the first hole part 980 may be found in the relevant descriptions in FIG. 24 and FIG. 25, which are not repeated here. In some embodiments, the vibration component may also be made of a gas-permeable material. For example, in some embodiments, a material of the mass element 960 may be the same as a material of the elastic element 920, and both the mass element 960 and the elastic element 920 may be made of the gas-permeable material. In some embodiments, the material of the mass element 960 may be different from the material of the elastic element 920. For example, the elastic element 920 may be made of the gas-permeable material, and the mass element 960 may be made of a hard material (e.g., iron, copper, silicon, etc.).

In some embodiments, a second hole part (not shown in the figure) may be arranged on the housing 940, and the acoustic cavity 941, other acoustic cavities and the acoustic transducer may be spatially connected to the outside through the second hole part. During the assembly process of the vibration sensor 900, the second hole part may deliver gas inside the housing 940 to the outside. In this way, by setting the second hole part, when the elastic element 920, the mass element 960, and the acoustic transducer are assembled, the failure of the elastic element 920 and the acoustic transducer due to an excessive pressure difference between the inner and outer spaces of the housing 940 may be avoided, thereby reducing the difficulty of assembling the vibration sensor 900. In some embodiments, air conduction sound in the environment may affect the use performance of the vibration sensor 900. In order to reduce the impact of the air conduction sound in the environment, after the vibration sensor 900 is prepared or before the vibration sensor 900 is applied to an electronic device, the second hole part may be sealed with a sealing material, so as not to affect the performance of the vibration sensor 900. In some embodiments, the second hole part may be blocked by means of using a sealant, bonding of a sealing tape, adding a sealing plug, or the like. The descriptions regarding the second hole part may be found in the relevant descriptions in FIG. 2, which is not repeated here.

In some embodiments, a third hole part 942 may be arranged on the housing 940. The third hole part 942 may enable the external environment and the acoustic cavity inside the housing 940 to be spatially connected, thereby reducing the vibration resistance of the elastic element 920, and improving the sensitivity of the vibration sensor 900. The descriptions regarding the third hole part 942 may be found in the relevant descriptions in FIG. 2, which are not repeated here.

As shown in FIG. 9, an outer edge of the elastic film 921 may be physically connected to the acoustic transducer 930. The physical connection may include bonding, stapling, snapping, and connecting through additional connection components (e.g., the sealing unit 970). For example, the outer edge of the elastic film 921 may be bonded with the acoustic transducer 930 by an adhesive to form the first acoustic cavity 950. However, the sealing performance of adhesive bonding may be poor, which may reduce the sensitivity of the vibration sensor 900 to a certain extent. In some embodiments, tops of the convex structures 923 may abut against a surface of the acoustic transducer 930. The tops refer to ends of the convex structures 923 away from the elastic film 921. Connections between the tops of the convex structures 923 arranged on a periphery of the elastic film 921 and the surface of the acoustic transducer 930 may be sealed by the sealing unit 970, so that the convex structures 923, the elastic film 921, the sealing unit 970 and the acoustic transducer 930 may form the closed first acoustic cavity 950. It can be understood that the location of the sealing unit 970 may not be limited to the above description. In some embodiments, the sealing unit 970 may not be limited to be arranged at the connections between the tops of the convex structures 923 and the surface of the acoustic transducer 930, but may also be arranged on outer sides (i.e., sides of the convex structures 923 away from the first acoustic cavity 950) of the convex structures 923 for forming the first acoustic cavity 950. In some embodiments, in order to further improve the sealing performance, the sealing unit may also be arranged inside the first acoustic cavity 950. The connection between the elastic element 920 and the acoustic transducer 930 may be sealed with the sealing unit 970, which can ensure the sealing performance of the entire first acoustic cavity 950, thereby effectively improving the reliability and the stability of the vibration sensor 900, and ensuring sensitivity of the vibration sensor 900. In some embodiments, the sealing unit 970 may be made of a material such as silica gel and rubber, thereby further improving the sealing performance of the sealing unit 970. In some embodiments, a type of the sealing unit 970 may include one or more of a sealing ring, a sealing gasket, and a sealing strip.

The mass element 960 may be connected to the elastic element 920 and located on a side of the elastic element 920 away from the first acoustic cavity 950. For example, the mass element 960 may be arranged on the elastic film 921, and located on a side away from the first acoustic cavity 950. In response to the vibrations of the housing 940 or the acoustic transducer 930, the mass element 960 and the elastic element 920 may form a resonant system to generate vibrations. The mass element 960 may have a certain mass, and a vibration amplitude of the elastic element 920 relative to the housing 940 may be increased, so that a volume change of the first acoustic cavity 950 may change significantly under an action of external vibrations of different intensities, thereby improving the sensitivity of the vibration sensor 900.

In some embodiments, the mass element 960 may be arranged on a side of the elastic element 920 facing the acoustic transducer 930. For example, the convex structures 923 may be directly arranged (e.g., processed by cutting, injection molding, bonding, etc.) on a surface of the side of the mass element 960 facing the acoustic transducer 930. Since the mass element 960 has elasticity, the convex structures 923 arranged on the mass element 960 may also have elasticity. In this embodiment, the mass element 960 may reduce a volume of the first acoustic cavity 950, thereby improving the sensitivity of the vibration sensor 900 to a certain extent. In some embodiments, the tops of the convex structures 923 arranged on the mass element 960 may abut against the surface of the acoustic transducer 930, so that the convex structures 923 may produce elastic deformation due to extrusion during movement, improving the volume change of the first acoustic cavity 950, and improving the sensitivity of the vibration sensor 900.

In some embodiments, the sensitivity of the vibration sensor 900 may be improved in other ways, such as adjusting a Young's modulus of the elastic film 921 and a Young's modulus of the mass element 960, adjusting a ratio or a difference between a thickness of the mass element 960 and a thickness of the elastic film 921, adjusting a ratio of a projection area of the mass element 960 in the first direction to a projection area of the elastic element 920 in the first direction, a ratio of the projection area of the mass element 960 in the first direction to a projection area of the first acoustic cavity 950 in the first direction, increasing the volume change of the first acoustic cavity 950 or reducing the volume of the first acoustic cavity 950, adjusting an interval between the adjacent convex structures 923, adjusting a width of a single convex structure 923, adjusting a ratio of the width of the convex structure 923 to the interval between the adjacent convex structures 923, adjusting heights of the convex structures 923, adjusting a difference between the heights of the convex structures 923 and a height of the first acoustic cavity 950, and a gap between the convex structures 923 and the surface of the acoustic transducer 930, adjusting a ratio of the heights of the convex structures 923 to the thickness of the elastic film 921, etc.

Figure 10:
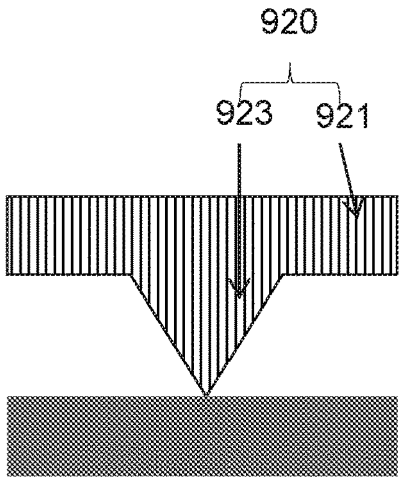
FIG. 10 is a schematic diagram illustrating convex structures abutting against a second sidewall of a first acoustic cavity according to some embodiments of the present disclosure.

In some embodiments, the convex structures 923 may be in direct contact with the surface of the acoustic transducer 930. Then the heights of the convex structures 923 may be the same or similar to the height of the first acoustic cavity 950. FIG. 10 is a schematic diagram illustrating convex structures abutting against a second sidewall of a first acoustic cavity according to some embodiments of the present disclosure. As shown in FIG. 10, convex structures 923 may abut against the second sidewall of a first acoustic cavity 950. The convex structures 923 may have a certain elasticity. In this embodiment, when an elastic element 920 is excited by an external force to move, the elastic element 920 may drive the convex structures 923 to move toward a direction of an acoustic transducer 930.

Figure 11:
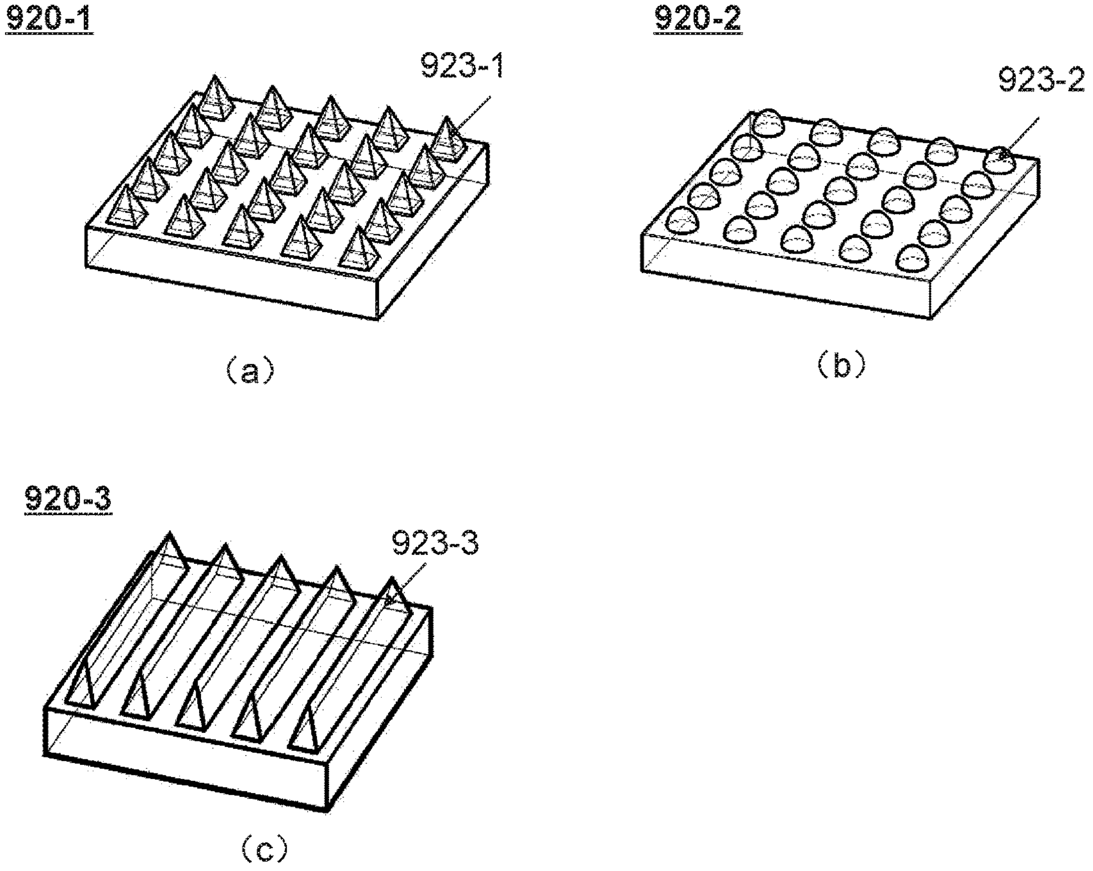
FIG. 11 is a schematic diagram illustrating three different shapes of convex structures according to some embodiments of the present disclosure.

In some embodiments, a volume change of the first acoustic cavity 950 may also be related to shapes of the convex structures 923. In some embodiments, the shapes of the convex structures 923 may be various shapes. FIG. 11 shows three different shapes of convex structures. Shapes of convex structures 923-1 in FIG. 11(*a*) may be pyramidal, and the convex structures 923-1 may be distributed in a dot array on an inner surface of an elastic element 920-1. Shapes of convex structures 923-2 in FIG. 11(*b*) may be hemispherical, and the convex structures 923-2 may be distributed in a dot array on an inner surface of an elastic element 920-2. Shapes of convex structures 923-3 in FIG. 11(*c*) may be stripe-shaped, and the convex structures 923-3 may be distributed in a linear array on an inner surface of an elastic element 920-3. It can be understood that this is for illustrative purposes only and is not intended to limit the shapes of the convex structures 923. The convex structures 923 may also be in other possible shapes, e.g., terraced, cylindrical, ellipsoidal, etc.

Referring to FIG. 11, the shapes of the convex structures 923 may be pyramidal. Compared with other shapes (e.g., hemispherical), when the convex structures 923 are subjected to an external force, the pyramidal convex structures 923 may cause stress to concentrate on tops. If Young's modulus of different shapes of convex structures 923 are the same, an equivalent stiffness of the pyramidal convex structures 923 may be lower, an elastic coefficient may be lower, and elastic deformation may be larger, so that the volume change of the first acoustic cavity 950 may be larger, and a sensitivity increase of the vibration sensor 900 may be larger.

Figure 12:
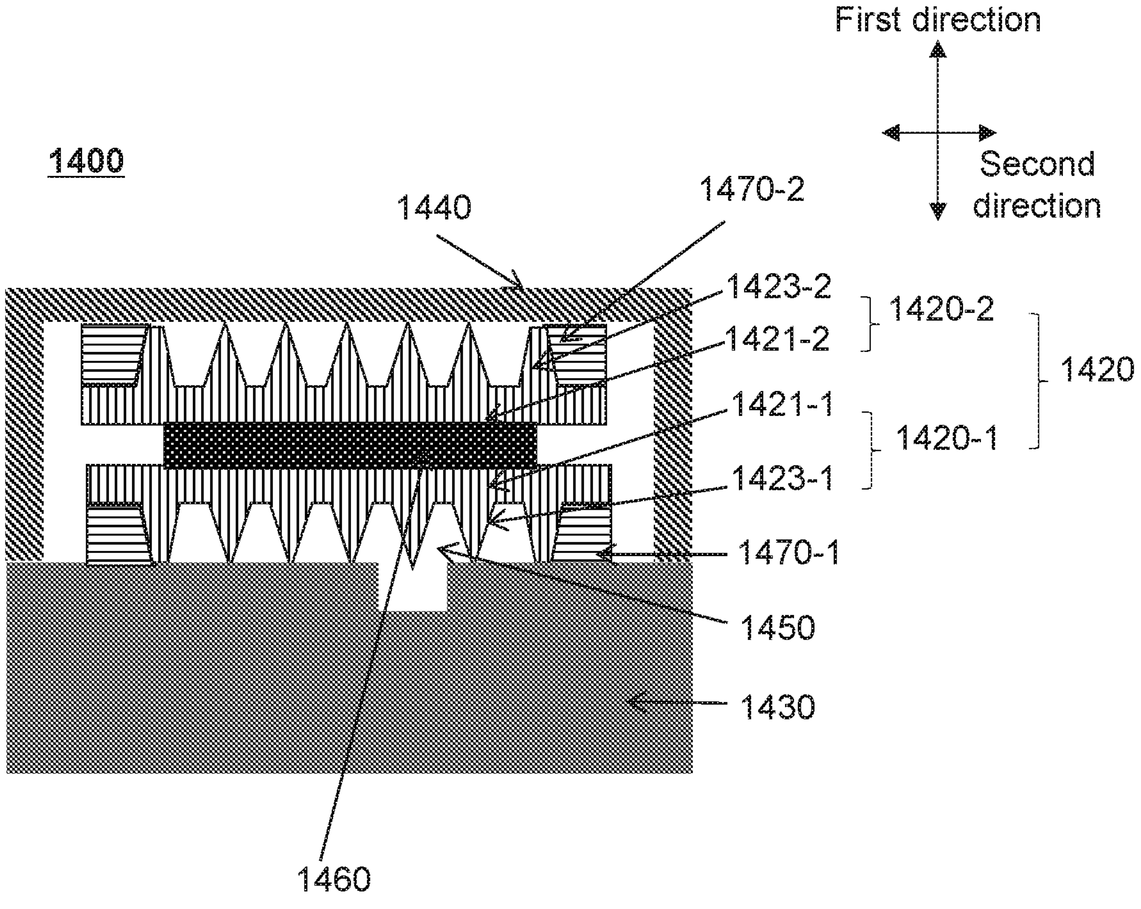
FIG. 12 is a schematic diagram illustrating a vibration sensor according to some embodiments of the present disclosure.

FIG. 12 is a schematic diagram illustrating a vibration sensor 1400 according to some embodiments of the present disclosure. A vibration sensor 1410 shown in FIG. 12 may be similar to the vibration sensor 900 shown in FIG. 9. An elastic element 1420 and a mass element 1460 may form a vibration component. The difference lies in that the elastic element 1420 of the vibration sensor 1410 may include a first elastic element 1420-1 and a second elastic element 1420-2. The first elastic element 1420-1 and the second elastic element 1420-2 may be respectively arranged on two sides of the mass element 1460 in a first direction. The first elastic element 1420-1 may be located on a side of the mass element 1460 near the acoustic transducer 1430, and the second elastic element 1420-2 may be located on a side of the mass element 1460 away from the acoustic transducer 1430. Similar to the elastic element 920 shown in FIG. 9, the first elastic element 1420-1 may include a first elastic film 1421-1 and a first convex structure 1423-1 arranged on a surface (also referred to as an inner surface) of a side of the first elastic film 1421-1 facing a first acoustic cavity 1450. Edges of the first convex structures 1423-1 may be connected to the acoustic transducer 1430 in a sealing manner through a first sealing unit 1470-1, so that the first elastic film 1421-1, the first convex structures 1423-1, the first sealing unit 1470-1 and the acoustic transducer 1430 may form the first acoustic cavity 1450. The second elastic element 1420-2 may include a second elastic film 1421-2 and a second convex structure 1423-2 arranged on a side of the second elastic film 1421-2 away from the first acoustic cavity 1450. Edges of the second convex structures 1423-2 may be connected to a top wall (i.e., a side of the housing 1440 away from the acoustic transducer 1430) of a housing 1440 in a sealing manner through a second sealing unit 1470-2.

In some embodiments, at least one of the first elastic element 1420-1 and the second elastic element 1420-2 may include an elastic microstructure layer (not shown in the figure). Taking the first elastic element 1420-1 as an example, the first elastic element 1420-1 may include a first elastic film 1421-1 and a first elastic microstructure layer, and the first elastic microstructure layer may be arranged on a side of the first elastic film 1421-1 facing the acoustic transducer 1430. A side of the first elastic microstructure layer facing the acoustic transducer 1430 may include the first convex structures 1423-1. The first convex structures 1423-1 may be a part of the first elastic microstructure layer. The elastic microstructure layer may be the same as or similar to the elastic microstructure layer in one or more of the foregoing embodiments, which is not repeated here.

As shown in FIG. 12, the first elastic element 1420-1 and the second elastic element 1420-2 may be distributed on opposite sides of the mass element 1460 along a first direction. The first elastic element 1420-1 and the second elastic element 1420-2 may be approximated as one elastic element 1420. For the convenience of description, the elastic element 1420 integrally formed by the first elastic element 1420-1 and the second elastic element 1420-2 may be referred to as a third elastic element. A centroid of the third elastic element may coincide with or approximately coincide with a center of gravity of the mass element 1460, and the second elastic element 1420-2 may be connected to the top wall (i.e., the side of the housing 1440 away from the acoustic transducer 1430) of the housing 1440 in a sealing manner, so that in a target frequency range (e.g., below 3000 Hz), a response sensitivity of the third elastic element to vibrations of the housing 1440 in the first direction may be higher than a response sensitivity of the third elastic element to the vibrations of the housing 1440 in a second direction.

In some embodiments, the third elastic element (i.e., the elastic element 1420) may generate vibration in the first direction in response to the vibrations of the housing 1440. The vibrations in the first direction may be regarded as a target signal picked up by the vibration sensor 1410 (e.g., the vibration sensor), and the vibrations in the second direction may be regarded as a noise signal. During a working process of the vibration sensor 1410, the response sensitivity of the third elastic element to the vibrations of the housing 1440 in the second direction may be reduced by reducing the vibrations generated by the third elastic element in the second direction, thereby improving a direction selectivity of the vibration sensor 1410, and reducing the interference of the noise signal to a sound signal.

In some embodiments, when the third elastic element generates vibrations in response to the vibrations of the housing 1440, if the centroid of the third elastic element coincides or approximately coincides with the center of gravity of the mass element 1460, and the second elastic element 1420-2 is connected to the top wall (i.e., the side of the housing 1440 away from the acoustic transducer 1430) of the housing 1440 in a sealing manner, the vibrations of the mass element 1460 in the second direction may be reduced on the premise that the response sensitivity of the third elastic element to the vibrations of the housing 1440 in the first direction is basically constant, thereby reducing the response sensitivity of the third elastic element to the vibrations of the housing 1440 in the second direction, and improving the direction selectivity of the vibration sensor 1410. It should be noted that here, the centroid of the third elastic element approximately coinciding with the center of gravity of the mass element 1460 can be understood as that the third elastic element may be a regular geometric structure with a uniform density, and the centroid of the third elastic element may approximately coincide with the center of gravity of the mass element 1460. The center of gravity of the third elastic element may be regarded as the center of gravity of the mass element 1460. Then the centroid of the third elastic element may be considered as approximately coincident with the center of gravity of the mass element

1460. In some embodiments, when the third elastic element has an irregular structure or uneven density, it can be considered that the actual center of gravity of the third elastic element may approximately coincide with the center of gravity of the mass element 1460. Approximate coincidence means that a distance between the actual center of gravity of the third elastic element or the centroid of the third elastic element and the center of gravity of the mass element 1460 may be in a certain range, e.g., less than 100 μm, less than 500 μm, less than 1 mm, less than 2 mm, less than 3 mm, less than 5 mm, less than 10 mm, etc.

When the centroid of the third elastic element coincides or approximately coincides with the center of gravity of the mass element 1460, a resonant frequency of vibrations of the third elastic element in the second direction may shift to a high frequency without changing the resonant frequency of the vibrations of the third elastic element in the first direction. The resonant frequency of the vibrations of the third elastic element in the first direction may remain substantially constant. For example, the resonant frequency of the vibrations of the third elastic element in the first direction may be a frequency in a relatively strong frequency range (e.g., 20 Hz-2000 Hz, 2000 Hz-300 0 Hz, etc.) perceived by human ears. The resonant frequency of the vibrations of the third elastic element in the second direction may shift to the high frequency and be a frequency in a relatively weak frequency range (e.g., 5000 Hz-14000 Hz, 1 kHz-14 kHz, etc.) perceived by the human ears.

It should be noted that the first hole part 980, the second hole part, the third hole part, and the fifth hole part of the vibration sensor 900 shown in FIG. 9 may also be applicable to the vibration sensor 1400 shown in FIG. 12, e.g., a first hole part or a fifth hole part arranged on the first elastic element 1420-1, the second elastic element 1420-2 and the mass element 1460.

Figure 13:
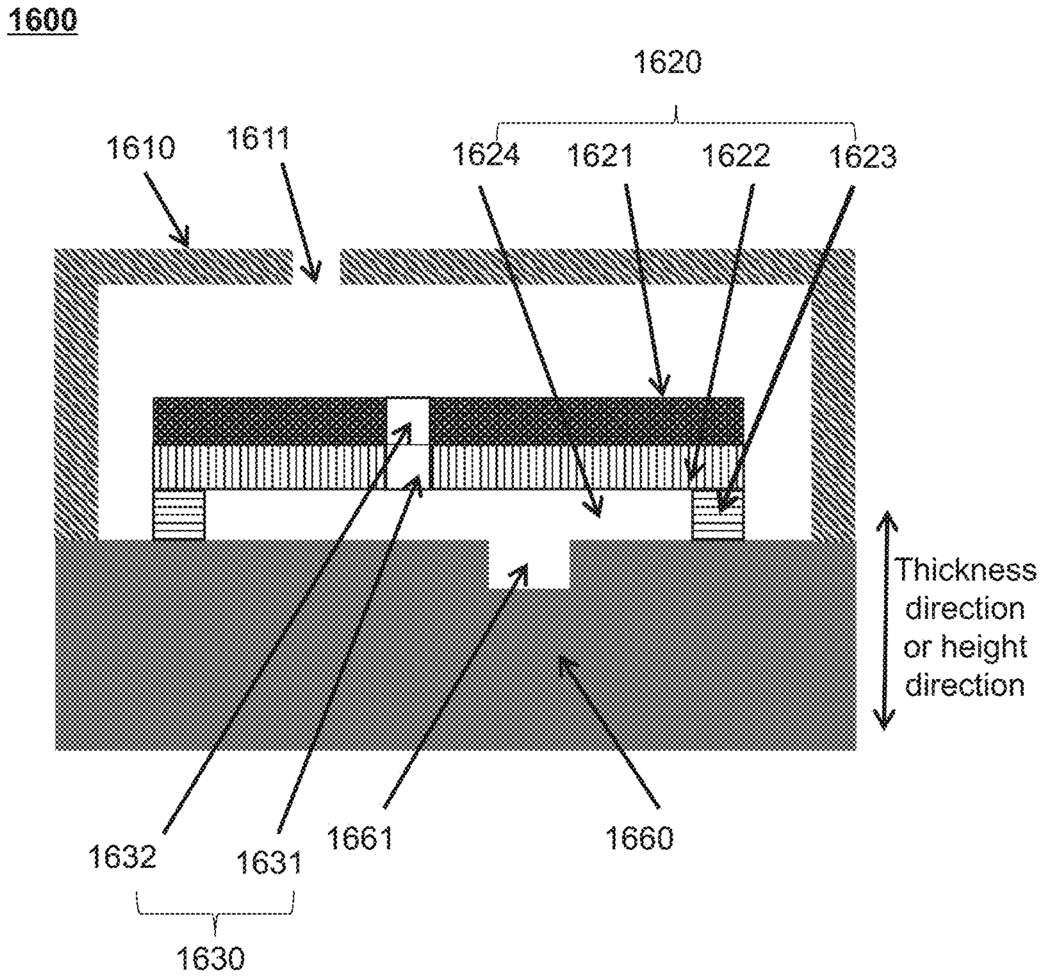
FIG. 13 is a schematic diagram illustrating a vibration sensor according to some embodiments of the present disclosure.

FIG. 13 is a schematic structural diagram illustrating a vibration sensor 1600 according to some embodiments of the present disclosure. As shown in FIG. 13, a vibration sensor 1600 may include a housing 1610, a vibration component 1620, and an acoustic transducer 1660. In some embodiments, the housing 1610 may be connected to the acoustic transducer 1660 to enclose a hollow structure. A connection mode between the housing 1610 and the acoustic transducer 1660 may be a physical connection. In some embodiments, the vibration component 1620 may be located in the enclosed hollow structure. The housing 1610 may be configured to generate vibrations based on an external vibration signal. The vibration component 1620 may pick up, convert, and transmit the vibrations (e.g., convert the vibrations into compression of air in a first acoustic cavity 1624), so that the acoustic transducer 1660 may generate an electrical signal.

In some embodiments, the vibration component 1620 may include a mass element 1621, an elastic element 1622, and a support frame 1623. The mass element 1621 and the support frame 1623 may be physically connected to two sides of the elastic element 1622 respectively. For example, the mass element 1621 and the support frame 1623 may be respectively connected to an upper surface and a lower surface of the elastic element 1622. The support frame 1623 may be physically connected to the acoustic transducer 1660. For example, an upper end of the support frame 1623 may be connected to the lower surface of the elastic element 1622, and a lower end of the support frame 1623 may be connected to the acoustic transducer 1660. The support frame 1623, the elastic element 1622 and the acoustic transducer 1660 may form the first acoustic cavity 1624. For example, as shown in FIG. 13, the first acoustic cavity 1624 may be formed by the elastic element 1622, the acoustic transducer 1660, and the support frame 1623 including a ring structure. As another example, as shown in FIG. 13, the first acoustic cavity 1624 may be formed by the elastic element 1622, the acoustic transducer 1660, and the support frame 1623 including the ring structure and a bottom plate. The first acoustic cavity 1624 may be acoustically connected to the acoustic transducer 1660. For example, a sound pickup hole 1661 may be arranged on the acoustic transducer 1660. The sound pickup hole 1661 refers to a hole on the acoustic transducer 1660 configured to receive a volume change signal of the first acoustic cavity. The first acoustic cavity 1624 may be spatially connected to the sound pickup hole 1661 arranged on the acoustic transducer 1660. The acoustic connection of the first acoustic cavity 1624 and the acoustic transducer 1660 may cause the acoustic transducer 1660 to sense a volume change of the first acoustic cavity 1624 and generate an electrical signal based on the volume change of the first acoustic cavity 1624. With this arrangement, the housing 1610 may generate vibrations based on an external vibration signal, the mass element 1621 may be configured to cause the elastic element 1622 to change a volume of the first acoustic cavity 1624 in response to the vibrations of the housing 1610, and the acoustic transducer 1660 may generate the electrical signal based on the volume change of the first acoustic cavity 1624. The mass element 1621, the elastic element 1622, and the support frame may form a mass-spring-damping system, so that the vibration component 1620 may effectively improve the sensitivity of the vibration sensor.

In some embodiments, a cross-sectional area of the mass element 1621 along a direction perpendicular to a thickness direction (as indicated by the arrow in FIG. 13) of the mass element 1621 may be greater than a cross-sectional area of the first acoustic cavity 1624 along a direction perpendicular to a height direction (as indicated by the arrow in FIG. 13) of the first acoustic cavity 1624. In some embodiments, a cross-sectional area of the elastic element 1622 along a direction perpendicular to a thickness direction of the elastic element 1622 may be greater than a cross-sectional area of the first acoustic cavity 1624 along a direction perpendicular to a height direction of the first acoustic cavity 1624. The mass element 1621 may be configured to cause compressive deformation in a region where the elastic element 1622 is in contact with the support frame 1623 in response to the vibrations of the housing 1610, and the elastic element 1622 may generate vibrations to change the volume of the first acoustic cavity 1624. The acoustic transducer 1660 may generate the electrical signal based on the volume change of the first acoustic cavity 1624.

It should be noted that when the cross-sectional area of the first acoustic cavity 1624 along the direction perpendicular to the height direction of the first acoustic cavity 1624 changes with a height, the cross-sectional area of 1624 of the first acoustic cavity along the direction perpendicular to the height direction of the first acoustic cavity 1624 described in the present disclosure refers to a cross-sectional area of a side of the first acoustic cavity 1624 near the elastic element 1622 along the direction perpendicular to the height direction of the first acoustic cavity 1624.

In some other embodiments, the cross-sectional area of the mass element 1621 along the direction perpendicular to the thickness direction of the mass element 1621 may be than the cross-sectional area of the first acoustic cavity 1624 along the direction perpendicular to the height direction of the first acoustic cavity 1624.

In some embodiments, the vibration component 1620 may further include a first hole part 1630, and the first acoustic cavity 1624 may be spatially connected to other acoustic cavities through the first hole part 1630. In some embodiments, hole parts may be arranged on the elastic element 1622 and the mass element 1621, so that the first acoustic cavity 1624 may be spatially connected to the other acoustic cavities of the plurality of acoustic cavities. In some embodiments, the first hole part 1630 may include a first sub-hole part 1631 and a second sub-hole part 1632. The first sub-hole part 1631 may be arranged on the elastic element 1622, and the second sub-hole part 1632 may be located on the mass element 1621. The second sub-hole part 1632 may be spatially connected to the first sub-hole part 1631. In some embodiments, a size of the first sub-hole part 1631 and a size of the second sub-hole part 1632 may be the same or different. The descriptions regarding the first hole part 1630 may be found in the relevant descriptions in FIG. 24 and FIG. 25, which are not repeated here. In some embodiments, the vibration component may also be made of a gas-permeable material. For example, in some embodiments, a material of the mass element 1621 may be the same as a material of the elastic element 1622, and both the mass element 1621 and the elastic element 1622 may be made of the gas-permeable material. In some embodiments, the material of the mass element 1621 may be different from the material of the elastic element 1622. For example, the elastic element 1622 may be made of the gas-permeable material, and the mass element 1621 may be made of a hard material (such as iron, copper, silicon, etc.).

In some embodiments, a second hole part (not shown in the figure) may be arranged on the housing 1610, and the first acoustic cavity 1624, the other acoustic cavities of the plurality of acoustic cavities and the acoustic transducer may be spatially connected to the outside through the second hole part. During the assembly process of the vibration sensor 1600, the second hole part may deliver gas inside the housing 1610 to the outside. In this way, by setting the second hole part, when the elastic element 1622, the mass element 1621, and the acoustic transducer are assembled, the failure of the elastic element 1622 and the acoustic transducer due to an excessive air pressure difference between inner and outer spaces of the housing 1610 may be avoided, thereby reducing the difficulty of assembling the vibration sensor 1600. In some embodiments, air conduction sound in the environment may affect the use performance of the vibration sensor 1600. In order to reduce the impact of the air conduction sound in the environment, after the vibration sensor 1600 is prepared or before the vibration sensor 1600 is applied to an electronic device, the second hole part may be sealed with a sealing material, so as not to affect the performance of the vibration sensor 1600. In some embodiments, the second hole part may be blocked by means of using a sealant, bonding of a sealing tape, adding a sealing plug, or the like. The descriptions regarding the second hole part may be found in the relevant descriptions in FIG. 2, which is not repeated here.

In some embodiments, a third hole part 1611 may be arranged on the housing 1610. The third hole part may enable the external environment and the acoustic cavity inside the housing 1610 to be spatially connected, thereby reducing the vibration resistance of the elastic element 1622, and improving the sensitivity of the vibration sensor 1600. The descriptions regarding the third hole part may be found in the relevant description in FIG. 2, which is not repeated here.

Figure 14:
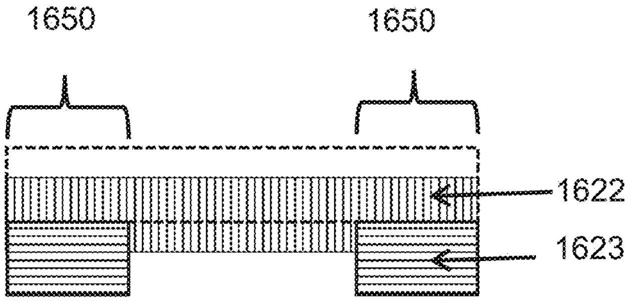
FIG. 14 is a schematic diagram illustrating a connection between an elastic element and a support frame according to some embodiments of the present disclosure.

FIG. 14 is a schematic diagram illustrating a connection between an elastic element and a support frame according to some embodiments of the present disclosure. As shown in FIG. 14, when a mass element 1621 generates vibrations, only a region 1650 where the elastic element 1622 is in contact with a support frame 1623 may undergo compressive deformation, and a contact part of the elastic element 1622 and the support frame 1623 may be equivalent to a spring, thereby improving the sensitivity of the vibration sensor 1600.

In some embodiments, a first acoustic cavity 1624 may be directly spatially connected to a sound pickup hole 1661 of an acoustic transducer 1660 to form an acoustic connection between the first acoustic cavity 1624 and the acoustic transducer 1660. In some other embodiments, the first acoustic cavity 1624 may be spatially connected to the sound pickup hole 1661 of the acoustic transducer 1660 through a through hole arranged on the support frame 1623 to form the acoustic connection between the first acoustic cavity 1624 and the acoustic transducer 1660.

In some embodiments, a cross-sectional area of the through hole on the support frame 1623 may be different from a cross-sectional area of the sound pickup hole 1661 of the acoustic transducer 1660. In some embodiments, a cross-sectional shape of the through hole on the support frame 1623 may be different from a cross-sectional shape of the sound pickup hole 1661 of the acoustic transducer 1660. In some embodiments, the cross-sectional area of the through hole on the support frame 1623 may be different from the cross-sectional area of the sound pickup hole 1661 of the acoustic transducer 1660, but the cross-sectional shape of the through hole on the support frame 1623 may be the same as the cross-sectional shape of the sound pickup hole 1661 of the acoustic transducer 1660. For example, the cross-sectional area of the through hole may be smaller than the cross-sectional area of the sound pickup hole 1661, and the cross-sectional shape of the through hole and the cross-sectional shape of the sound pickup hole may be both circular. In some embodiments, the through hole on the support frame 1623 and the sound pickup hole 1661 of the acoustic transducer 1660 may be aligned. For example, a central axis of the through hole and a central axis of the sound pickup hole 1661 may completely coincide. In some embodiments, the through hole on the support frame 1623 and the sound pickup hole 1661 of the acoustic transducer 1660 may not be aligned. For example, there may be a certain distance between the central axis of the through hole and the central axis of the sound pickup hole 1661. It should be noted that the depiction of a single sound pickup hole 1661 is for illustration only and is not intended to limit the scope of the present disclosure. It should be understood that the vibration sensor 1600 may include more than one sound pickup hole 1661. For example, the vibration sensor 1600 may include a plurality of sound pickup holes 1661 arranged in an array.

In some embodiments, a physical connection mode between the mass element 1621 and the elastic element 1622, a physical connection mode between the support frame 1623 and the elastic element 1622, and a physical connection mode between the support frame 1623 and the acoustic transducer 1660 may include welding, gluing, or the like, or any combination thereof.

In some embodiments, a cross-sectional shape of the elastic element 1622 along a direction perpendicular to a thickness direction of the elastic element 1622 may be rectangular, circular, hexagonal, or irregular. In some embodiments, a cross-sectional shape of the mass element 1621 along a direction perpendicular to a thickness direction of the mass element may be rectangular, circular, hexagonal, or an irregular shape. In some embodiments, the cross-sectional shape of the elastic element 1622 along the direction perpendicular to the thickness direction of the elastic element 1622 may be the same as the cross-sectional shape of the mass element 1621 along the direction perpendicular to the thickness direction of the mass element 1621. In other embodiments, the cross-sectional shape of the elastic element 1622 along the direction perpendicular to the thickness direction of the elastic element 1622 may be different from the cross-sectional shape of the mass element 1621 along the direction perpendicular to the thickness direction of the mass element 1621.

In some embodiments, a height of the first acoustic cavity 1624 may be equal to a thickness of the support frame 1623. In other embodiments, the height of the first acoustic cavity 1624 may be less than the thickness of the support frame 1623.

In some embodiments, the support frame 1623 may include a ring structure. The support frame 1623 including ring structure may be that the support frame 1623 may be the ring structure (as shown in FIG. 13), or that the support frame 1623 may include the ring structure and a bottom plate (see FIG. 15 and related descriptions thereof), or that the support frame 1623 may include the ring structure and other structures. When the support frame 1623 includes the ring structure, the first acoustic cavity 1624 may be located in a hollow part of the ring structure, and the elastic element 1622 may be arranged above the ring structure and close the hollow part of the ring structure to form a first acoustic cavity 1624.

It can be understood that the ring structure may include a circular ring structure, a triangular ring structure, a rectangular ring structure, a hexagonal ring structure, an irregular ring structure, or the like. In the present disclosure, the ring structure may include an inner edge and an outer edge surrounding the inner edge. A shape of the inner edge and a shape of the outer edge of the ring may be the same. For example, the inner edge and the outer edge of the ring structure may be circular, and then the ring structure may be the ring structure; as another example, the inner edge and the outer edge of the ring structure may be hexagonal, and then the ring structure may be a hexagonal ring. The shape of the inner edge and the shape of the outer edge of the ring structure may be different. For example, the inner edge of the ring structure may be circular, and the outer edge of the ring structure may be rectangular.

The cross-sectional area of the mass element 1621 along the direction perpendicular to the thickness direction of the mass element 1621 being greater than the cross-sectional area of the first acoustic cavity 1624 along the direction perpendicular to the height direction of the first acoustic cavity 1624 can be understood that the mass element 1621 may completely cover an upper opening (as shown in FIG. 13) of the first acoustic cavity 1624. The cross-sectional area of the elastic element 1622 along the direction perpendicular to the thickness direction of the elastic element 1622 being greater than the cross-sectional area of the first acoustic cavity 1624 along the direction perpendicular to the height direction of first acoustic cavity 1624 can be understood as that the mass element 1621 and the elastic element 1622 may completely cover the upper opening (as shown in FIG. 13) of the first acoustic cavity 1624. Through the design of the cross-sectional area of the mass element 1621 along the direction perpendicular to the thickness direction of the mass element 1621, the cross-sectional area of the mass element 1621 along the direction perpendicular to the thickness direction of the mass element 1621, and the cross-sectional area of the elastic element 1622 along the direction perpendicular to the thickness direction of the elastic element 1622, a deformation region of a vibration component 1620 may be the contact region of the elastic element 1622 and the support frame 1623.

In some embodiments, the outer edge of the mass element 1621 and the outer edge of the elastic element 1622 may both be located on the support frame 1623. Merely by way of example, when the support frame 1623 includes the ring structure, the outer edge of the mass element 1621 and the outer edge of the elastic element 1622 may both be located on an upper surface of the ring structure, or the outer edge of the mass element 1621 and the outer edge of the elastic element 1622 may be flush with an outer ring of the ring structure. In some embodiments, the outer edge of the mass element 1621 and the outer edge of the elastic element 1622 may both be located on an outer side of the support frame 1623. For example, when the support frame 1623 includes the ring structure, the outer edge of the mass element 1621 and the outer edge of the elastic element 1622 may both be located on an outer side of the outer ring of the ring structure.

In some embodiments, when the support frame 1623 is the ring structure, the cross-sectional area of the mass element 1621 along the direction perpendicular to the thickness direction of the mass element 1621 may be greater than a cross-sectional area of the outer ring of the ring structure along the direction perpendicular to the height direction of the first acoustic cavity 1624, and the cross-sectional area of the elastic element 1622 along the direction perpendicular to the thickness direction of the elastic element 1622 may be greater than the cross-sectional area of the outer ring of the ring structure along the direction perpendicular to the height direction of the first acoustic cavity 1624. In some embodiments, the cross-sectional area of the mass element 1621 along the direction perpendicular to the thickness direction of the mass element 1621 may be equal to the cross-sectional area of the outer ring of the ring structure along the direction perpendicular to the height direction of the first acoustic cavity 1624, and the cross-sectional area of the elastic element 1622 along the direction perpendicular to the thickness direction of the elastic element 1622 may be equal to the cross-sectional area of the outer ring of the ring structure along the direction perpendicular to the height direction of the first acoustic cavity 1624.

In some embodiments, a difference between inner and outer diameters of the ring structure may be greater than a first difference threshold (e.g., 1 μm). In some embodiments, the difference between the inner and outer diameters of the ring structure may be less than a second difference threshold (e.g., 300 um). For example, the difference between the inner and outer diameters of the ring structure may be in a range of 1 μm-300 μm. As another example, the difference between the inner and outer diameters of the ring structure may be in a range of 5 μm-1600 μm. As another example, the difference between the inner and outer diameters of the ring structure may be in a range of 10 μm-100 μm. By limiting the difference between the inner and outer diameters of the ring structure, an area of a contact region of the elastic element 1622 and the support frame 1623 may be defined. Therefore, the sensitivity of the vibration sensor may be improved by setting the difference between the inner and outer diameters of the ring structure in the above range.

A relationship of size between the cross-sectional area of the mass element 1621 along the direction perpendicular to the thickness direction of the mass element 1621 and the cross-sectional area of the outer ring of the ring structure along the direction perpendicular to the height direction of the first acoustic cavity 1624, and a relationship of size between the cross-sectional area of the elastic element 1622 along the direction perpendicular to the thickness direction of the elastic element 1622 and the cross-sectional area of the outer ring of the ring structure along the direction perpendicular to the height direction of the first acoustic cavity 1624 may change a size of the contact region the elastic element 1622 and the support frame 1623, thereby changing an area of a compressive deformation region. The size of the area may affect an equivalent stiffness of the vibration component 1620, thereby affecting a resonant frequency of the vibration component 1620. The equivalent stiffness of the vibration component 1620 may be adjusted by adjusting the size of the area of the compressive deformation region, thereby adjusting the resonant frequency of the vibration component 1620, and improving the sensitivity of the vibration sensor 1600.

In some embodiments, for the convenience of processing, the cross-sectional area of the mass element 1621 along the direction perpendicular to the thickness direction of the mass element 1621 may be substantially equal to the cross-sectional area of the elastic element 1622 along the direction perpendicular to the thickness direction of the elastic element 1622. With such an arrangement, the mass element 1621 and the elastic element 1622 may be cut together during processing, thereby improving production efficiency.

Figure 15:
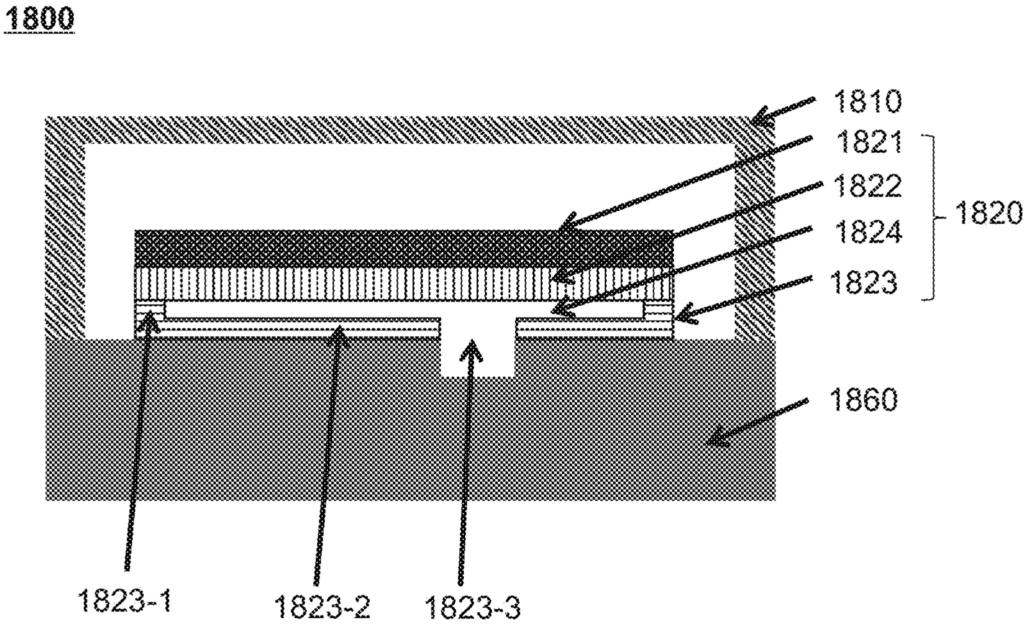
FIG. 15 is a schematic diagram illustrating a structure of a vibration sensor according to some embodiments of the present disclosure.

FIG. 15 is a schematic diagram illustrating a structure of a vibration sensor according to some embodiments of the present disclosure. As shown in FIG. 15, a vibration sensor 1800 may include a housing 1810, a vibration component 1820, and an acoustic transducer 1860. The vibration component 1820 may include a mass element 1821, an elastic element 1822, and a support frame 1823. The elastic element 1822, the support frame 1823 and the acoustic transducer 1860 may form a first acoustic cavity 1824. An arrangement, a size, a shape, etc. of the components in FIG. 15 may be similar to the components of the vibration sensor 1600 shown in FIG. 13. As shown in FIG. 15, the support frame 1823 of the vibration sensor 1800 may include a ring structure 1823-1 and a bottom plate 1823-2, and the ring structure 1823-1 may be located on the bottom plate 1823-2. A through hole 1823-3 may be arranged on the bottom plate 1823-2 and configured to be spatially connected to a sound pickup hole, so that the first acoustic cavity 1824 may be in acoustic connection with the acoustic transducer 1860. In some embodiments, the ring structure 1823-1 and the bottom plate 1823-2 may be an integrated structure, and the ring structure 1823-1 and the bottom plate 1823-2 may be manufactured by stamping.

It should be noted that the first hole part 1630, the second hole part, and the third hole part in FIG. 13 may be applied to the vibration sensor 1800 shown in FIG. 15, which is not repeated here.

Figure 16:
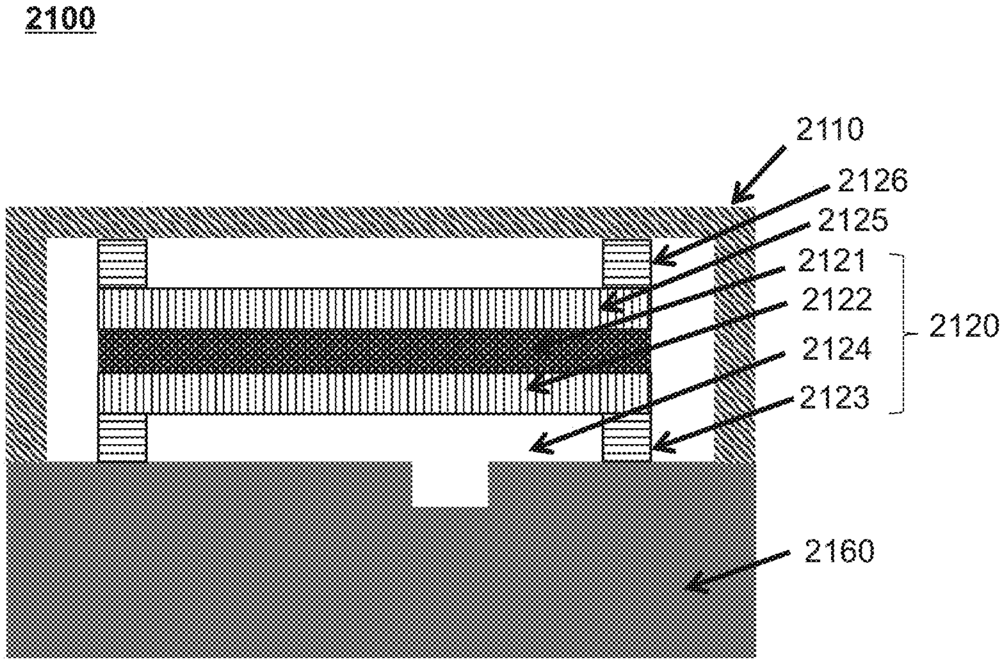
FIG. 16 is a schematic diagram illustrating a structure of a vibration sensor according to some embodiments of the present disclosure.

FIG. 16 is a schematic diagram illustrating a structure of a vibration sensor according to some embodiments of the present disclosure. As shown in FIG. 16, a vibration sensor 2100 may include a housing 2110, a vibration component 2120, and an acoustic transducer 2160. The vibration component 2120 may include a mass element 2121, an elastic element 2122, and a support frame 2123. The elastic element 2122, the support frame 2123, and the acoustic transducer 2160 may form a first acoustic cavity 2124. An arrangement, a size, a shape, etc. of the components in FIG. 16 may be similar to the components of the vibration sensor 1600 shown in FIG. 13. The vibration component 2120 may also include another elastic element 2125 and another support frame 2126. The other elastic element 2125 may be physically connected to a side of the mass element 2121 away from the elastic element 2122, and the other support frame 2126 may be physically connected to a side of the other elastic element 2125 away from the mass element 2121. That is to say, the other support frame 2126 and the mass element 2121 may be physically connected to the two sides of the other elastic element 2125 respectively. The other support frame 2126 may be physically connected to the housing 2110. By setting the other support frame 2126 and the other elastic element 2125, a transverse sensitivity of the vibration sensor 2100 may be reduced, and a longitudinal sensitivity of the vibration sensor 2100 may be increased, thereby improving the direction selectivity of the sensitivity. The other elastic element 2125 may be similar in material and arrangement to the elastic element 222 shown in FIG. 2, and the other support frame 2126 may be similar in material to the support frame 223 shown in FIG. 2. A structure of the support frame 2123 and a structure of the other support frame 2126 may be the same or different. For example, both the support frame 2123 and the other support frame 2126 may be ring structures. As another example, the support frame 2123 may include a bottom plate and the ring structure, while the other support frame 2126 may be the ring structure.

In some embodiments, a cross-sectional area of the other elastic element 2125 along a direction perpendicular to a thickness direction of the other elastic element 2125 may be exactly the same as a cross-sectional area of the elastic element 2122 along a direction perpendicular to a thickness direction of the elastic element 2122. In some embodiments, a cross-sectional shape of the other elastic element 2125 along the direction perpendicular to the thickness direction of the other elastic element 2125 may be the same as a cross-sectional shape of the elastic element 2122 along the direction perpendicular to the thickness direction of the elastic element 2122, and the cross-sectional areas may be slightly different.

In some embodiments, the other elastic element 2125 and the elastic element 2122 may be symmetrically arranged with respect to the mass element 2121. The symmetrical arrangement can be understood as positions of the elastic element 2122 and the other elastic element 2125 may be located on both sides of the mass element 2121, a thickness of the elastic element 2122 may be the same as a thickness of the other elastic element 2125, and the cross-sectional area of the elastic element 2122 along the direction perpendicular to the thickness direction of the elastic element 2122 may be the same as the cross-sectional area of the other elastic element 2125 along the direction perpendicular to the thickness direction of the other elastic element 2125. As shown in FIG. 16, the other elastic element 2125 and the elastic element 2122 may be respectively fixed on the upper and lower surfaces of the mass element.

In some embodiments, the vibration component 2120 may further include a first hole part (not shown in the figure), and the first acoustic cavity 2124 may be spatially connected to other acoustic cavities through the first hole part. In some embodiments, the first hole part may include at least three hole parts (not shown in the figure). The three hole parts may be respectively arranged on the elastic element 2122, the mass element 2122, and the elastic element 2125, so that the first acoustic cavity 2124 may be spatially connected to the other acoustic cavities of the plurality of acoustic cavities. The descriptions regarding the first hole part may be found in the relevant descriptions in FIG. 24 and FIG. 25, which are not repeated here. In some embodiments, the vibration component may also be made of a gas-permeable material. For example, in some embodiments, a material of the mass element 2121 may be the same as a material of the elastic element 2122, and both the mass element 2121 and the elastic element 2122 may be made of the gas-permeable material. In some embodiments, the material of the mass element 2121 may be different from the material of the elastic element 2122. For example, the elastic element 2122 may be made of the gas-permeable material, and the mass element 2121 may be made of a hard material (e.g., iron, copper, silicon, etc.).

In some embodiments, a second hole part (not shown in the figure) may be arranged on the housing 2110, and the first acoustic cavity 2124, the other acoustic cavities of the plurality of acoustic cavities and the acoustic transducer may be spatially connected to the outside through the second hole part. During the assembly process of the vibration sensor 2100, the second hole part may deliver gas inside the housing 2110 to the outside. In this way, by setting the second hole part, when the elastic element 2122, the mass element 2121, and the acoustic transducer are assembled, the failure of the elastic element 2122 and the acoustic transducer due to an excessive air pressure difference between inner and outer spaces of the housing 2110 may be avoided, thereby reducing the difficulty of assembling the vibration sensor 2100. In some embodiments, air conduction sound in the environment may affect the use performance of the vibration sensor 2100. In order to reduce the impact of the air conduction sound in the environment, after the vibration sensor 2100 is prepared or before the vibration sensor 2100 is applied to an electronic device, the second hole part may be sealed with a sealing material, so as not to affect the performance of the vibration sensor 2100. In some embodiments, the second hole part may be blocked by means of using a sealant, bonding of a sealing tape, adding a sealing plug, or the like. The descriptions regarding the second hole part may be found in the relevant descriptions in FIG. 2, which is not repeated here.

In some embodiments, a third hole part (not shown in the figure) may be arranged on the housing 2110. The third hole part may enable the external environment and the acoustic cavity inside the housing 2110 to be spatially connected, thereby reducing the vibration resistance of the elastic element 2122, and improving the sensitivity of the vibration sensor 2100. The descriptions regarding the third hole part may be found in the relevant descriptions in FIG. 2, which is not repeated here.

Figure 17:
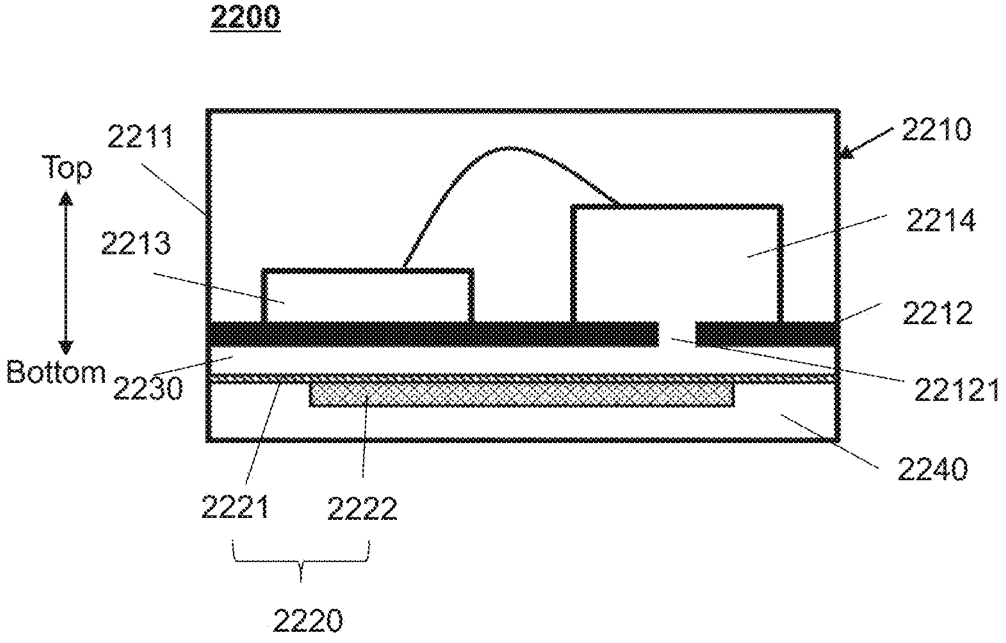
FIG. 17 is a schematic diagram illustrating a structure of a vibration sensor according to some embodiments of the present disclosure.

FIG. 17 is a schematic diagram illustrating a structure of a vibration sensor according to some embodiments of the present disclosure. As shown in FIG. 17, the vibration sensor 2200 may include an acoustic transducer 2210 and a resonant system. In some embodiments, the acoustic transducer 2210 may be accommodated in a space formed by a housing 2211 and a substrate (PCB) 2212. The acoustic transducer 2210 may include a processor 2213 and a sensing element 2214. The housing 2211 may be a regular or irregular three-dimensional structure with a cavity (i.e., a hollow part) inside, e.g., a hollow frame structure, including but not limited to regular shapes such as a rectangular frame, a circular frame, and a regular polygonal frame, and any irregular shapes. The processor 2213 may obtain an electrical signal from the sensing element 2214 and perform signal processing. In some embodiments, the signal processing may include frequency modulation processing, amplitude modulation processing, filtering processing, noise reduction processing, or the like. In some embodiments, the processor 2213 may include a microcontroller, a microprocessor, an application-specific integrated circuit (ASIC), an application-specific instruction set processor (ASIP), a central processing unit (CPU), a physical processing unit (PPU), a digital signal processor (DSP), a field programmable gate array (FPGA), an advanced reduced instruction set computer (ARM), a programmable logic device (PLD), or other types of processing circuits or processors.

In some embodiments, the sensing element 2214 and the processor 2213 may be respectively connected to an upper surface of the substrate 2212. The substrate 2212 may be located in the cavity inside the housing 2211. The housing 2211 may seal the sensing element 2214, the processor 2213, the substrate 2212, and circuits and other components thereon. The substrate 2212 may separate the cavity inside the housing 2211 into an upper chamber and a lower chamber. In some embodiments, the sensing element 2214 and the processor 2213 may be fixedly connected to the substrate 2212 through a sensing element fixing adhesive and a processor fixing adhesive, respectively. In some embodiments, the sensing element fixing adhesive or the processor fixing adhesive may be a conductive adhesive (e.g., a conductive silver adhesive, a copper powder conductive adhesive, a nickel carbon conductive adhesive, a silver copper conductive adhesive, etc.). In some embodiments, the conductive adhesive may be one or more of conductive glue, a conductive adhesive film, a conductive rubber ring, a conductive tape, or the like. The sensing element 2214 or the processor 2213 may be electrically connected to the other components through the circuits arranged on the substrate 2212. The sensing element 2214 and the processor 2213 may be directly connected by a wire (e.g., a gold wire, a copper wire, an aluminum wire, etc.).

The resonant system may be located in a chamber corresponding to a lower surface of the substrate 2212. In some embodiments, the resonant system may include a vibration component 2220. The vibration component 2220 may generate vibrations in response to vibrations of the housing 2211, so that the vibration sensor 2200 may form a second resonant frequency less than a first resonant frequency corresponding to the sensor in a specific frequency range (e.g., a human voice frequency range), thereby improving the sensitivity of the sensor device 2200 in the specific frequency range.

In some embodiments, the vibration component 2220 may include at least an elastic element 2221 and a mass element 2222. The elastic element 2221 may be connected to the housing 2211 through a peripheral side of the elastic element 2221. For example, the elastic element 2221 may be connected to an inner wall of the housing 220 by means of gluing, clamping, or the like. The mass element 2222 may be arranged on the elastic element 2221. Specifically, the mass element 2222 may be arranged on an upper surface or a lower surface of the elastic element 2221. The upper surface of the elastic element 2221 refers to a side of the elastic element 2221 facing the substrate 2212, and the lower surface of the elastic element 2221 refers to a side of the elastic element 2221 away from the substrate 2212. In some embodiments, there may be a plurality of mass elements 2222 which may be located on the upper surface or the lower surface of the elastic element 2221 simultaneously. In some embodiments, part of the plurality of mass elements 2222 may be located on the upper surface of the elastic element 2221, and another part of the mass elements 2222 may be located on the lower surface of the elastic element 2221. In some implementations, the mass element 2222 may also be embedded in the elastic element 2221.

In some embodiments, a first acoustic cavity 2230 may be formed between the elastic element 2221 and the acoustic transducer 2210. Specifically, the upper surface of the elastic element 2221, the substrate 2212 and the housing 2211 may define the first acoustic cavity 2230, and the lower surface of the elastic element 2221 and the housing 2211 may define a second acoustic cavity 2240. In the embodiments of the present disclosure, by introducing the resonant system on the basis of the acoustic transducer 2210, the second resonant frequency provided by the resonant system may make the vibration sensor 2200 generate a new resonant peak (e.g., the second resonant peak) in other frequency bands (e.g., near the second resonant frequency) different from the first resonant frequency of the acoustic transducer 2210, so that the vibration sensor 2200 may have a higher sensitivity in a wider frequency range than the sensor. In some embodiments, the second resonant frequency may be adjusted by adjusting mechanical parameters (e.g., stiffness, mass, damping, etc.) of the resonant system, so that the sensitivity of the vibration sensor 2200 may be adjusted. It should be noted that a comparison of the sensitivity of the vibration sensor with the sensitivity of the acoustic transducer 2210 in the embodiments of the present disclosure can be understood as a comparison of the sensitivity of the acoustic transducer 2210 after the introduction of the resonant system and before the introduction of the resonant system.

In this embodiment, the elastic element 2221 may provide stiffness and damping to the resonant system, and the mass element 2222 may provide mass and damping to the resonant system. A combination of the elastic element 2221 and the mass element 2222 may be equivalent to a spring-mass-damper system, thus forming the resonant system. Therefore, the stiffness, the mass and damping of the resonant system may be adjusted by adjusting a structure and a material of the elastic element 2221 or the mass element 2222, so that the second resonant frequency provided by the resonant system may be adjusted, and the vibration sensor may generate the new resonant peak in a desired frequency range (e.g., near the second resonant frequency), thereby improving the sensitivity. In this way, the vibration sensor 2200 may also have a relatively high sensitivity to a part of an external signal of which a frequency is not near the first resonant frequency of the acoustic transducer 2210.

Further, the sensitivity of the vibration sensor 2200 may be related to the stiffness of the elastic element 2221, the mass of the mass element 2222, and a space volume of a cavity between the elastic element 2221 and the acoustic transducer 2210 (i.e., the first acoustic cavity 2230). In some embodiments, the smaller the stiffness of the elastic element 2221, the larger the mass of the mass element 2222 or the smaller the spatial volume of the first acoustic cavity 2230, and the higher the sensitivity of the vibration sensor.

In some embodiments, the vibration sensor 2200 may obtain an ideal frequency response by adjusting the mechanical parameters (e.g., a material, a size, a shape, etc.) of the mass element 2222, so that the resonant frequency and the sensitivity of the vibration sensor 2200 may be adjusted, and the reliability of the vibration sensor 2200 may be guaranteed. In some embodiments, the mass element 2222 may be a regular or irregular shape such as a cuboid, a cylinder, a sphere, an ellipsoid, or a triangle.

In some embodiments, the mass element 2222 may be made of a polymer material such as polyurethane (PU), polyamide (PA) (commonly known as nylon), polytetrafluoroethylene (PTFE), and phenol-formaldehyde (PF). An elastic property of the mass element 2222 made of the polymer material may absorb an external impact load, thereby effectively reducing a stress concentration at a connection between the elastic element and the housing of the sensor, and then reducing the possibility of damage to the vibration sensor due to the external impact.

In some embodiments, the stiffness of the elastic element 2221 may be adjusted by adjusting the mechanical parameters of the elastic element 2221 (e.g., Young's modulus, a tensile strength, an elongation, and a shore hardness A), so that the vibration sensor 2200 may obtain a relatively ideal frequency response, and the resonant frequency and the sensitivity of the vibration sensor 2200 may be adjusted. In some embodiments, in order to improve the sensitivity of the vibration sensor 2200 relative to the acoustic transducer 2210, the second resonant frequency provided by the resonant system may be lower than the first resonant frequency of the acoustic transducer 2210. For example, the second resonant frequency may be 1000 Hz-10000 Hz lower than the first resonant frequency, which may improve the sensitivity of the vibration sensor 2200 by 3 dB-30 dB compared with the acoustic transducer 2210.

In some embodiments, the elastic element 2221 may be made of a flexible polymer material. The flexible polymer material may include but is not limited to polyimide (PI), parylene, polydimethylsiloxane (PDMS), hydrogel, etc. In some embodiments, the elastic element 2221 may also be made of an inorganic rigid material. The inorganic rigid material may include but is not limited to silicon (Si), silicon dioxide ($SiO_2$), and other semiconductor materials, or copper, aluminum, steel, gold, and other metal materials.

In some embodiments, in order to facilitate the adjustment of the mechanical parameters of the elastic element and realize the adjustment of the stiffness of the resonant system, so that a frequency response curve of the vibration sensor has a relatively good frequency response, and the resonant frequency and the sensitivity of the vibration sensor are improved, the elastic element may also be a multi-layer composite film structure. In some embodiments, the elastic element may include at least two-layer films. Stiffnesses of the at least two-layer films in the multi-layer composite film structure may be different.

In some embodiments, the vibration component 2220 may further include a first hole part (not shown in the figure), and the first acoustic cavity 2230 may be spatially connected to other acoustic cavities through the first hole part. In some embodiments, the first hole part may include a first sub-hole part (not shown in the figure). The first sub-hole part may be arranged in a region on the elastic element 2221 not covered by the mass element 2222, so that the first acoustic cavity 2230 may be spatially connected to the other acoustic cavities of the plurality of acoustic cavities. In some embodiments, hole parts may also be arranged on both the elastic element 2221 and the mass element 2222, so that the first acoustic cavity 2230 may be spatially connected to the other acoustic cavities of the plurality of acoustic cavities. For example, the first hole part may include the first sub-hole part and a second sub-hole part (not shown in the figure). The first sub-hole part may be arranged on the elastic element 2221, and the second sub-hole part may be located on the mass element 2222. The first sub-hole part may be spatially connected to the second sub-hole part. In some embodiments, a size of the first sub-hole part and a size of the second sub-hole part may be the same or different. The descriptions regarding the first hole part may be found in the relevant descriptions in FIG. 24 and FIG. 25, which are not repeated here. In some embodiments, the vibration component may also be made of a gas-permeable material. For example, in some embodiments, a material of the mass element 2222 may be the same material as a material of the elastic element 2221, and both the mass element 2222 and the elastic element 2221 may be made of the gas-permeable material. In some embodiments, the material of the mass element 2222 may be different from the material of the elastic element 2221. For example, the elastic element 2221 may be made of the gas-permeable material, and the mass element 2222 may be made of a hard material (e.g., iron, copper, silicon, etc.).

In some embodiments, a second hole part (not shown in the figure) may be arranged on the housing 2211, and the first acoustic cavity 2230, the other acoustic cavities of the plurality of acoustic cavities and the acoustic transducer may be spatially connected to the outside through the second hole part. During the assembly process of the vibration sensor 2200, the second hole part may deliver gas inside the housing 2230 to the outside. In this way, by setting the second hole part, when the vibration component 2220 and the acoustic transducer are assembled, failure of the elastic element 2221 and the acoustic transducer due to an excessive air pressure difference between inner and outer spaces of the housing 2230 may be avoided, thereby reducing the difficulty of assembling the vibration sensor 2200. In some embodiments, air conduction sound in the environment may affect the use performance of the vibration sensor 2200. In order to reduce the impact of the air conduction sound in the environment, after the vibration sensor 2200 is prepared or before the vibration sensor 2200 is applied to an electronic device, the second hole part may be sealed with a sealing material, so as not to affect the performance of the vibration sensor 2200. In some embodiments, the second hole part may be blocked by means of using a sealant, bonding of a sealing tape, adding a sealing plug, or the like. The descriptions regarding the second hole part may be found in the relevant descriptions in FIG. 2, which is not repeated here.

In some embodiments, a third hole part (not shown in the figure) may be arranged on the housing 2211. The third hole part may enable the external environment and the acoustic cavity inside the housing 2211 to be spatially connected, thereby reducing the vibration resistance of the elastic element 2221, and improving the sensitivity of the vibration sensor 2200. The descriptions regarding the third hole part may be found in the relevant descriptions in FIG. 2, which is not repeated here.

Figure 18:
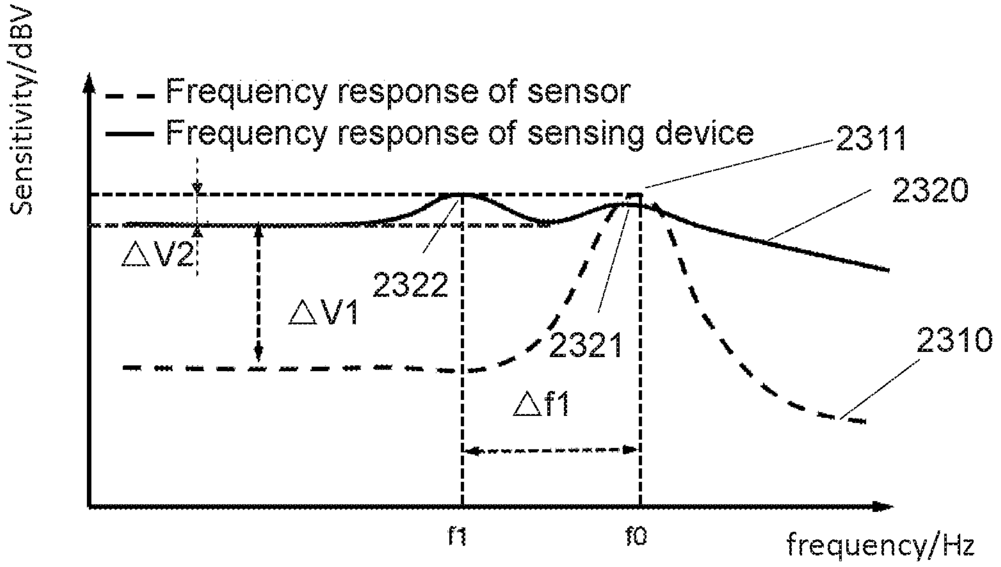
FIG. 18 is schematic diagrams each of which illustrates exemplary frequency response curves of a vibration sensor according to some embodiments of the present disclosure.
Figure 18:
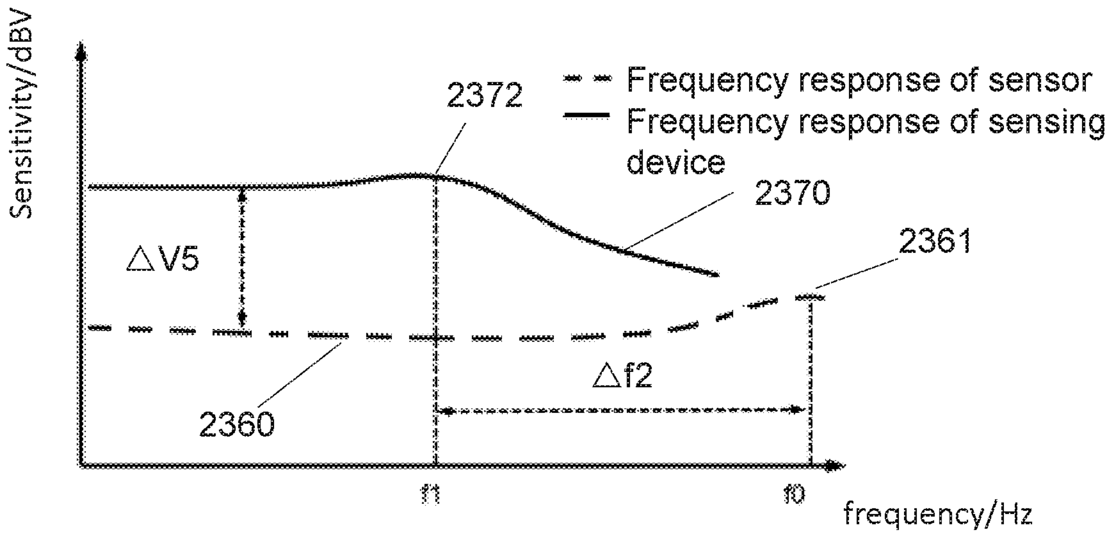

Drawing (a) in FIG. 18 is a schematic diagram illustrating exemplary frequency response curves of a vibration sensor according to some embodiments of the present disclosure. As shown in drawing (a) in FIG. 18, a frequency response curve 2310 indicated by dotted lines is a frequency response curve of a sensor, and a frequency response curve 2320 indicated by solid lines is a frequency response curve of a sensing device. An abscissa represents a frequency in Hertz Hz, and an ordinate represents a sensitivity in dBV. A frequency response curve 2310 may include a resonant peak 2311 corresponding to a resonant frequency of the sensor. A frequency response curve 2320 may include a first resonant peak 2321 and a second resonant peak 2322. For the sensing device, a frequency corresponding to the first resonant peak 2321 may be a first resonant frequency, the second resonant peak 2322 may be formed by an action of a resonant system, and a frequency corresponding to the second resonant peak 2322 may be a second resonant frequency.

It should be noted that the second resonant peak 2322 shown in the figure may be on a left side of the first resonant peak 2321, i.e., the frequency corresponding to the second resonant peak 2322 may be less than the frequency corresponding to the first resonant peak. In some embodiments, the frequency (i.e., the first resonant frequency) corresponding to the second resonant peak 2322 may be greater than the frequency (i.e., the second resonant frequency) corresponding to the first resonant peak 2321 by changing mechanical parameters of an acoustic transducer 2210 or a vibration component 2220, i.e., the second resonant peak 2322 may be on a right side of the first resonant peak 2321. In some embodiments, when the resonant system includes the vibration component composed of an elastic element and a mass element, the second resonant peak 2322 may be on the left side of the first resonant peak 2321, i.e., the second resonant frequency may be lower than the first resonant frequency. For example, in some embodiments, a difference between the second resonant frequency and the first resonant frequency may be in a range of 200 Hz-15000 Hz. For another example, in some embodiments, the difference between the second resonant frequency and the first resonant frequency may be in a range of 1000 Hz-8000 Hz. As another example, in some embodiments, the difference between the second resonant frequency and the first resonant frequency may be in a range of 2000 Hz-6000 Hz. In some embodiments, a position of the second resonant peak 2322 may be related to mechanical parameters of the elastic element (e.g., the elastic element 2221 shown in FIG. 17) or the mass element (e.g., the mass element 2222 shown in FIG. 17). For example, the greater the mass of the mass element, the smaller the second resonant frequency, and the second resonant peak 2322 may shift to a low frequency, or the better an elasticity of the elastic element, the greater the second resonant frequency, and the second resonant peak 2322 may shift to a high frequency. In some embodiments, for the sensing device filled with liquid as a resonant system, the second resonant peak 2322 may be on the left side of the first resonant peak 2321, and the position may be related to properties (e.g., a density, a kinematic viscosity, a volume, etc.) of the filled liquid and properties of the elastic element. As the density of the liquid decreases or the kinematic viscosity increases, the resonant peak may shift to a high frequency.

In some embodiments, the frequency corresponding to the resonant peak 2311 may be in a range of 100 Hz-18000 Hz. In some embodiments, the frequency corresponding to the resonant peak 2311 may be in a range of 100 Hz-10000 Hz. In some embodiments, the frequency corresponding to the resonant peak 2311 may be in a range of 500 Hz-10000 Hz. In some embodiments, the frequency corresponding to the resonant peak 2311 may be in a range of 1000 Hz-7000 Hz. In some embodiments, the frequency corresponding to the resonant peak 2311 may be in a range of 1500 Hz-5000 Hz. In some embodiments, the frequency corresponding to the resonant peak 2311 may be in a range of 2000 Hz-5000 Hz. In some embodiments, the frequency corresponding to the resonant peak 2311 may be in a range of 2000 Hz-4000 Hz. In some embodiments, the frequency corresponding to the resonant peak 2311 may be in a range of 3000 Hz-4000 Hz.

In some embodiments, the frequency (i.e., the first resonant frequency) corresponding to the first resonant peak 2321 and the resonant frequency corresponding to the resonant peak 2311 may be the same. For example, when the resonant system includes the vibration component formed by a combination of the elastic element and the mass element, the resonant system may have little effect on a stiffness, a mass, and a damping of the sensor, and the first resonant frequency of the sensor of the sensing device may not change relative to the resonant frequency (i.e., the resonant frequency corresponding to the resonant peak 2311) of the sensor.

In some embodiments, the frequency corresponding to the first resonant peak 2321 may be in a range of 100 Hz-18000 Hz. In some embodiments, the frequency corresponding to the first resonant peak 2321 may be in a range of 500 Hz-10000 Hz. In some embodiments, the frequency corresponding to the first resonant peak 2321 may be in a range of 1000 Hz-10000 Hz. In some embodiments, the frequency corresponding to the first resonant peak 2321 may be in a range of 1500 Hz-7000 Hz. In some embodiments, the frequency corresponding to the first resonant peak 2321 may be in a range of 1500 Hz-5000 Hz. In some embodiments, the frequency corresponding to the first resonant peak 2321 may be in a range of 2000 Hz-5000 Hz. In some embodiments, the frequency corresponding to the first resonant peak 2321 may be in a range of 2000 Hz-4000 Hz. In some embodiments, the frequency corresponding to the first resonant peak 2321 may be in a range of 3000 Hz-4000 Hz.

In some embodiments, the resonant frequency (the first resonant frequency) corresponding to the first resonant peak 2321 may be different from the resonant frequency corresponding to the resonant peak 2311. For example, for the sensing device filled with liquid in a cavity of the housing, the liquid may act as the resonant system, and since the liquid is incompressible, the stiffness of the system may increase, and the first frequency corresponding to the first resonant peak 2321 may increase relative to the resonant frequency corresponding to the resonant peak 2311, i.e., the first resonant peak 2321 may shift to the right relative to the resonant peak 2311.

In some embodiments, the frequency corresponding to the second resonant peak 2322 may be in a range of 50 Hz-15000 Hz. In some embodiments, the frequency corresponding to the second resonant peak 2322 may be in a range of 50 Hz-10000 Hz. In some embodiments, the frequency corresponding to the second resonant peak 2322 may be in a range of 50 Hz-6000 Hz. In some embodiments, the frequency corresponding to the second resonant peak 2322 may be in a range of 100 Hz-5000 Hz. In some embodiments, the frequency corresponding to the second resonant peak 2322 may be in a range of 500 Hz-5000 Hz. In some embodiments, the frequency corresponding to the second resonant peak 2322 may be in a range of 1000 Hz-5000 Hz. In some embodiments, the frequency corresponding to the second resonant peak 2322 may be in a range of 1000 Hz-5000 Hz. In some embodiments, the frequency corresponding to the second resonant peak 2322 may be in a range of 1000 Hz-2000 Hz. In some embodiments, the frequency corresponding to the second resonant peak 2322 may be in a range of 1500 Hz-2000 Hz. In some embodiments, the two resonant peaks 2321 and 2322 on the frequency response curve 2320 may be relatively flat by adjusting a structure and a material of the sensor and one or more mechanical parameters (e.g., the mass of the mass element 2222, the stiffness of the elastic element 2221, the size of the first acoustic cavity 2230, etc. shown in FIG. 17) of the resonant system, thereby improving the output quality of the sensing device. In some embodiments, a sensitivity difference between a trough between the first resonant peak 2321 corresponding to the first resonant frequency and the second resonant peak 2322 corresponding to the second resonant frequency and a peak value of a higher resonant peak of the first resonant peak 2321 and the second resonant peak 2322 may not be higher than 50 dBV. In some embodiments, the sensitivity difference between the trough between the first resonant peak 2321 corresponding to the first resonant frequency and the second resonant peak 2322 corresponding to the second resonant frequency and the peak value of the higher resonant peak of the first resonant peak 2321 and the second resonant peak 2322 may not be higher than 20 dBV. In some embodiments, the sensitivity difference between the trough between the first resonant peak 2321 corresponding to the first resonant frequency and the second resonant peak 2322 corresponding to the second resonant frequency and the peak value of the higher resonant peak of the first resonant peak 2321 and the second resonant peak 2322 may not be higher than 15 dBV. In some embodiments, the sensitivity difference between the trough between the first resonant peak 2321 corresponding to the first resonant frequency and the second resonant peak 2322 corresponding to the second resonant frequency and the peak value of the higher resonant peak of the first resonant peak 2321 and the second resonant peak 2322 may not be higher than 10 dBV. In some embodiments, the sensitivity difference between the trough between the first resonant peak 2321 corresponding to the first resonant frequency and the second resonant peak 2322 corresponding to the second resonant frequency and the peak value of the higher resonant peak of the first resonant peak 2321 and the second resonant peak 2322 may not be higher than 8 dBV. In some embodiments, the sensitivity difference between the trough between the first resonant peak 2321 corresponding to the first resonant frequency and the second resonant peak 2322 corresponding to the second resonant frequency and the peak value of the higher resonant peak of the first resonant peak 2321 and the second resonant peak 2322 may not be higher than 5 dBV.

Correspondingly, in a specific range, a difference (the first resonant frequency corresponding to the first resonant peak 2321 is represented by $f_0$ (near the resonant peak 2311), the second resonant frequency of the second resonant peak 2322 is represented by $f_1$, and a difference between the resonant frequency corresponding to the first resonant peak 2321 and the resonant frequency corresponding to the second resonant peak 2322 is represented by a frequency difference $\Delta f_1$, i.e., the difference between the first resonant frequency $f_0$ and the second resonant frequency $f_1$) between the resonant frequency corresponding to the first resonant peak 2321 and the resonant frequency corresponding to the second resonant peak 2322 may make a frequency response curve between the resonant peaks 2321 and 2322 relatively flat. In some embodiments, the frequency difference $\Delta f_1$ may be in a range of 200 Hz-15000 Hz, and a ratio of the frequency difference $\Delta f_1$ to $f_0$ may be in a range of 0.03-8. In some embodiments, the frequency difference $\Delta f_1$ may be in a range of 200 Hz-12000 Hz, and the ratio of the frequency difference $\Delta f_1$ to $f_0$ may be in a range of 0.3-6. In some embodiments, the frequency difference $\Delta f_1$ may be in a range of 200 Hz-8000 Hz, and the ratio of the frequency difference $\Delta f_1$ to $f_0$ may be in a range of 0.3-3. In some embodiments, the frequency difference $\Delta f_1$ may be in a range of 200-3000 Hz, and the ratio of the frequency difference $\Delta f_1$ to $f_0$ may be in a range of 0.2-0.7. In some embodiments, the frequency difference $\Delta f_1$ may be in a range of 200-2000 Hz, and the ratio of the frequency difference $\Delta f_1$ to $f_0$ may be in a range of 0.2-0.65. In some embodiments, the frequency difference $\Delta f_1$ may be in a range of 500-2000 Hz, and the ratio of the frequency difference $\Delta f_1$ to $f_0$ may be in a range of 0.25-0.65. In some embodiments, the frequency difference $\Delta f_1$ may be in a range of 500-1500 Hz, and the ratio of the frequency difference $\Delta f_1$ to $f_0$ may be in a range of 0.25-0.6. In some embodiments, the frequency difference $\Delta f_1$ may be in a range of 800-1500 Hz, and the ratio of the frequency difference $\Delta f_1$ to $f_0$ may be in a range of 0.3-0.6. In some embodiments, the frequency difference $\Delta f_1$ may be in a range of 1000-1500 Hz, and the ratio of the frequency difference $\Delta f_1$ to $f_0$ may be in a range of 0.35-0.6.

Continuing to refer to drawing (a) in FIG. 18, compared with the frequency response curve 2310, an increase (i.e., the difference, expressed as $\Delta V_1$) in the sensitivity of the frequency response curve 2320 in a frequency range corresponding to the resonant frequency $f_1$ corresponding to the second resonant peak 2322 may be higher and more stable. In some embodiments, the increase $\Delta V_1$ may be in a range of 10 dBV~60 dBV. In some embodiments, the increase $\Delta V_1$ may be in a range of 10 dBV~50 dBV. In some embodiments, the increase $\Delta V_1$ may be in a range of 15 dBV~50 dBV. In some embodiments, the increase $\Delta V_1$ may be in a range of 15 dBV~40 dBV. In some embodiments, the increase $\Delta V_1$ may be in a range of 20 dBV~40 dBV. In some embodiments, the increase $\Delta V_1$ may be in a range of 25 dBV~40 dBV. In some embodiments, the increase $\Delta V_1$ may be in a range of 30 dBV~40 dBV.

In some embodiments, the resonant system may suppress the resonant peak corresponding to the sensor of the sensing device, so that a Q value at the first resonant peak 2321 of the frequency response curve 2320 may be relatively low, the frequency response curve may be flatter in the desired frequency range (e.g., a low and medium frequency), and a difference (also referred to as a peak-to-valley value, expressed as $\Delta V_2$) between a peak value of a peak and a valley value of a trough of the overall frequency response curve 2320 may be in a certain range. In some embodiments, the peak-to-valley value may not exceed 30 dBV. In some embodiments, the peak-to-valley value may not exceed 20 dBV. In some embodiments, the peak-to-valley value may not exceed 10 dBV. In some embodiments, the peak-to-valley value may not exceed 8 dBV. In some embodiments, the peak-to-valley value may not exceed 5 dBV.

In some embodiments, the frequency response of the sensing device may be described by one or more of the relevant parameters of the curve 2320, such as the peak value and the frequency of the first resonant peak 2321, the peak value and the frequency of the second resonant peak 2322, the Q value, $\Delta f_1$, $\Delta V_1$, $\Delta V_2$, a ratio of $\Delta f_1$ to $f_0$, a ratio of the peak-to-valley value to the peak value of the peak, and a first-order coefficient, a second-order coefficient, a third-order coefficient, etc. of an equation determined by fitting the frequency response curve. In some embodiments, when the resonant system includes a resonant unit, the frequency response of the sensing device may be related to the mechanical parameters (e.g., the mass, the damping, the stiffness, etc.) of the mass element and the elastic element. In some embodiments, when the resonant system is formed from liquid, the frequency response of the sensing device may be related to the properties of the filled liquid or the parameters of the sensor. The properties of the liquid may include, e.g., a liquid density, a liquid kinematic viscosity, a liquid volume, air bubbles, a volume of air bubbles, positions of air bubbles, a count of air bubbles, or the like. The parameters of the sensor may include, e.g., an internal structure, a size, and a stiffness of the housing, a mass of the sensor, or a size, a stiffness, etc. of a sensing element (e.g., a cantilever beam).

Drawing (b) in FIG. 18 is a schematic diagram illustrating exemplary frequency response curves of another vibration sensor according to some embodiments of the present disclosure. As shown in drawing (b) in FIG. 18, a frequency response curve 2360 indicated by dotted lines may be a frequency response curve of a sensor, and a frequency response curve 2370 indicated by solid lines may be a frequency response curve of a sensing device. The frequency response curve 2360 may include a resonant peak 2361 corresponding to a resonant frequency of the sensor. In some embodiments, a relatively high resonant frequency corresponding to the sensor may not be in a desired frequency range (e.g., 100-5000 Hz, 500-7000 Hz, etc.). In some embodiments, the resonant frequency corresponding to the sensor may be in the relatively high-frequency range. For example, in some embodiments, the resonant frequency corresponding to the sensor may be higher than 7000 Hz. In some embodiments, the resonant frequency corresponding to the sensor may be higher than 10000 Hz. In some embodiments, the resonant frequency corresponding to the sensor may be higher than 12000 Hz. In some embodiments, the resonant frequency corresponding to the sensor may be higher than 15000 Hz. Correspondingly, since the sensing device has an additional resonant system, the sensing device may have a relatively high rigidity, so that the sensing device may have a relatively high impact strength and reliability.

The frequency response curve 2370 may include a first resonant peak (not shown in the figure) and a second resonant peak 2372. In some embodiments, a frequency corresponding to the first resonant peak may be similar to or the same as a resonant frequency corresponding to the sensor in the frequency response curve 2360. In some embodiments, the frequency response curve 2370 may be substantially the same as the frequency response curve 2320 in drawing (a) in FIG. 18, except that the first resonant peak may shift to the right. A frequency corresponding to the second resonant peak 2372 may be the same or similar to a frequency range corresponding to the second resonant peak 2322 in drawing (a) in FIG. 18.

In some embodiments, in the desired frequency range (e.g., within 2000 Hz, within 3000 Hz, within 5000 Hz, etc.), a difference between a maximum sensitivity and a minimum sensitivity in the frequency response curve 2370 may be kept in a certain range, so as to ensure the stability of the sensing device. In some embodiments, in the desired frequency range (e.g., the second resonant frequency range), a sensitivity difference between a minimum sensitivity in a frequency range within the second resonant frequency and a peak value of the second resonant peak 2372 corresponding to the second resonant frequency may not be higher than 40 dBV. In some embodiments, in the desired frequency range (e.g., the second resonant frequency range), the sensitivity difference between the minimum sensitivity in the frequency range within the second resonant frequency and the peak value of the second resonant peak 2372 corresponding to the second resonant frequency may not be higher than 30 dBV. In some embodiments, in the desired frequency range (e.g., the second resonant frequency range), the sensitivity difference between the minimum sensitivity in the frequency range within the second resonant frequency and the peak value of the second resonant peak 2372 corresponding to the second resonant frequency may not be higher than 20 dBV. In some embodiments, in the desired frequency range (e.g., the second resonant frequency range), the sensitivity difference between the minimum sensitivity in the frequency range within the second resonant frequency and the peak value of the second resonant peak 2372 corresponding to the second resonant frequency may not be higher than 10 dBV.

In some embodiments, the difference (the frequency of the first resonant peak is represented by $f_0$ (close to the resonant peak 2361), the frequency of the second resonant peak 2372 is represented by $f_1$, and the difference between the resonant frequencies corresponding to the two resonant peaks is represented by a frequency difference Δf2) between the resonant frequency corresponding to the first resonant peak and the resonant frequency corresponding to the second resonant peak 2372 may be in a certain range. In some embodiments, the frequency difference $\Delta f_2$ may be in a range of 200-15000 Hz, and a ratio of the frequency difference $\Delta f_2$ to $f_0$ may be in a range of 0.03-8. In some embodiments, the frequency difference $\Delta f_1$ may be in a range of 200 Hz-12000 Hz, and the ratio of the frequency difference $\Delta f_1$ to $f_0$ may be in a range of 0.3-6. In some embodiments, the frequency difference $\Delta f_1$ may be in a range of 200 Hz-8000 Hz, and the ratio of the frequency difference $\Delta f_1$ to $f_0$ may be in a range of 0.3-3. In some embodiments, the frequency difference $\Delta f_2$ may be in a range of 1000-6000 Hz, and the ratio of the frequency difference $\Delta f_2$ to $f_0$ may be in a range of 0.2-0.65. In some embodiments, the frequency difference $\Delta f_2$ may be in a range of 2000-6000 Hz, and the ratio of the frequency difference $\Delta f_2$ to $f_0$ may be in a range of 0.3-0.65. In some embodiments, the frequency difference $\Delta f_2$ may be in a range of 3000-5000 Hz, and the ratio of the frequency difference $\Delta f_2$ to $f_0$ may be in a range of 0.3-0.5. In some embodiments, the frequency difference $\Delta f_2$ may be in a range of 3000-4000 Hz, and the ratio of the frequency difference $\Delta f_2$ to $f_0$ may be in a range of 0.3-0.4.

Further, compared with the frequency response curve 2360, an increase (i.e., the difference, expressed as $\Delta V_3$) in the sensitivity of the frequency response curve 2370 in a frequency range within the resonant frequency $f_1$ corresponding to the second resonant peak 2372 may be higher and more stable. In some embodiments, the increase $\Delta V_3$ may be in a range of 10 dBV~60 dBV. In some embodiments, the increase $\Delta V_3$ may be in a range of 10 dBV~50 dBV. In some embodiments, the increase $\Delta V_3$ may be in a range of 15 dBV~50 dBV. In some embodiments, the increase $\Delta V_3$ may be in a range of 15 dBV~40 dBV. In some embodiments, the increase $\Delta V_3$ may be in a range of 20 dBV~40 dBV. In some embodiments, the increase $\Delta V_3$ may be in a range of 25 dBV~40 dBV. In some embodiments, the increase $\Delta V_3$ may be in a range of 30 dBV~40 dBV.

In some embodiments, the frequency response of the sensing device 200 may be described by one or more of the relevant parameters of the curve 2370, such as the peak value and the frequency of the primary resonant peak, the peak value and the frequency of the secondary resonant peak, the Q value, $\Delta f_2$, $\Delta V_3$, a ratio of $\Delta f_2$ to $f_0$, a ratio of the maximum sensitivity to the minimum sensitivity in the desired frequency range, and a first-order coefficient, a second-order coefficient, a third-order coefficient, etc. of an equation determined by fitting the frequency response curve. In some embodiments, the frequency response of the sensing device may be related to the properties of the filled liquid or the parameters of the sensor. In some embodiments, in order to obtain an ideal output frequency response (e.g., the frequency response curve 2370) of the sensing device, a range of the parameters (also referred to as frequency influencing factors, including parameters of the vibration component or the sensor) influencing the frequency response may be determined by computer simulation, model experiments, etc., which is the same as or similar to the method described in drawing (a) in FIG. 18 and is not repeated here.

In some embodiments, when the resonant system is formed from liquid, e.g., when the liquid is filled between a plurality of elastic elements as the resonant system, the frequency response of the sensing device may be related to the properties of the filled liquid or the parameters of the sensor and the elastic element. In some embodiments, the properties of the liquid may include, but are not limited to, one or more of a liquid density, a liquid kinematic viscosity, a liquid volume, air bubbles, a volume of air bubbles, positions of air bubbles, count of air bubbles, or the like. In some embodiments, the parameters of the sensor may include, but are not limited to, an internal structure, a size, and a stiffness of the housing, a mass of the sensor, or a size, a stiffness, etc. of the sensing element (e.g., a suspension film). In some embodiments, the parameters of the elastic element may include, but are not limited to, a size, a Young's modulus, a stiffness, a damping, an elongation, a hardness, or the like.

In some embodiments, some factors may be related to the influence of other factors on the frequency response of the sensing device, so that the influence of a parameter pair or a parameter set on the frequency response of the sensing device may be determined in the form of the corresponding parameter pair or parameter set. For example, for the resonant system shown in FIG. 17, when changing a shape of the mass element 2222, the mass and the volume of the mass element 2222 may change, and a contact area with the elastic element 2221 may also change, so that the performance of the sensing device with different parameter pair and parameter set features may be tested by using the shape, the mass and the volume of the mass element, and the contact area (or a ratio of any two parameters, or a product of at least two parameters, etc.) with the elastic element 2221 as the parameter set.

For example, for the sensing device including mass elements of different masses, the greater the mass of the mass elements, the smaller the Q value of the frequency response of the sensing device.

It should be noted that, the above description of the frequency response curve of the sensing device is only an exemplary description, and does not limit the scope of the embodiments. It can be understood that, after understanding the principle of the system, those skilled in the art may make arbitrary adjustments to its structure and composition without departing from this principle. Such variations are within the protection scope of the present disclosure.

In some embodiments, the resonant system may protect the sensing element by reducing the external impact on the sensing element. For example, the resonant system may include an elastic structure (e.g., the elastic element). An elasticity of the elastic structure may absorb an external impact load, reducing the possibility of damage to the sensing device due to the external impact. As another example, the resonant system may also include a mass element made of a polymer material. An elasticity of the mass element made of the polymer material may also absorb the external impact load, thereby effectively reducing a stress concentration at a connection between the elastic element and the housing of the sensor, and reducing the possibility of damage to the sensing device due to the external impact. As another example, if the resonant system is liquid filling in the cavity of the sensor, since the liquid has a viscous effect, and a stiffness of the liquid is much smaller than that of the device material, when the sensing device receives the external impact load (e.g., a bone conduction microphone), an impact reliability of withstanding 10000 g acceleration impact without damage may be required. Specifically, due to the viscous effect of the liquid, part of the impact energy may be absorbed and consumed, so that the impact load on the sensing element may be greatly reduced.

It should be noted that the sensing device in the above embodiments may be regarded as adding the resonant system on the basis of the sensor, and the resonant system may be coupled between the housing of the sensor and the sensing element, where the housing of the sensor may be regarded as the housing of the sensing device. In some other embodiments, the housing configured to accommodate the resonant system may also be a housing structure independent of the housing of the sensor. The housing structure may be connected to the housing of the sensor, and a cavity of the housing structure and a cavity of the housing of the sensor may be spatially connected.

Figure 19:
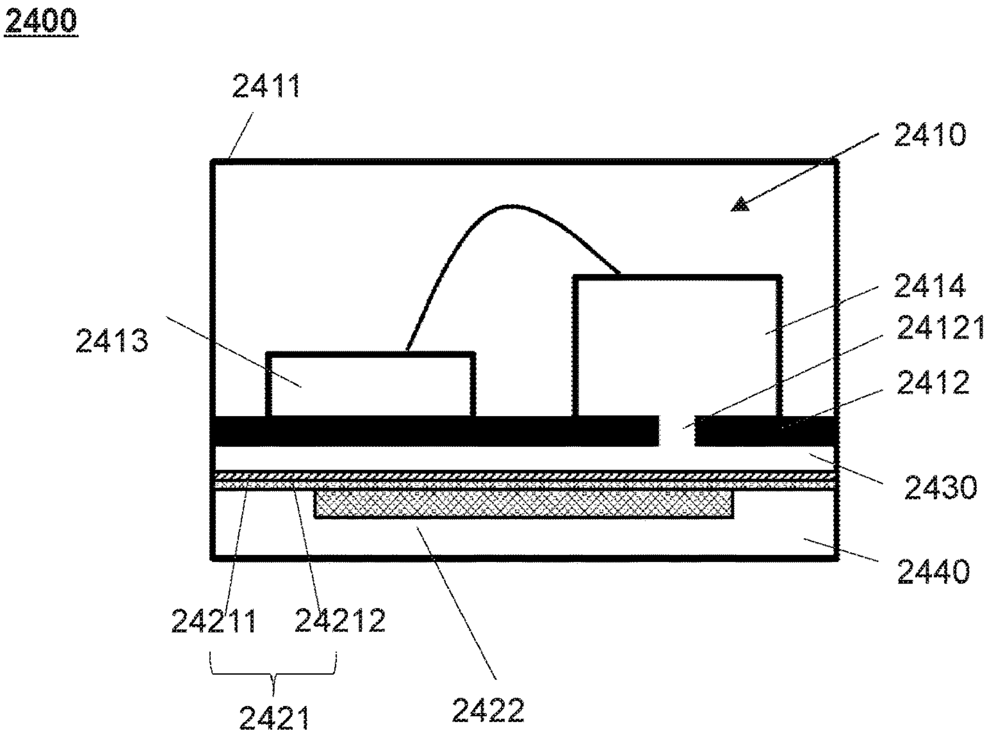
FIG. 19 is a schematic diagram illustrating a structure of a vibration sensor of which an elastic element is a multilayer composite film structure according to some embodiments of the present disclosure.

FIG. 19 is a schematic diagram illustrating a structure of a vibration sensor 2400 of which an elastic element is a multi-layer composite film structure according to some embodiments of the present disclosure. A structure of the vibration sensor 2400 may be substantially the same as that of the vibration sensor 2200 shown in FIG. 17. The difference lies in the difference of the elastic element. A housing 2411, a substrate 2412, a processor 2413, a sensing element 2414, a sound pickup hole 24121, a mass element 2422, a first acoustic cavity 2430, and a second acoustic cavity 2440 shown in FIG. 19 may be respectively similar to the housing 2211, the substrate 2212, the processor 2213, the sensing element 2214, the sound pickup hole 22121, the mass element 2222, the first acoustic cavity 2230, and the second acoustic cavity 2240 shown in FIG. 17, which is not repeated here.

Further, as shown in FIG. 19, an elastic element 2421 may be a multi-layer composite diaphragm, and include a first elastic element 24211 and a second elastic element 24212. In some embodiments, the first elastic element 24211 and the second elastic element 24212 may be made of the same material or different materials. For example, in some embodiments, the first elastic element 24211 and the second elastic element 24212 may be made of the same material (e.g., polyimide). As another example, in some embodiments, one of the first elastic element 24211 and the second elastic element 24212 may be made of a polymer material, and the other of the first elastic element 24211 and the second elastic element 24212 may be made of another polymer material or metal material. In some embodiments, stiffnesses of the first elastic element 24211 and the second elastic element 24212 may be different. For example, the stiffness of the first elastic element 24211 may be greater or less than the stiffness of the second elastic element 24212. In this embodiment, taking the stiffness of the first elastic element 24211 being greater than the stiffness of the second elastic element 24212 as an example, the second elastic element 24212 may provide a required damping to a resonant system, while the stiffness of the first elastic element 24211 may be relatively high, ensuring that the elastic element 2421 may have a high strength, thereby ensuring the reliability of the resonant system and even the entire vibration sensor 2400.

It should be noted that the count of layers of films in the elastic element in FIG. 19 and related descriptions are only for exemplary description, and do not limit the disclosure to the scope of the embodiments. In some embodiments, the elastic element in this embodiment may also include more than two layer films, e.g., three, four, five, or more layer films. Merely by way of example, the elastic element may include a first elastic element, a second elastic element and a third elastic element connected in sequence from top to bottom. A material, mechanical parameters, and a size of the first elastic element may be the same as those of the third elastic element, and a material, mechanical parameters, and a size of the second elastic element may be different from those of the first elastic element or the third elastic element. For example, the stiffness of the first elastic element or the third elastic element may be greater than the stiffness of the second elastic element. In some embodiments, the stability of the vibration sensor 2400 may be guaranteed by adjusting the mechanical parameters of the elastic elements by adjusting the material, the mechanical parameters, the size, etc. of the first elastic element, the second elastic element, or the third elastic element.

By arranging the elastic element 2421 as the multi-layer elastic element, the stiffness of the elastic element 2421 may be adjusted. For example, the stiffness and the damping of the resonant system may be adjusted by increasing or decreasing the count of elastic elements (e.g., the first elastic element 24211 or the second elastic element 24212), thereby adjusting a second resonant frequency, which in turn may make the vibration sensor generate a new resonant peak in a desired frequency range (e.g., near the second resonant frequency), and improve the sensitivity of the vibration sensor in a specific frequency range. In some embodiments, two adjacent layer films (e.g., the first elastic element 24211 and the second elastic element 24212) in the multi-layer composite film structure may form the elastic element 2421 through gluing.

In some embodiments, the stiffness of the elastic element 2421 may be adjusted by adjusting the mechanical parameters (e.g., a material, a Young's modulus, a tensile strength, an elongation, and a hardness shore A) of at least one elastic element (the first elastic element 24211 or the second elastic element 24212) of the elastic element 2421, so that the vibration sensor 2400 may obtain an ideal frequency response, and the resonant frequency and sensitivity of the vibration sensor 2400 may be adjusted. In some embodiments, in order to improve the sensitivity of the vibration sensor 2400 compared with the sensor 2410, the second resonant frequency provided by the resonant system may be lower than a first resonant frequency of the sensor 2410. For example, the second resonant frequency may be 1000 Hz-10000 Hz lower than the first resonant frequency, which may improve the sensitivity of the vibration sensor 2400 by 3 dB-30 dB compared with the sensor 2410.

In some embodiments, one elastic element of the elastic element 2421 may be made of a flexible polymer material. The flexible polymer materials may include but are not limited to polyimide (PI), parylene, Polydimethylsiloxane (PDMS), hydrogel, etc., and the other elastic element of the elastic element 2421 may be made of an inorganic rigid material. The inorganic rigid material may include but is not limited to silicon (Si), dioxide silicon (SiO2) and other semiconductor materials, or copper, aluminum, steel, gold, and other metal materials.

In some embodiments, the sensitivity of the vibration sensor 2400 may also be adjusted by adjusting the mechanical parameters (e.g., a material, a size, a shape, etc.) of the mass element 2422. The descriptions regarding adjusting the sensitivity of the vibration sensor 2400 by adjusting the mechanical parameters of the mass element 2422 may be found in the relevant descriptions in FIG. 17 about adjusting the sensitivity of the vibration sensor 2200 by adjusting the mechanical parameters of the mass element 2222.

In some embodiments, when the parameters (e.g., the Young's modulus, the tensile strength, the hardness, the elongation, etc.) of the elastic element and the volume or the mass of the mass element are constant, an electrical signal output by the vibration sensor may be increased by improving the efficiency of elastic deformation of the elastic element, thereby improving the acoustic-electric conversion effect of the vibration sensor. In some embodiments, the efficiency of the elastic deformation of the elastic element may be improved by reducing a contact area between the mass element and the elastic element, thereby increasing the electrical signal output by the vibration sensor.

It should be noted that, the first hole part, the second hole part, and the third hole part of the vibration sensor 2200 may also be applied to the vibration sensor 2400 shown in FIG. 19, which is not repeated here.

Figure 20:
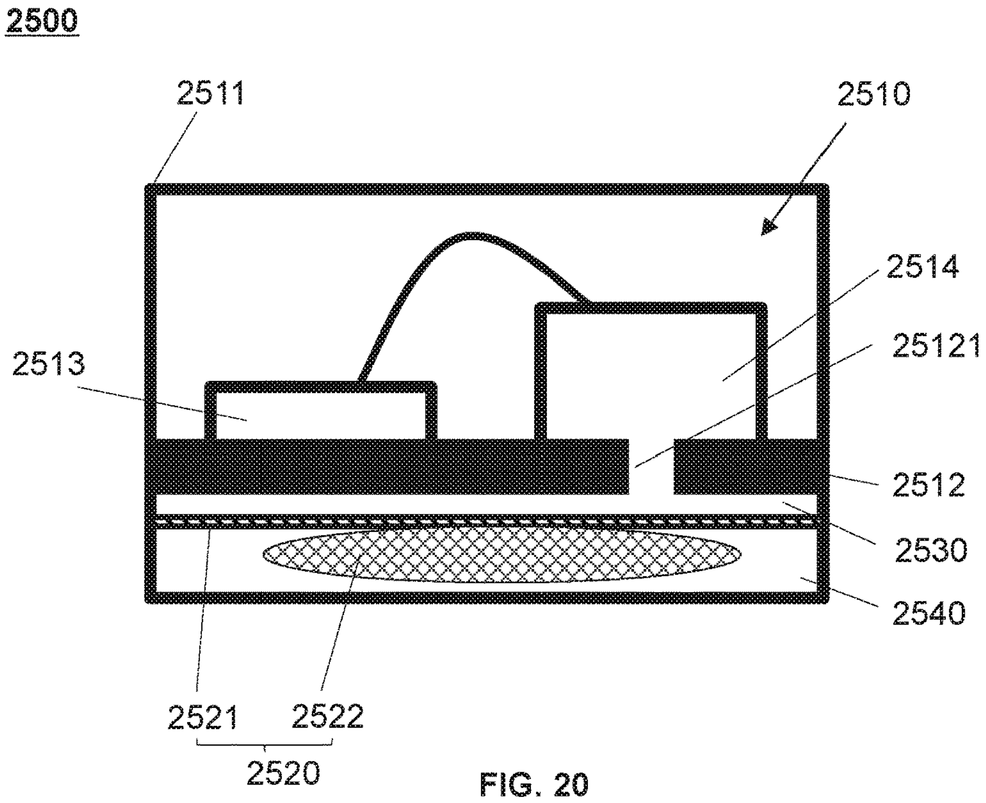
FIG. 20 is a schematic diagram illustrating a structure of a vibration sensor according to some embodiments of the present disclosure.

FIG. 20 is a schematic diagram illustrating a structure of a vibration sensor 2500 according to some embodiments of the present disclosure. A structure of the vibration sensor 2500 may be substantially the same as that of the vibration sensor 2200 shown in FIG. 17 and that of the vibration sensor 2400 shown in FIG. 19. The difference lies in the difference of the mass element. A housing 2511, a substrate 2512, a processor 2513, a sensing element 2514, a sound pickup hole 25121, an elastic element 2521, a first acoustic cavity 2530, and a second acoustic cavity 2540 shown in FIG. 20 may be respectively similar to the housing 2211, the substrate 2212, the processor 2213, the sensing element 2214, the sound pickup hole 22121, the elastic element 2221, the first acoustic cavity 2230, and the second acoustic cavity 2240 shown in FIG. 17. In addition, the structure of the elastic element 2521 may be similar to that of the elastic element 2421 of the vibration sensor 2400 shown in FIG. 19, which is not repeated here.

As shown in FIG. 20, a mass element 2522 may be an ellipsoid, and its contact area with the elastic element 2521 may be smaller than its projection area on the elastic element 2521, ensuring that the mass element 2522 may have a small contact area with the elastic element under the same volume or mass. When vibrations of the housing 220 of the vibration sensor drive the mass element 2522 to generate vibrations, a contact region between the elastic element 2521 and the mass element 2522 may be approximately regarded as not deformed. By reducing the contact region between the elastic element 2521 and the mass element 2522, an area of a region of the elastic element 2521 not in contact with the mass element 2522 may be increased, thereby increasing an area (i.e., the area of the region of the elastic element 2521 not in contact with the mass element 2522) of a deformation region of the elastic element 2521 during a vibration process, increasing an amount of compressed air in the first acoustic cavity 2530, making the sensing element 2514 of the sensor 2510 output a larger electrical signal, and then improving the acoustic-electric conversion effect of the vibration sensor 2500. In some embodiments, the mass element 2522 may also be a trapezoid. A smaller side of the trapezoid may be connected to the elastic element 2521, so that the contact area between the mass element 2522 and the elastic element may be smaller than the projection area of the mass element 2522 on the elastic element 2521. In some embodiments, the mass element 2522 may also be an arch structure. When the mass element 2522 is the arch structure, two arch feet of the arch structure may be connected to an upper surface or a lower surface of the elastic element 2522, a contact area between the two arch feet and the elastic element 2521 may be smaller than the projection area of an arch waist on the elastic element 2521, i.e., the contact area between the mass element 2522 of the arch structure and the elastic element 2521 may be smaller than the projection area of the mass element 2522 on the elastic element 2521. It should be noted that, in this embodiment, any regular or irregular shape or structure that can meet the requirement that the contact area between the mass element 2522 and the elastic element is smaller than the projection area of the mass element 2522 on the elastic element 2521 belongs to the variations of the embodiments of the present disclosure. The present disclosure is not intended to list them all.

It should be noted that, the first hole part, the second hole part, and the third hole part of the vibration sensor 2200 may also be applied to the vibration sensor 2400 shown in FIG. 19, which is not repeated here.

Figure 21:
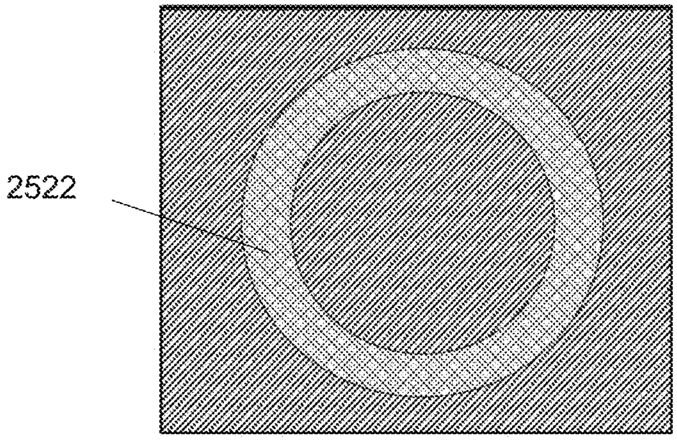
FIG. 21 is a cross-sectional view illustrating a vibration sensor with mass elements of different shapes according to some embodiments of the present disclosure.
Figure 21:
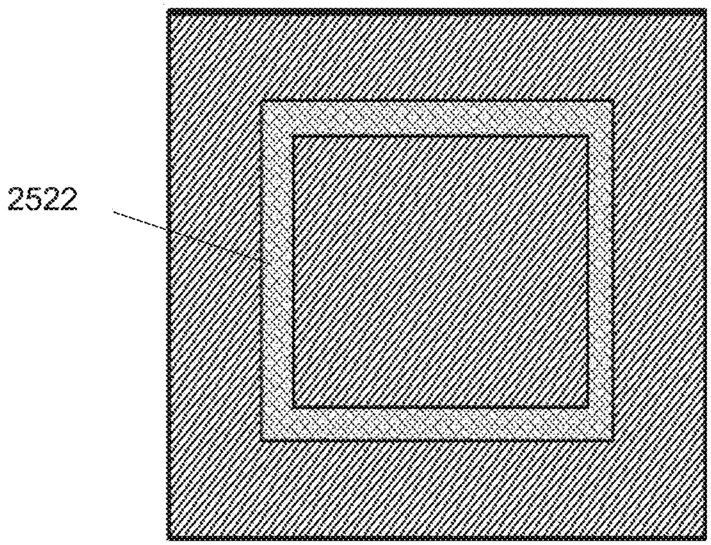

In some embodiments, the mass element may be a solid structure. For example, the mass element 2522 may be a regular or irregular structure such as a solid cylinder, a solid cuboid, a solid ellipsoid, or a solid triangle. In some embodiments, in order to reduce the contact area between the mass element 2522 and the elastic element 2521 and improve the sensitivity of the vibration sensor in a specific frequency range when the mass of the mass element 2522 remains constant, the mass element may also be a partially hollowed out structure. For example, as shown in FIG. 21(*a*), the mass element 2522 may be a ring cylinder. As another example, as shown in FIG. 21(*b*), the mass element 2522 may be a rectangular cylindrical structure.

In some embodiments, the mass element may include a plurality of sub-mass elements separated from each other, and the plurality of sub-mass elements may be located in different regions of the elastic element. In some embodiments, the mass element may include two or more sub-mass elements separated from each other, e.g., 3, 4, 5, or more. In some embodiments, a mass, a size, a shape, a material, etc. of the plurality of sub-mass elements separated from each other may be the same or different. In some embodiments, the plurality of sub-mass elements separated from each other may be distributed on the elastic element at equal intervals, at unequal intervals, symmetrically or asymmetrically. In some embodiments, the plurality of sub-mass elements separated from each other may be arranged on the upper surface or the lower surface of the elastic element. By arranging the plurality of sub-mass elements separated from each other in a middle region of the elastic element, the area of the deformation region of the elastic element under the vibrations driven by the housing may be increased, the deformation efficiency of the elastic element may be improved, and the sensitivity of the vibration sensor may be improved, and the reliability of the resonant system and the vibration sensor may also be improved. In some embodiments, the plurality of sub-mass elements may have different frequency responses by adjusting the mass, the size, the shape, the material, and other parameters of the plurality of mass elements, thereby further improving the sensitivity of the vibration sensor in different frequency ranges.

Figure 22:
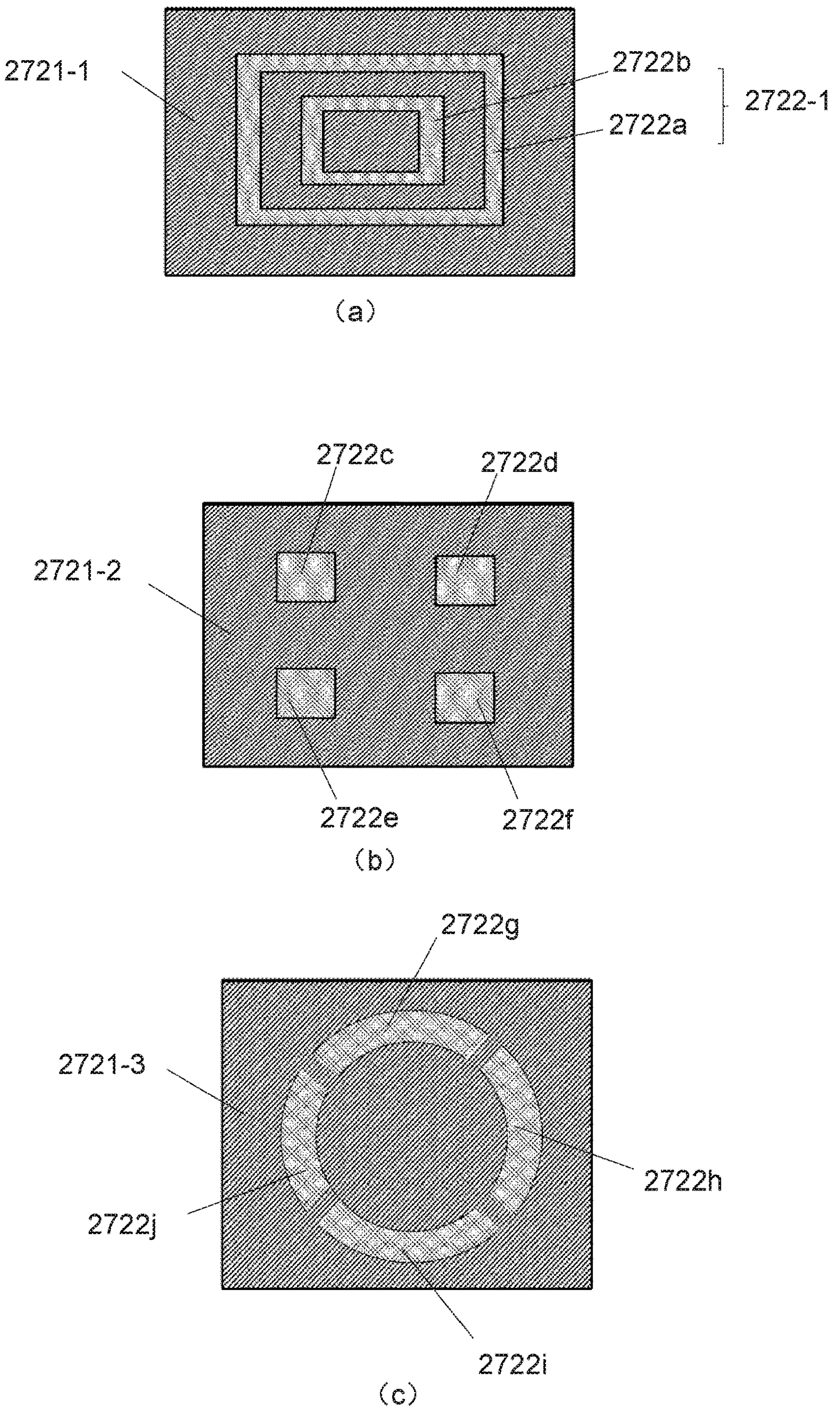
FIG. 22 is schematic diagrams each of which illustrates a cross-sectional view of a vibration sensor according to some embodiments of the present disclosure.

Drawing (a) in FIG. 22 is a schematic diagram illustrating a cross-sectional view of a vibration sensor according to some embodiments of the present disclosure. As shown in drawing (a) in FIG. 22, a mass element 2722-1 may include two rectangular cylindrical sub-mass elements 2722*a* and 2722*b* with a certain ratio in size. In some embodiments, the sub-mass element 2722*a* and the sub-mass element 2722*b* may have the same thickness (i.e., a thickness of a cylinder wall). In some embodiments, a length-width ratio of sub-mass element 2722*a* may be the same as a length-width ratio of sub-mass element 2722*b*. In some embodiments, a ratio of lengths or widths of the sub-mass element 2722*a* and the sub-mass element 2722*b* may be in a range of 0.1-0.8. In some embodiments, the ratio of the lengths or the widths of the sub-mass element 2722*a* and sub-mass element 2722*b* may be in a range of 0.2-0.6. In some embodiments, the ratio of the lengths or the widths of the sub-mass element 2722*a* and sub-mass element 2722*b* may be in a range of 0.25-0.5.

In some embodiments, the two rectangular cylindrical sub-mass elements 2722*a* and 2722*b* may be both located in a middle region of the elastic element 2721-1, and their geometric centers may coincide with a geometric center of the elastic element 2721-1. In some embodiments, the geometric centers of the rectangular cylindrical sub-mass elements 2722*a* and 2722*b* may not coincide.

It should be noted that a count of the sub-mass elements may not be limited to two as shown in drawing (a) in FIG. 22, and may also be three, four, or more. In addition, a shape of the sub-mass elements may not be limited to the rectangular cylindrical shape shown in drawing (a) in FIG. 22, and may be a structure of other shapes. For example, in some embodiments, the mass element 2722-1 may include two ring sub-mass elements with different inner diameters. The two ring sub-mass elements may be both located in the middle region of the elastic element 2721, and centers of the circles of the two ring sub-mass elements may coincide with a geometric center of the elastic element 2721-1. As another example, the mass element 2722-1 may include two sub-mass elements (e.g., the ring sub-mass element and a rectangular sub-mass element) of different shapes. The larger sub-mass element may surround the smaller sub-mass element. In addition, the plurality of sub-mass elements may be located on different surfaces of the elastic element 2721-1. For example, a part of the plurality of sub-mass elements may be located on the upper surface of the elastic element 2721-1, and another part of the plurality of sub-mass elements may be located on the lower surface of the elastic element 2721-1.

Drawing (b) in FIG. 22 is a schematic diagram illustrating a cross-sectional view of a vibration sensor according to some embodiments of the present disclosure. As shown in drawing (b) in FIG. 22, a mass element 2722-2 may include four sub-mass elements 2722*c*, 2722*d*, 2722*e*, and 2722*f*. The sub-mass elements 2722*c*, 2722*d*, 2722*e*, and 2722*f* may be distributed in a matrix in a middle region of the elastic element 2721-2. The sub-mass elements 2722*c*, 2722*d*, 2722*e*, and 2722*f* may have any regular or irregular shape such as rectangle, circle, ellipse. In some embodiments, shapes, sizes, materials, etc. of the sub-mass elements 2722*c*, 2722*d*, 2722*e*, and 2722*f* may be the same or different.

Drawing (c) in FIG. 22 is a schematic diagram illustrating a cross-sectional view of a vibration sensor according to some embodiments of the present disclosure. As shown in drawing (c) in FIG. 22, a mass element 2722 may include four sub-mass elements 2722*g*, 2722*h*, 2722*i*, and 1222*j*. The sub-mass elements 2722*g*, 2722*h*, 2722*i*, and 2722*j* may be distributed in a ring in a middle region of the elastic element 2721 at equal intervals, and a center of a circle of the ring may coincide with the geometric center of the elastic element 2721.

It should be noted that the count, the shape, and the distribution of the sub-mass elements shown in FIG. 22 are only for exemplary description, and are not intended to limit the present disclosure. For example, the count of the rectangular cylindrical sub-mass elements in FIG. 22 and the sub-mass elements in drawing (c) in FIG. 22 may be more than two (e.g., 3, 4, 5), etc. As another example, the count of the sub-mass elements in drawing (b) in FIG. 22 may be 6 sub-mass elements distributed in a 2×3 matrix, or 8 sub-mass elements distributed in a 4×4 matrix, etc.

Figure 23:
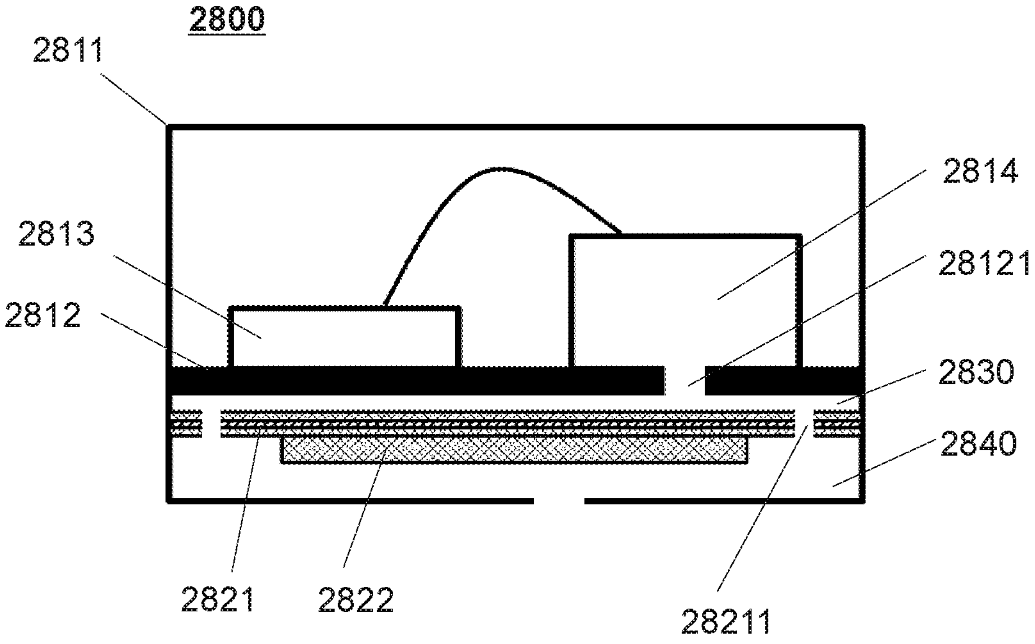
FIG. 23 is a schematic diagram illustrating a structure of a vibration sensor of which an elastic element includes a first hole part according to some embodiments of the present disclosure.

FIG. 23 is a schematic diagram illustrating a structure of a vibration sensor of which an elastic element 2821 includes a first hole part 28211 according to some embodiments of the present disclosure. A structure of a vibration sensor 2800 shown in FIG. 23 may be substantially the same as the structure of the vibration sensor 2200 shown in FIG. 17. The difference lies in that the first hole part 28211 may be arranged on the elastic element 2821 shown in FIG. 23. A housing 2811, a substrate 2812, a processor 2813, a sensing element 2814, a sound pickup hole 28121, a mass element 2822, a first acoustic cavity 2830, and a second acoustic cavity 2840 shown in FIG. 23 may be respectively similar to the housing 2211, the substrate 2212, the processor 2213, the sensing element 2214, the sound pickup hole 22121, the mass element 2222, the first acoustic cavity 2230, and the second acoustic cavity 224 shown in FIG. 17, which is not repeated here.

In some embodiments, as shown in FIG. 23, the elastic element 2821 may include at least one first hole part 28211. The at least one first hole part 28211 may enable the first acoustic cavity 2830 and the at least one second acoustic cavity 2840 to be spatially connected, so as to adjust air pressures in the first acoustic cavity 2830 and the second acoustic cavity 2840, balance an air pressure difference in the two cavities, prevent the vibration sensor 2800 from being damaged, increase the damping of a resonant system and reduce a quality factor Q value of the vibration sensor 2800, and make a frequency response curve of the vibration sensor 2800 flatter. The second acoustic cavity 2840, which is different from the first acoustic cavity 2830, refers to a cavity defined between the elastic element 2821 and the housing 2811.

Figure 24:
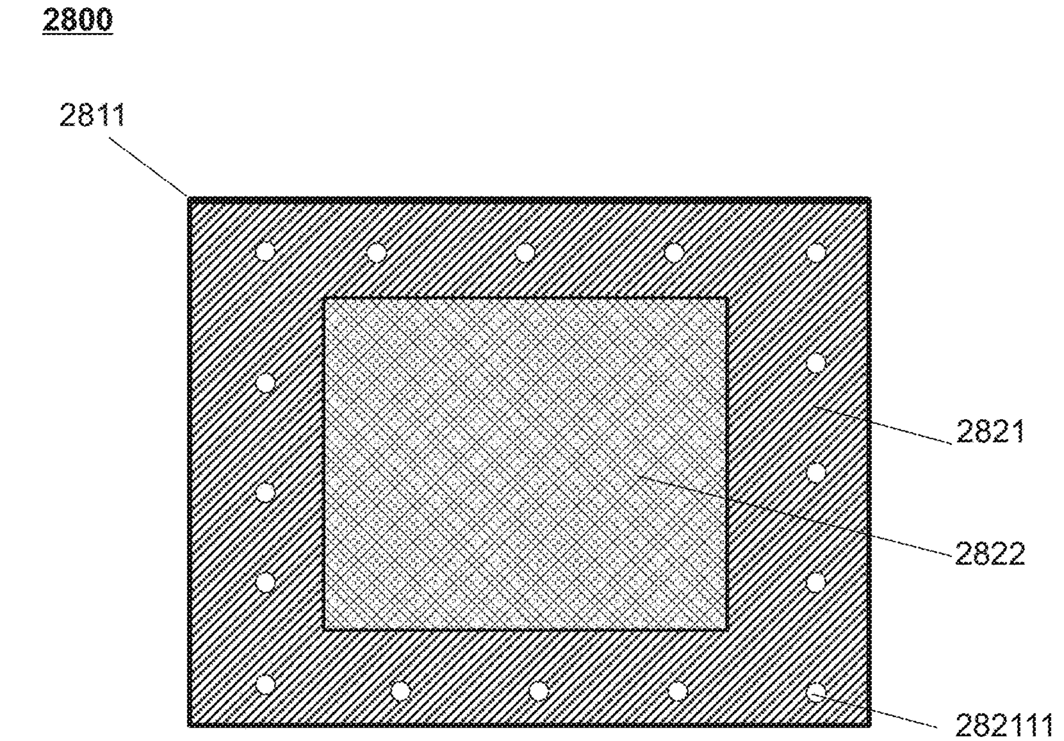
FIG. 24 is a cross-sectional view illustrating the vibration sensor shown in FIG. 23.

FIG. 24 is a cross-sectional view illustrating the vibration sensor 2800 shown in FIG. 23. In some embodiments, as shown in FIG. 24, the first hole part 28211 may include first sub-hole part 282111 arranged on the elastic element 2821, and the at least one first sub-hole part 282111 may be located in a region on the elastic element 2821 not covered by the mass element 2822. In some embodiments, a count of the first sub-hole parts 282111 on the elastic element 2821 may be set according to an actual required damping, e.g., the count of the first sub-hole parts 282111 may be 4, 8, 16, etc. In some embodiments, the plurality of first sub-hole parts 282111 may be distributed at equal intervals in a rectangle or in a ring in the region on the elastic element 2821 not covered by the mass element 2822.

In some embodiments, the first hole part 28211 may also include second sub-hole parts arranged on the mass element 2822. At least one second sub-hole part may be spatially connected to the at least one first sub-hole part 282111, so as to adjust an air pressure in the first acoustic cavity 2830 and the second acoustic cavity 2840, and also adjust the damping of the resonant system, thereby making the frequency response curve of the vibration sensor 2800 flatter.

Figure 25:
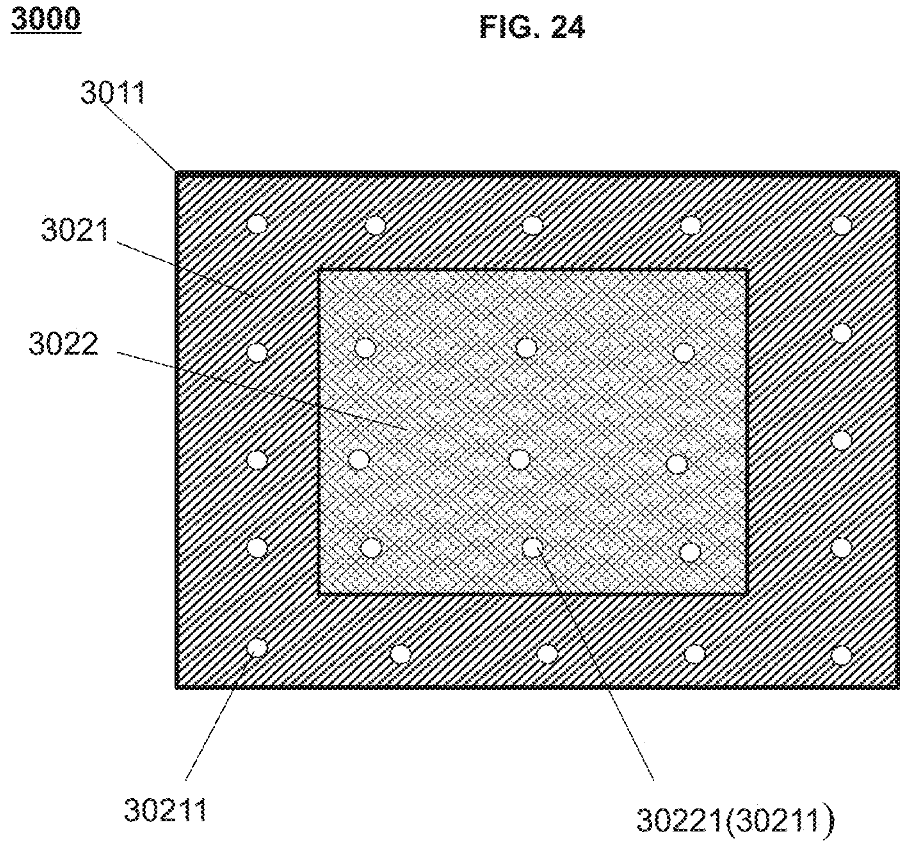
FIG. 25 is a cross-sectional view illustrating a vibration sensor according to some embodiments of the present disclosure.

FIG. 25 is a cross-sectional view illustrating a vibration sensor 3000 according to some embodiments of the present disclosure. A structure of the vibration sensor 3000 shown in FIG. 250 may be substantially the same as the structure of the vibration sensor 2800 shown in FIG. 23 or FIG. 24. The difference lies in that second sub-hole parts 30221 may be arranged on a mass element 3022 of the vibration sensor 3000 shown in FIG. 25. The description regarding a housing 3011 and an elastic element 3021 shown in FIG. 25 may be found in the relevant descriptions of the housing 2811 and the elastic element 2821 in FIG. 23.

In some embodiments, as shown in FIG. 25, a plurality of second sub-hole parts 30221 may be arranged on the mass element 3022, and a plurality of first sub-hole parts 30211 may be arranged on the elastic element 3021. Part of the plurality of first sub-hole parts 30211 may be arranged in a region on the elastic element 3021 covered by the mass element 3022, and correspond in position to the second sub-hole parts 30221. The first sub-hole parts 30211 located in the region on the elastic element 1721 covered by the mass element 1722 may be spatially connected to the corresponding second sub-hole parts 13021 to ensure that the first acoustic cavity and the second acoustic cavity may be spatially connected. In addition, another part of the first sub-hole parts 30211 may be arranged in a region of the elastic element 3021 not covered by the mass element 3022, so that the first acoustic cavity and the second acoustic cavity may be spatially connected.

In some embodiments, diameters of the first sub-hole parts (e.g., the first sub-hole parts 28211 shown in FIG. 23 or the first sub-hole parts 30211 shown in FIG. 25) or the second sub-hole parts 30221 may be in a range of 0.01 μm-40 μm. In some embodiments, the diameters of the first sub-hole parts or the second sub-hole parts 30221 may be in a range of 0.03 μm-30 μm. In some embodiments, the diameters of the first sub-hole parts or the second sub-hole parts 30221 may be in a range of 0.05 μm-20 μm.

In some embodiments, the first sub-hole parts may not be arranged on the elastic element, or the second sub-hole parts may not be arranged on the mass element, but the elastic element may be manufactured by using a film material containing micropores. In this embodiment, the micropores of the elastic element may play the role of gas conduction, and may also realize adjustment of the air pressure in the acoustic cavity and adjustment of the damping of the resonant system.

In this embodiment, the elastic element may be a microporous film made of polytetrafluoroethylene (PTFE), nylon, polyethersulfone (PES), polyvinylidene fluoride (PVDF), polypropylene (PP), and other materials. Preferably, the elastic element may use a PTFE microporous film. In some embodiments, a pore diameter of the microporous film may be in a range of 0.01 μm-10 μm. In some embodiments, the pore diameter of the microporous film may be in a range of 0.05 μm-10 μm. In some embodiments, the pore diameter of the microporous film may be in a range of 0.1 μm-10 μm. The use of the microporous film for the elastic element may eliminate punching holes in the elastic element or the mass element, thereby simplifying the manufacturing process and saving costs.

In some embodiments, the elastic element may further include at least one elastic layer (not shown in the figure), and the at least one elastic layer may be located in a region on the elastic element not covered by the mass element. The at least one elastic layer may cover at least part of the first sub-hole parts or micropores on the elastic element, on the one hand, a porosity of the first sub-hole parts or the micropores may be adjusted, and on the other hand, a stiffness of the elastic element may also be adjusted, thereby adjusting the sensitivity and the reliability of the vibration sensor. In some embodiments, a material of the elastic layer may be silica gel, silicone gel, or the like. In some embodiments, a thickness of the elastic layer may be in a range of 0.1 μm-500 μm. In some embodiments, the thickness of the elastic layer may be in a range of 0.5 μm-300 μm. In some embodiments, the thickness of the elastic layer may be in a range of 1 μm-100 μm. In some embodiments, the thickness of the elastic layer may be in a range of 50 μm-100 μm.

In some embodiments, a filler with fluidity may be arranged in at least one second acoustic cavity (e.g., the second acoustic cavity 2240, etc. shown in FIG. 17) different from the first acoustic cavity (e.g., the first acoustic cavity 2230 shown in FIG. 17) of the vibration sensor. Taking the vibration sensor 2200 shown in FIG. 17 as an example, the second acoustic cavity 2240 may be a cavity defined between the elastic element 2221 or the mass element 2222 and the housing 2211 of the sensor. By arranging the filler with fluidity in the second acoustic cavity 2240, a quality factor Q value and the sensitivity of the vibration sensor 2200 may be adjusted, and when the vibration sensor 2200 is impacted, the filler with fluidity may also absorb an impact load to prevent the vibration sensor 2200 from being damaged. In some embodiments, the greater a kinematic viscosity of the filler, the higher the sensitivity of the vibration sensor 2200. In some embodiments, the kinematic viscosity of the filler may be within 20000 cst. In some embodiments, the kinematic viscosity of the filler may be within 10000 cst. In some embodiments, the kinematic viscosity of the filler may be within 5000 cst. In some embodiments, the kinematic viscosity of the filler may be within 500 cst. In some embodiments, the kinematic viscosity of the filler may be within 50 cst. In some embodiments, the filler with fluidity in the second acoustic cavity 2240 may include liquid, gas, gel, and other flexible materials. Preferably, a material of the filler with fluidity in the second acoustic cavity 2240 may be oil, aloe gel, silicone gel, polydimethylsiloxane (PDMS), or the like. In some embodiments, the filler with fluidity may be completely filled or incompletely filled (e.g., with air bubbles) in the second acoustic cavity 2240.

In some embodiments, the vibration sensor may include a plurality of resonant systems that may realize multi-mode vibration of the vibration sensor and improve the sensitivity of the vibration sensor in a wider frequency range.

Figure 26:
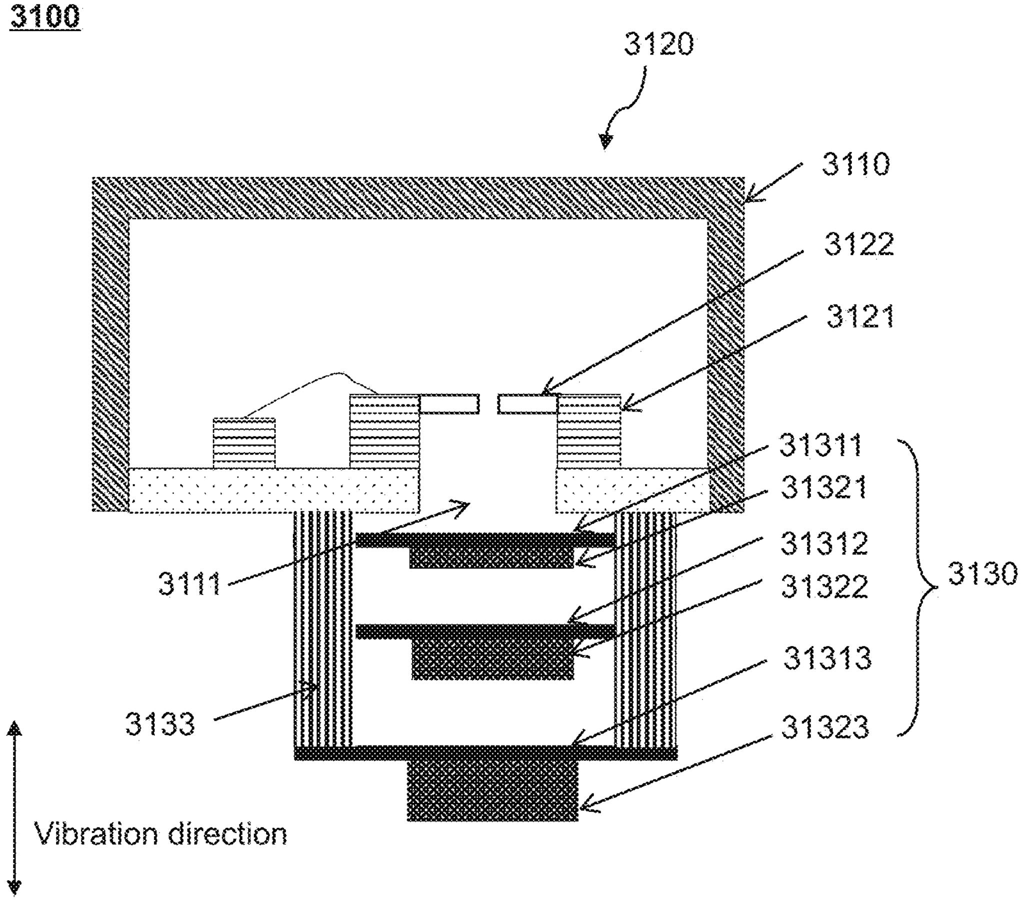
FIG. 26 is a schematic diagram illustrating a structure of a vibration sensor according to some embodiments of the present disclosure.

FIG. 26 is a schematic diagram illustrating a structure of a vibration sensor according to some embodiments of the present disclosure. As shown in FIG. 26, in some embodiments, a vibration sensor 3100 may include an acoustic transducer 3120 and a vibration component 3130. Referring to FIG. 26, in some embodiments, the acoustic transducer 3120 may include a housing 3110 and a sound pickup device 3121. In some embodiments, the sound pickup device 3121 may include a capacitive transducer, a piezoelectric transducer, etc., which is not limited in the present disclosure.

In some embodiments, a sound pickup hole 3111 for sound pickup may be arranged on the housing 3110. In some embodiments, the vibration component 3130 may be arranged close to the sound pickup hole 3111 of the housing 3110. In some embodiments, one or more sets of elastic elements (e.g., a first elastic element 31311, a second elastic element 31312, and a third elastic element 31313) and mass elements (e.g., a first mass element 31321, a second mass element 31322 and a third mass element 31323) may be arranged on an outer side of the sound pickup hole 3111. In some embodiments, the vibration component 3130 may be physically connected to the housing 3110. Specifically, the physical connection may include welding, clipping, bonding, or integral molding, which is not limited here. It should be noted that, in some embodiments, the one or more sets of elastic elements and mass elements may also be arranged in the sound pickup hole 3111 parallel to a radial section of the sound pickup hole 3111. The details may be found in the relevant descriptions in FIG. 28 hereinafter.

In some embodiments, when the vibration sensor 3100 is used for air conduction pickup and the external environment generates vibrations (e.g., sound waves), the one or more sets of elastic elements and mass elements on the elastic elements may generate vibrations in response to the vibrations of the external environment. As the elastic elements can allow air to pass through, the vibrations generated by the elastic elements and the mass elements together with an external vibration signal (e.g., the sound wave) may cause a sound pressure change (or air vibration) in the sound pickup hole 3111 to make the vibration signal transmit to the sound pickup device 3121 through the sound pickup hole 3111 and convert the vibration signal into an electrical signal, thereby realizing the process that the vibration signal is strengthened in one or more target frequency ranges and then converted into the electrical signal. The target frequency range may be a frequency range in which resonant frequencies (or resonant frequencies) corresponding to the set of elastic elements and mass elements are located. For example, when the vibration sensor 3100 is used as a microphone, the target frequency range may be in a range of 3100 Hz-2 kHz. Specifically, in some embodiments, if a resonant frequency of the acoustic transducer is 2 kHz, a resonant frequency of the vibration component 3130 may be configured as 1 kHz.

In some embodiments, when the vibration sensor 3100 is used for bone conduction sound pickup, a conduction housing may be arranged on the outer side of the sound pickup hole 3111. The acoustic transducer 3120 and the conduction housing may enclose an accommodation space to form an acoustic cavity. The one or more sets of elastic elements and mass elements may be arranged in the accommodation space. In some embodiments, the vibration component 3130 (e.g., a vibration element) may be physically connected to the housing 3110. When the external environment generates vibrations, the vibrations may be received through the conduction housing and cause the vibration component 3130 to generation vibrations. The vibrations of the vibration component 3130 may cause the air in the acoustic cavity to vibrate, and the vibrations generated by the elastic elements and the mass elements together with a vibration signal in the acoustic cavity may be transmitted to the sound pickup device 3121 through the sound pickup hole 3111 and converted into an electrical signal.

As shown in FIG. 26, in some embodiments, the vibration sensor 3100 may include three sets of elastic elements and mass elements. Specifically, the three sets of elastic elements and mass elements may have different resonant frequencies. Each set of elastic element and mass element may generate resonance under effects of vibrations of different frequencies in the external vibration signal, so that in the sound signal obtained by the vibration sensor 3100, the sensitivity of the acoustic transducer 3120 in the three target frequency ranges may be greater than the sensitivity of the acoustic transducer 3120. It should be noted that, in some embodiments, the plurality of sets of elastic elements and mass elements may have the same resonant frequency, so that the sensitivity in the target frequency range may be greatly improved. For example, when the vibration sensor 3100 is mainly used to detect mechanical vibrations in a range of 5 kHz-5.5 kHz, the resonant frequencies of the plurality of sets of elastic elements and mass elements may be configured as a value in a detection range (e.g., 5.3 kHz), thereby making the vibration sensor 3100 have a higher sensitivity in the detection range compared with only one set of elastic element and mass element. It should be noted that a count of sets of elastic elements and mass elements shown in FIG. 26 is only for explanation and does not limit the scope of the present disclosure. For example, the count of sets of elastic elements and mass elements may be one set, two sets, four sets, etc.

In some embodiments, when the vibration component 3130 has a plurality of elastic elements, the elastic element furthest from the acoustic transducer 3120 may be configured not to allow air to pass through. As shown in FIG. 26, a third elastic element 31313 in the figure may be configured not to allow air to pass through. With this arrangement, a closed space may be formed between the third elastic element 31313 and the acoustic transducer 3120, thereby better reflecting vibration information. It should be noted that, in some embodiments, the elastic element farthest from the acoustic transducer 3120 may be configured to allow air to pass through. For example, when the conduction housing (not shown in FIG. 31) is arranged on the outer side of the sound pickup hole 3111, the conduction housing and the acoustic transducer 3120 may enclose the acoustic cavity, and the air in the acoustic cavity may well reflect the vibration information. In some embodiments, a hole part (e.g., a second hole part or a third hole part) may be arranged on the conduction housing or the housing. The hole part may enable the interior of the acoustic transducer 3120 and the acoustic cavity formed between the plurality of sets of vibration components 3130 and the external environment to be spatially connected. During the assembly process of the vibration sensor 3100, the hole part may deliver gas inside the housing 3110 to the outside. In this way, by setting the hole part, when the vibration component 3130 and the acoustic transducer 3120 are assembled, failure of the vibration component 3130 and the acoustic transducer 3120 due to an excessive air pressure difference between inner and outer spaces of the housing 3110 and the conduction housing may be avoided, thereby reducing the difficulty of assembling the vibration sensor 3100. In some embodiments, air conduction sound in the environment may affect the use performance of the vibration sensor 3100. In order to reduce the impact of the air conduction sound in the environment, after the vibration sensor 3100 is prepared or before the vibration sensor 3100 is applied to an electronic device, the hole part may be sealed with a sealing material, so as not to affect the performance of the vibration sensor 3100. In some embodiments, the hole part may be blocked by using a sealant, bonding a sealing tape, adding a sealing plug, or the like.

In some embodiments, the vibration component 3130 may include a first elastic element 31311, a second elastic element 31312, and a third elastic element 31313 arranged in sequence in a vibration direction. The mass element may include a first mass element 31321, a second mass element 31322, and a third mass element 31323 arranged in sequence in the vibration direction. The first elastic element 31311 may be connected to the first mass element 31321. The second elastic element 31312 may be connected to the second mass element 31312. The third elastic element 31313 may be connected to the third mass element 31323. In some embodiments, a distance between any two adjacent elastic elements of the first elastic element 31311, the second elastic element 31312, and the third elastic element 31313 may not be less than a maximum vibration amplitude of the two adjacent elastic elements. This setting is used to ensure that the elastic element may not interfere with adjacent elastic elements during vibration, thus not affecting the transmission effect of the vibration signal. In some embodiments, when the vibration component 3130 includes the plurality of sets of elastic elements and mass elements, the elastic elements may be arranged in sequence along a direction perpendicular to the vibration direction of the elastic elements. In some embodiments, a distance between adjacent elastic elements may be the same or different. In some embodiments, gaps between the elastic element and the adjacent elastic elements may form a plurality of cavities, and the plurality of cavities between the elastic element and the adjacent elastic elements may accommodate air and allow the elastic element to vibrate therein.

In some embodiments, the vibration component 230 may also include a limiting structure (not shown in the figure), which is configured to make the distance between the adjacent elastic elements of the vibration component not less than a maximum amplitude of the adjacent elastic elements. In some embodiments, the limiting structure may be connected to an edge of the elastic elements, and the limiting structure may not interfere with the vibrations of the elastic element by controlling a damping of the limiting structure.

In some embodiments, the plurality sets of vibration components 3130 may include a plurality of mass elements, and the plurality of mass elements may be respectively arranged on both sides of the elastic elements. For example, if a set of vibration component includes two mass elements, the two mass elements may be symmetrically arranged on both sides of the elastic element. In some embodiments, the mass elements of the plurality of vibration components 3130 may be located on the same side of the elastic elements. The mass elements may be arranged on an outer side or an inner side of the elastic elements. A side of the elastic elements close to the acoustic transducer 3120 may be the inner side, and a side of the elastic elements away from the acoustic transducer 3120 may be the outer side. It should be noted that, in some embodiments, the mass elements of the plurality sets of vibration components may be located on different sides of the elastic elements. For example, the first mass element 31321 and the second mass element 31322 may be located on the outer side of the corresponding elastic element, and the third mass element 31323 may be located on the inner side of the corresponding elastic element.

In some embodiments, the elastic elements (e.g., the first elastic element 31311, the second elastic element 31312, and the third elastic element 31313) may be configured as film-shaped structures capable of allowing air to pass through. In some embodiments, the elastic elements (e.g., the first elastic element 31311, the second elastic element 31312, and the third elastic element 31313) may be gas-permeable films. The elastic elements may be configured to allow air to pass through, so that the vibration signal may enable the vibration component 3130 to generate vibrations and further penetrate the gas-permeable films to be received by the acoustic transducer 3120, thereby improving the sensitivity in the target frequency range. In addition, the film-shaped structures capable of allowing air to pass through may enable the acoustic cavities formed between the plurality of elastic elements to be spatially connected, thereby adjusting the air pressure between the acoustic cavities, balancing the air pressure difference in each acoustic cavity, and preventing damage to internal components of the vibration sensor 3100 due to the large air pressure difference.

In some embodiments, the elastic elements (e.g., the first elastic element 31311, the second elastic element 31312, and the third elastic element 31313) may also be film materials with first hole parts. Specifically, diameters of the first hole parts may be in a range of 0.01 μm-10 μm. Preferably, the diameters of the first hole parts may be in a range of 0.1 μm-5 μm, such as 0.2 μm, 0.5 μm, 0.8 μm, 1 μm, 2 μm, etc. In some embodiments, the diameters of the first hole parts of the vibration components 230 may be the same or different, and the diameters of the first hole parts of a single vibration component 230 may be the same or different. In some embodiments, the diameters of the first hole parts may also be greater than 5 μm. When the diameters of the first hole parts are greater than 5 μm, other materials (e.g., silica gel, etc.) may be arranged on the elastic elements to cover part of the first hole parts or a partial region of the first hole parts without affecting the air permeability. In some embodiments, hole parts may be simultaneously arranged on the elastic elements (e.g., the first elastic element 31311, the second elastic element 31312, and the third elastic element 31313) and the mass elements (e.g., the first mass element 31321, the second mass element 31322, and the third mass The element 31323), so that the acoustic cavities formed between the plurality of elastic elements may be spatially connected.

In some embodiments, the vibration component 230 may further include a support structure 3133 configured to support the one or more sets of elastic elements and mass elements. The support structure 3133 may be physically connected to the acoustic transducer 3120 (e.g., the housing structure 3110). The one or more sets of elastic and mass elements may be connected to the support structure 3133. Specifically, the support structure 3133 may be physically connected to the housing 3110. The physical connection method may include clamping, bonding, or integral molding. In some embodiments, preferably, the support structure 3133 and the housing 3110 may be connected through bonding. Bonding materials may include but are not limited to epoxy glue, silica gel, etc.

In some embodiments, the support structure 3133 may also be connected to the support structure 3133 to achieve fixed support to control a distance between the adjacent elastic elements, so as to ensure the transmission effect of the vibration signal.

Figure 27:
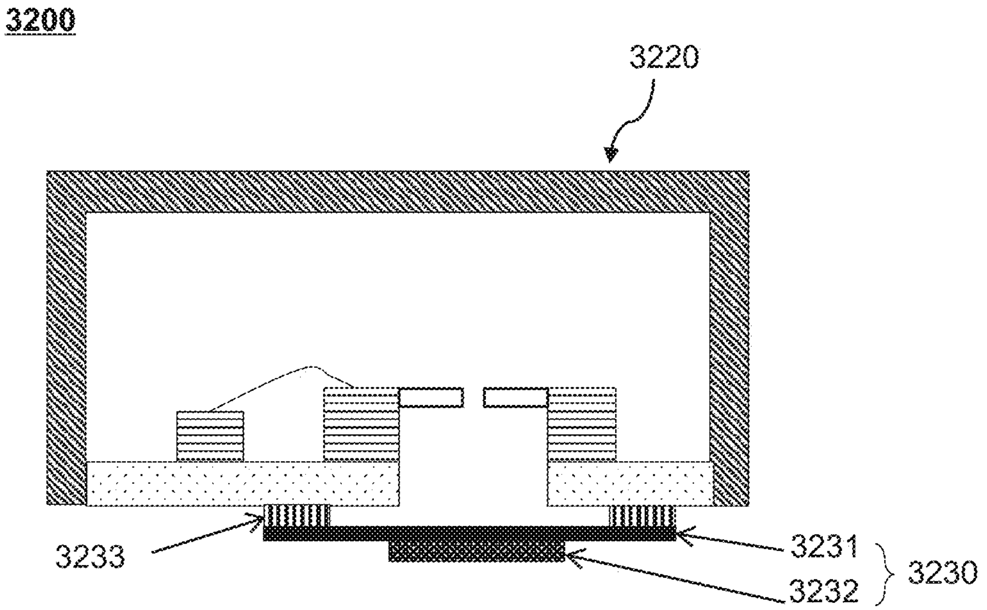
FIG. 27 is a schematic diagram illustrating a structure of a vibration sensor according to some embodiments of the present disclosure.

FIG. 27 is a schematic diagram illustrating a structure of a vibration sensor 3200 according to some embodiments of the present disclosure. As shown in FIG. 27, in some embodiments, a vibration component 3230 of the vibration sensor 3200 may include a set of elastic elements 3231 and mass elements 3232 which are connected to an acoustic sensor 3220 through a support structure 3233. Specifically, the mass elements 3232 may be physically connected to the elastic elements 3231, and the mass elements 3232 may be arranged on outer sides of the elastic elements 3231. In some embodiments, the mass elements 3232 may generate resonance in response to vibrations of an external environment, and the resonance generated by the elastic elements 3231 and the mass elements 3232 together with an external vibration signal may be transmitted to an acoustic transducer 3220, thereby strengthening the sensitivity of the vibration component 3230 near a resonant frequency, and realizing process that the vibration signal is strengthened in a target frequency range and then converted into an electrical signal.

In some embodiments, since the vibration sensor 3200 only includes one set of vibration component 3230, in order to achieve a better sound pickup effect, in some embodiments, the elastic elements 3231 may be gas-impermeable. It should be noted that the elastic element 3231 or the mass element 3232 of the vibration sensor 3200 in FIG. 27 may also be gas-permeable, so as to balance an air pressure difference between the acoustic cavities. For example, a first hole part may be arranged on the elastic elements 3231 or the mass elements 3232. For another example, the elastic elements 3231 or the mass elements 3232 may be made of a gas-permeable material.

In some embodiments, the resonant frequency of each set of elastic elements 3231 and mass elements 3232 may be related to parameters of the elastic elements 3231 or mass elements 3232. The parameters may include a modulus of the elastic element 3231, a volume of a cavity formed between the acoustic transducer 3220 and the elastic element 3231, a radius of the mass element 3232, a height of the mass element 3232, a density of the mass element 3232, or the like, or a combination thereof.

Figure 28:
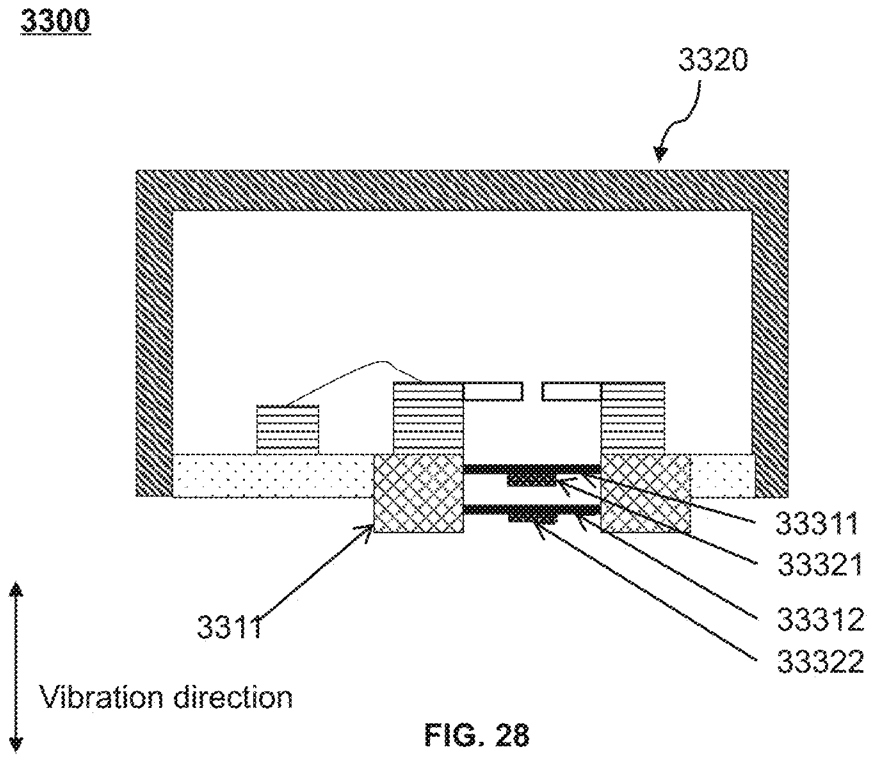
FIG. 28 is a schematic diagram illustrating a structure of a vibration sensor according to some embodiments of the present disclosure.

FIG. 28 is a schematic diagram illustrating a structure of a vibration sensor according to some embodiments of the present disclosure. In some embodiments, one or more sets of elastic elements and mass elements of a vibration sensor 3300 may be arranged in a sound pickup hole parallel to a radial section (i.e., perpendicular to a vibration direction) of the sound pickup hole. As shown in FIG. 28, in some embodiments, a conduit 3311 may be arranged at the sound pickup hole. The elastic elements and the mass elements may include a first elastic element 33311, a second elastic element 33312, a first mass element 33321, and a second mass element 33322 arranged in the sound pickup hole parallel to the radial section of the sound pickup hole. In some embodiments, the conduit 3311 may be made of a gas-impermeable material, and the function of the conduit 3311 may be similar to that of the support structure 3133 of the vibration sensor 3100. In some embodiments, in order to ensure free vibration of the mass elements, the mass elements may not be in contact with an inner wall of the sound pickup hole or the conduit 3311. It should be noted that the setting of the conduit 3311 is only a specific embodiment, and does not limit the scope of the present disclosure. For example, in some embodiments, the conduit 3311 may not be arranged, and the one or more sets of elastic elements and mass elements may be directly connected to the sound pickup hole, or the support structure may be arranged in the sound pickup hole to support the one or more sets of elastic elements and mass elements.

In some embodiments, the first mass element 33321 and the second mass element 33322 may generate resonance simultaneously in response to vibrations of an external environment, and the resonance generated by the first elastic element 33311, the second elastic element 33312, and the first mass element 33321 and the second mass element together with an external vibration signal may be transmitted to the acoustic sensor 3320 through the conduit 3311 and converted into an electrical signal, thereby realizing the process that the vibration signal is strengthened in one or more target frequency ranges and then converted into the electrical signal. It should be noted that two sets of elastic elements and mass elements shown in FIG. 28 are for illustration purposes only, and will not limit the protection scope of the present disclosure. For example, a count of sets of elastic elements and mass elements may be one set, three sets, or more.

It should be noted that the conduction housing of the vibration sensor 3100 shown in FIG. 26 or the hole part on the housing 3110 and the first hole part on the vibration component 3130 or the vibration component 3130 made of the gas-permeable material may also be applicable to the vibration sensor 3300 shown in FIG. 28, which is not repeated here.

Figure 29:
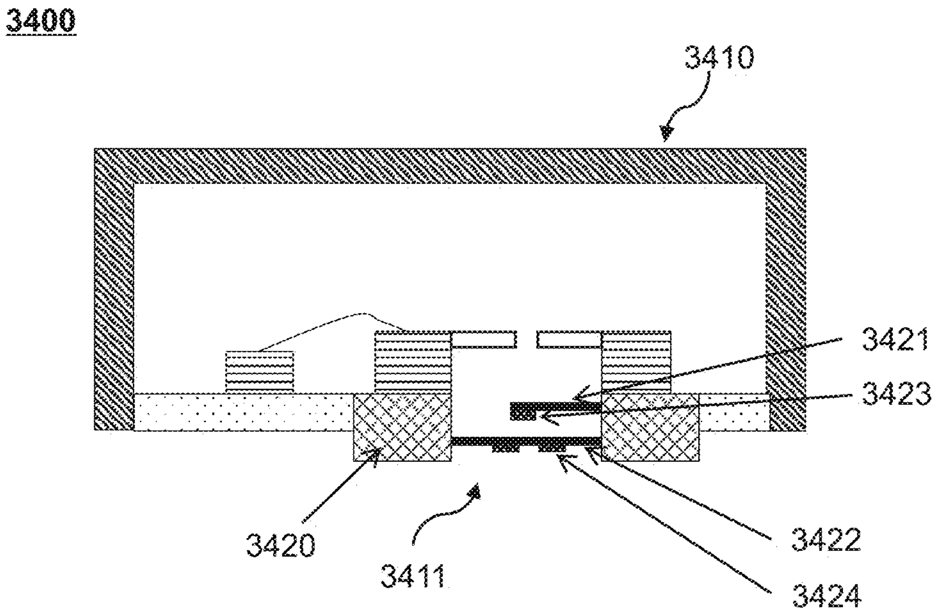
FIG. 29 is a schematic diagram illustrating a structure of a vibration sensor according to some embodiments of the present disclosure.

FIG. 29 is a schematic diagram illustrating a structure of a vibration sensor according to some embodiments of the present disclosure. As shown in FIG. 29, in some embodiments, a vibration sensor 3400 may include an acoustic transducer 3410 and a vibration component. The vibration component may mainly include mass elements and elastic elements connected to each other. In some embodiments, the elastic element may include one or more plate-shaped structures (e.g., a cantilever beam 3421, a film-shaped structure 3422). Each plate-shaped structure may be connected to at least one mass element of the one or more mass elements. In some embodiments, a structure formed by one plate-shaped structure and the mass element physically connected to the plate-shaped structure is also referred to as a resonant structure. The plate-shaped structures refer to structures capable of carrying one or more mass elements and made of a flexible or rigid material. The mass elements may be objects with a small volume and a high mass. In some embodiments, the volume and the mass of the mass elements may be different according to different usage scenarios and target frequencies of the vibration component.

In some embodiments, the plate-shaped structures may include a single plate-shaped structure (also referred to as a plate piece). In some embodiments, the plate-shaped structures may include a plurality of plate pieces, e.g., 2, 3, 4, etc. In some embodiments, at least one mass element connected to each plate-shaped structure may include a single mass element. In some embodiments, the at least one mass element connected to each plate-shaped structure may include a plurality of mass elements, e.g., 2, 3, 4, etc.

In some embodiments, the vibration component may further include a support structure 3420 configured to support the plate-shaped structures. The support structure 3420 may be connected to the acoustic transducer. The support structure 3420 may have a space for placing the plate-shaped structures.

In some embodiments, the one or more mass elements may be arranged on either side of the plate-shaped structures in a vibration direction. In some embodiments, the plurality of mass elements may also be arranged on both sides of the plate-shaped structures in the vibration direction. In some embodiments, in the vibration direction of the plate-shaped structures, a projection region of the mass elements connected thereto may be located in a projection region of the plate-shaped structures. In some embodiments, in a direction (i.e., perpendicular to the vibration direction) parallel to a surface connected to the plate-shaped structures and the mass elements, a sum of cross-sectional areas of the one or more mass elements on one side may be less than a cross-sectional area of the plate-shaped structures. In some embodiments, the vibration direction of the mass elements driven by the plate-shaped structures may be the same as the vibration direction the plate-shaped structures. In some embodiments, a projection area of the mass elements may not overlap a projection of the support structure 3420 in a direction perpendicular to the surface connected to the elastic element and the one or more mass elements.

In some embodiments, the one or more plate-shaped structures and the plurality of mass elements physically connected to the plate-shaped structures may correspond to a plurality of target frequency ranges of the target frequency ranges, so that the sensitivity of the vibration sensor in the plurality of target frequency ranges may be greater than the sensitivity of the acoustic transducer. In some embodiments, the combination of the at least one plate-shaped structure and mass elements may generate a relatively large amplitude of a vibration signal near a resonant frequency when the combination receives the vibration signal, thereby improving the sensitivity of the vibration sensor.

In some embodiments, in order to adapt to a plurality of vibration modes, the vibration component formed by one plate-shaped structure and one or more mass elements physically connected to the plate-shaped structure may have a plurality of resonant frequencies. The plurality of resonant frequencies may be the same or different. At least one structure parameter of at least two mass elements of the plurality of mass elements may be different. The structure parameters of the mass elements may include a size, a mass, a density, a shape, or the like. Specifically, the size of the mass elements may be at least one of a length, width, height, cross-sectional area, or volume parameter of the mass elements.

In some embodiments, a frequency response curve of the vibration sensor under an action of the vibration component may have a plurality of resonant peaks. In some embodiments, a difference between at least one resonant frequency of the plurality of resonant frequencies of a resonant structure formed by one plate-shaped structure and the plurality of mass elements physically connected to the plate-shaped structure and the resonant frequency of the acoustic transducer may be in a range of 1 kHz-10 kHz. In some embodiments, a difference between two adjacent resonant frequencies of the resonant frequencies of the plurality of plate-shaped structures of one plate-shaped structure and the plurality of mass elements physically connected to the plate-shaped structure may be less than 2 kHz. In some embodiments, the difference between the two adjacent resonant frequencies of the resonant frequencies of the plurality of plate-shaped structures of one plate-shaped structure and the plurality of mass elements physically connected to the plate-shaped structure may not be greater than 1 kHz. In some embodiments, the resonant frequencies of one plate-shaped structure and the plurality of mass elements physically connected to the plate-shaped structure may be in a range of 1 kHz-10 kHz. In some embodiments, the resonant frequencies of one plate-shaped structure and the plurality of mass elements physically connected to the plate-shaped structure may be in a range of kHz-5 kHz.

By arranging at least one mass element in the vibration component, the vibration component may have multiple vibration modes, so that the frequency response curve of the vibration sensor may have two or more resonant peaks. Since the sensitivity of the vibration sensor increases in the frequency range where the resonant peak is located, the frequency response curve having two or more resonant peaks may increase the frequency range of high sensitivity of the vibration sensor. The vibration mode refers to a vibration state with a fixed frequency, a damping ratio, and a mode shape. Different vibration modes may correspond to different deformation forms, e.g., the plurality of mass elements may vibrate upwards synchronously; one mass element may vibrate upwards, one mass element may vibrate downwards, etc. The vibration mode may depend on properties of the vibration component, e.g., a stiffness and a size of the mass elements, a size, a position, and a density of counterweights, etc. In some embodiments, one mass element may produce one mode, two mass elements may produce two modes, three mass elements may produce three effective modes or two effective modes. The effective mode refers to a mode causing a volume change of an air gap.

In some embodiments, at least one plate-shaped structure of the one or more plate-shaped structures may be a film-shaped structure 3422. The film-shaped structure 3422 may include a rigid film or a flexible film. The rigid film refers to a film of which a Young's modulus is greater than a first modulus threshold (e.g., 50 GPa). The flexible film refers to a film of which a Young's modulus is less than a second modulus threshold. In some embodiments, the first modulus threshold or the second modulus threshold may be set according to actual needs. In some embodiments, the first modulus threshold may or may not be equal to the second modulus threshold. For example, the first modulus threshold may be 20 GPa, 30 GPa, 40 GPa, 50 GPa, etc., and the second modulus threshold may be 1 MPa, 10 MPa, 1 GPa, 10 GPa, etc. In some embodiments, there may be a plurality of mass blocks 3424 arranged on both sides of the film-shaped structure 3422 respectively. In some embodiments, the plurality of mass blocks 3424 may also be arranged on the same side of the film-shaped structure 3422. In some embodiments, the plurality of mass blocks 3424 may be collinearly or non-collinearly arranged. For example, in some embodiments, if there are four mass blocks, two or three mass blocks of the four mass blocks may be collinearly arranged. In addition, the four mass blocks may also be arranged in an array (e.g., a rectangular array and a ring array).

In some embodiments, at least one plate-shaped structure of the one or more plate-shaped structures 3421 may be a cantilever beam. The cantilever beam may include a rigid plate. In some embodiments, the rigid plate refers to a plate of which a Young's modulus is greater than a third modulus threshold (e.g., 50 GPa). In some embodiments, the third modulus threshold may be set according to actual needs, e.g., 20 GPa, 30 GPa, 40 GPa, 50 GPa, etc.

In some embodiments, the one or more plate-shaped structures may include at least one film-shaped structure 3422 and at least one cantilever beam 3421. The descriptions regarding the plate-shaped structure being the cantilever beam 3421 may be found in the relevant contents in FIG. 30 hereinafter, which is not repeated here.

In some embodiments, the vibration component may include the cantilever beam 3421 and the film-shaped structure 3422 in sequence in a direction away from the acoustic transducer 3410 in the sound pickup hole 3411. In some embodiments, one or more mass elements 3423 may be arranged on the cantilever beam 3421. The one or more mass elements 3423 may be located at a free end of the cantilever beam 3421 and colinearly arranged with the cantilever beam 3421. In some embodiments, the one or more mass elements 3423 may be arranged on the film-shaped structure 3422. In some embodiments, the cantilever beam 3421 may also be arranged on a side of the diaphragm 3422 away from the acoustic transducer 3410. In some embodiments, the cantilever beam 3421 and the mass elements 3423 may correspond to a resonant frequency. The diaphragm 3422 and the plurality of mass elements 3424 may correspond to one or two resonant frequencies. In some embodiments, the three resonant frequencies may be different, so that the frequency response curve of the vibration sensor under an action of the vibration component 3400 may have three resonant peaks, thereby forming a plurality of frequency ranges of high sensitivity and a wider frequency range.

In some embodiments, the film-shaped structure 3422 may be a gas-permeable film or a gas-impermeable film. When the film-shaped structure 3422 is the gas-permeable film, the acoustic cavities inside the vibration sensor 3400 may be spatially connected through the film-shaped structure 3422 with gas-permeability, so as to adjust an air pressure between the acoustic cavities, balance an air pressure difference in the two acoustic cavities, and prevent damage to the vibration sensor 3400 due to a large air pressure difference. Besides, air vibrations (e.g., sound waves) may pass through the film-shaped structure 3422 as completely as possible, and then the vibrations may be picked up by the sound pickup device, thereby effectively improving the sound pickup quality. In some embodiments, the film-shaped structure 3422 or the mass elements 3424 may be made of a gas-permeable material. In some embodiments, a first hole part may be arranged on the film-shaped structure 3422. The first hole part may be arranged in a region on the film-shaped structure 3422 not covered by the mass elements 3424. The first hole part may enable the acoustic cavities (e.g., the acoustic cavities on both sides of the film-shaped structure 3422) inside the vibration sensor 3400 to be spatially connected. In some embodiments, the first hole part may be arranged on both the film-shaped structure 3422 and the mass elements 3424. For example, a first sub-hole part may be arranged on the film-shaped structure 3422, and a second sub-hole part may be arranged on the mass elements 3424. The first sub-hole part may be spatially connected to the second sub-hole part. In some embodiments, the film-shaped structure 3422 farthest from the acoustic transducer 3410 may be configured to be gas-impermeable to close the space of a support structure 3420, so that the air in the support structure 3420 may not escape during air vibration, ensuring that the effect of air compression, and making the vibration sensor 3400 has a better sound pickup effect.

It should be noted that the conduction housing of the vibration sensor 3100 or the hole parts on the housing 3110 shown in FIG. 26 may also be applicable to the vibration sensor 3400 shown in FIG. 29, which is not repeated here.

Figure 30:
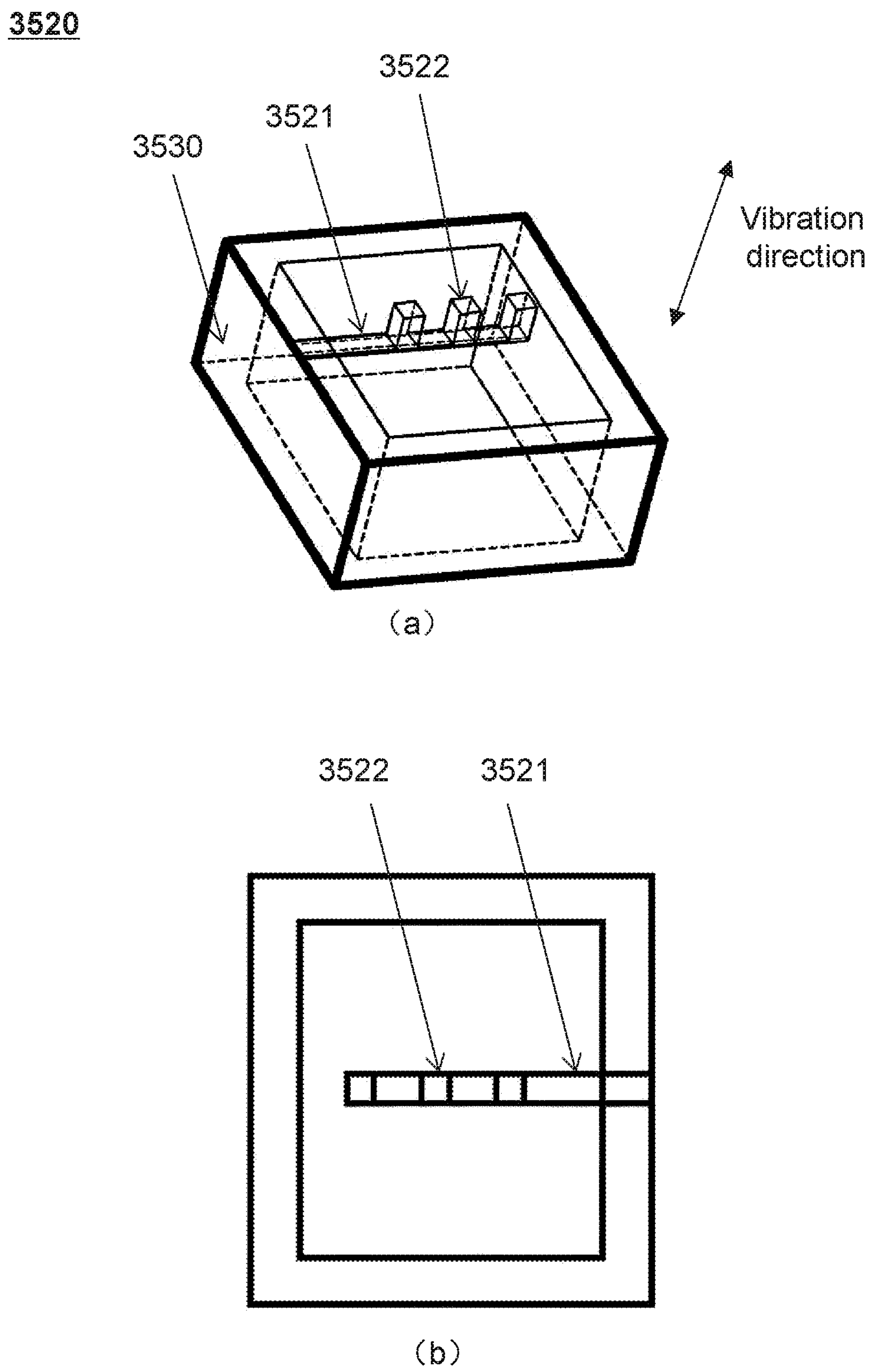
FIG. 30 is a schematic diagram illustrating a structure of a vibration component of a vibration sensor according to some embodiments of the present disclosure.

FIG. 30 is a schematic diagram illustrating a structure of a vibration component of a vibration sensor according to some embodiments of the present disclosure. FIG. 30(*a*) is a schematic diagram illustrating a three-dimensional structure of a vibration component 3520;

FIG. 30(*b*) is a projection view illustrating the vibration component 3520 shown in FIG. 30(*a*) in a vibration direction; FIG. 30(*b*) is a projection view illustrating a vibration component 820 shown in FIG. 30(*a*) in a direction perpendicular to the vibration direction.

As shown in FIG. 30(*a*), the vibration component may include a support structure 3530, a cantilever beam 3521, and a mass element 3522. One end of the cantilever beam 3521 may be physically connected to one side of the support structure 3530, and the other end of the cantilever beam 3521 may be a free end. The mass element 3522 may be physically connected to the free end of the cantilever beam 3521. Specifically, a physical connection manner between the cantilever beam 3521 and the support structure 3530 may include welding, clamping, bonding, integral molding, etc., which is not limited here. In some embodiments, the vibration component may not include the support structure 3530. The cantilever beam 3521 may be arranged in a conduction channel of a sound pickup hole along a radial section of the conduction channel of the sound pickup hole or arranged on an outer side of the conduction channel, and the cantilever beam 3521 may not completely cover the conduction channel.

In some embodiments, a material of the cantilever beam 3521 may include at least one of copper, aluminum, tin, silicon, silicon oxide, silicon nitride, silicon carbide, aluminum nitride, zinc oxide, lead zirconate titanate, or alloys. In some embodiments, the mass element 3522 may be arranged on any side of the cantilever beam 3521 in the vibration direction. The mass element 3522 being arranged on a side of the cantilever beam 3521 away from a transducer in the vibration direction is taken for explanation.

In some embodiments, at least one mass element 3522 may be arranged on either side of the free end of the cantilever beam 3521 perpendicular to the vibration direction. Sizes of all the mass elements 3522 may be partly or all the same, or all different. In some embodiments, a distance between adjacent mass elements 3522 may be the same or different. In actual application, the distance may be designed according to a vibration mode.

Referring to FIG. 30(*a*) and FIG. 30(*b*) simultaneously, in some embodiments, three mass elements 3522 may be arranged on the cantilever beam 3521. The sizes of the three mass elements 3522 on the cantilever beam 3521 may be the same, and center points of the three mass elements 3522 on the cantilever beam 3521 may be colinear. In some embodiments, since a width of the cantilever beam 3521 is relatively narrow in a horizontal direction perpendicular to the vibration direction, preferably, one or more mass elements 3522 may be collinearly arranged with the cantilever beam 3521, so as to obtain a more stable increase in sensitivity.

In some embodiments, the cantilever beam 3521 may have a rectangular profile on a radial section. In some other embodiments, the cantilever beam 3521 may have a rectangular, triangular, trapezoidal, rhombus, and other curved shapes on the radial section. In some embodiments, a plurality of resonant peaks of the vibration sensor may be adjusted by changing the material, the shape, and the size of the cantilever beam 3521 and the mass element 3522.

In some embodiments, the vibration sensor may be applied to the design of a MEMS device. In some embodiments, the vibration sensor may be applied to the design of a macroscopic device (e.g., a microphone, a loudspeaker, etc.). In the MEMS device process, the cantilever beam 3521 may be a single-layer material along a thickness direction, e.g., Si, SiO2, SiNx, SiC, etc., or may be a double-layer or multi-layer composite material, e.g., Si/SiO2, SiO2/Si, Si/SiNx, SiNx/Si/SiO2, etc. The mass element 3522 may be a single-layer material, e.g., Si, Cu, etc., or a double-layer or multi-layer composite material, e.g., Si/SiO2, SiO2/Si, Si/SiNx, SiNx/Si/SiO2, etc. In the embodiments of the present disclosure, the material of the cantilever beam 821 of the MEMS device may be Si or SiO2/SiNx, and the material of the mass element 3522 may be Si. In the MEMS device process, in some embodiments, a length of the cantilever beam 3521 may be in a range of 500 μm-1500 μm; in some embodiments, a thickness of the cantilever beam 3521 may be in a range of 0.5 μm-5 μm; in some embodiments, a side length of the mass element 3522 may be in a range of 50 μm-1000 μm; in some embodiments, a height of the mass element 5322 may be in a range of 50 μm-5000 μm. In some embodiments, the length of the cantilever beam 5321 may be in a range of 700 μm-1200 μm, and the thickness of the cantilever beam 3521 may be in a range of 0.8 μm-2.5 μm; a side length of the mass element 3522 may be in a range of 200 μm-600 μm, and a height of the mass element 3522 may be in a range of 200 μm-1000 μm.

In the macroscopic device, the material of the cantilever beam 3521 may be an inorganic non-metallic material, e.g., aluminum nitride, zinc oxide, lead zirconate titanate, etc., or a metal material, e.g., copper, aluminum, tin, or other alloys, or a combination thereof. The mass element 3522 is generally required to have a certain mass in the smallest possible volume. Thus, the mass element 3522 may have a high density, and the material of the mass element 3522 may be copper, tin, other alloys, or ceramic materials. Preferably, the material of the cantilever beam 3521 may be aluminum nitride or copper, and the material of the mass element 3522 may be a tin block or a copper block. In the macroscopic device, the length of the cantilever beam 3521 may be in a range of 1 mm-20 cm, and the thickness of the cantilever beam 3521 may be in a range of 0.1 mm-10 mm. In some embodiments, the side length of the mass element 3522 may be in a range of 0.2 mm-5 cm, and the height of the mass element 3522 may be in a range of 0.1 mm-10 mm. In some embodiments, the length of the cantilever beam 3521 may be in a range of 1.5 mm-10 mm, and the thickness of the cantilever beam 3521 may be in a range of 0.2 mm-5 mm. The side length of the mass element 3522 may be in a range of 0.3 mm-5 cm, and the height of the mass element 3522 may be in a range of 0.5 mm-5 cm.

In some embodiments, two mass elements may be arranged on the cantilever beam of the vibration component, and the two mass elements may have different heights in the vibration direction. In some embodiments, the height of the mass element near the free end of the cantilever beam may be lower than the height of the mass element away from the free end of the cantilever beam. In some embodiments, the mass element near the free end of the cantilever beam may be higher than the mass element away from the free end of the cantilever beam. It should be noted that even though other structural parameters of the two mass elements are the same, since the positions of the mass elements in the above two cases are different, in some embodiments, the two cases may have two different resonant peaks.

In some embodiments, there may be one or four mass elements on the cantilever beam. The structural parameters of the four mass elements arranged on the cantilever beam may be the same, partly different, or all different.

Figure 31:
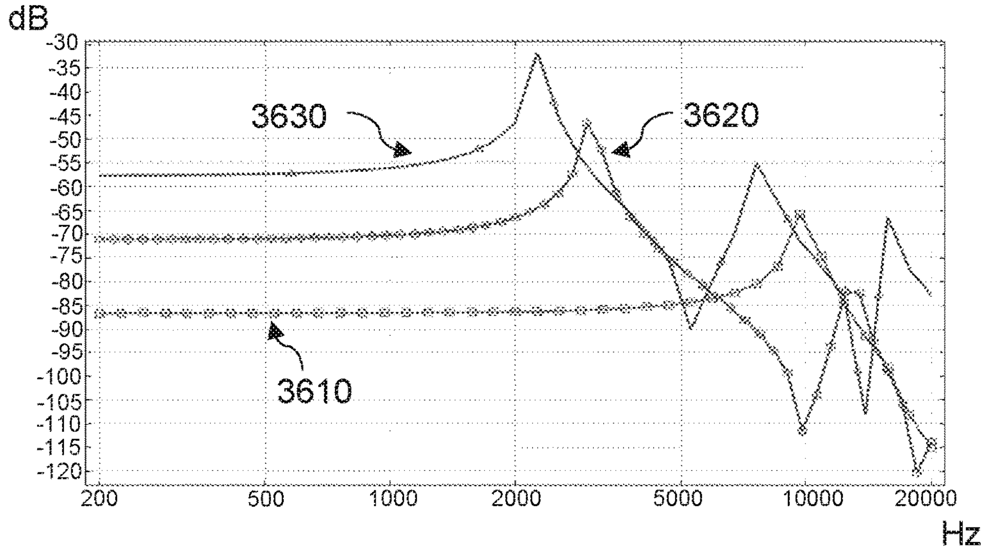
FIG. 31 is a schematic diagram illustrating frequency response curves when a vibration component of a vibration sensor has different counts of mass elements according to some embodiments of the present disclosure.

FIG. 31 is a schematic diagram illustrating frequency response curves when a vibration component of a vibration sensor 3600 has different counts of mass elements according to some embodiments of the present disclosure.

As shown in FIG. 31, in some embodiments, the frequency response curve of the vibration sensor 3600 under an action of a cantilever beam and mass element may have one or more resonant peaks. FIG. 31 includes three frequency response curves: a frequency response curve 3610, a frequency response curve 3620, and a frequency response curve 3630. The frequency response curve 3610 represents the frequency response curve of the vibration sensor when one mass element is arranged on the cantilever beam; the frequency response curve 3620 represents the frequency response curve of the vibration sensor when two mass elements are arranged on the cantilever beam; and the frequency response curve 3630 represents the frequency response curve of the vibration sensor when three mass elements are arranged on the cantilever beam. It can be seen from the figure that the frequency response curve 3610 has one resonant peak, the frequency response curve 3620 has two resonant peaks, and the frequency response curve 3630 has three resonant peaks.

In some embodiments, the arrangement manner of the mass elements on the cantilever beam may be found in the foregoing manner, and the arrangement manner of the three mass elements may be found in FIG. 30. It can be seen from the figure that when there is only one mass element, the resonant peak of the vibration sensor may be around 10 kHz, and when there are two resonant peaks, the vibration sensor may form two resonant peaks at 3 kHz and 13 kHz. The two mass elements are arranged, so that the sensitivity within a target frequency (e.g., in a range of 2 kHz-15 kHz) near the two frequency points may be significantly improved. When three mass elements are arranged on the same cantilever beam, the vibration sensor may form three resonant peaks. Specifically, the vibration sensor may form three resonant peaks at 2250 Hz, 7600 Hz, and 15700 Hz, making the sensitivity within the target frequency (e.g., 1 kHz-20 kHz) near the three frequency points significantly improved, and naturally dividing the frequency response curve into three different frequency ranges, which may be beneficial to subsequent signal processing. Furthermore, it can be seen from the figure that with the increase in the count of mass elements, the overall sensitivity of the vibration sensor may also be improved. For example, when the frequency response curve 3630 is in a low-frequency range (e.g., below 1 kHz), the sensitivity may still be higher than that of the frequency response curve 3630. Accordingly, after setting plate-shaped structures and the mass elements reasonably, a bandwidth of a frequency range with a relatively high sensitivity may be widened and the sensitivity in the target frequency range may be improved.

Figure 32:
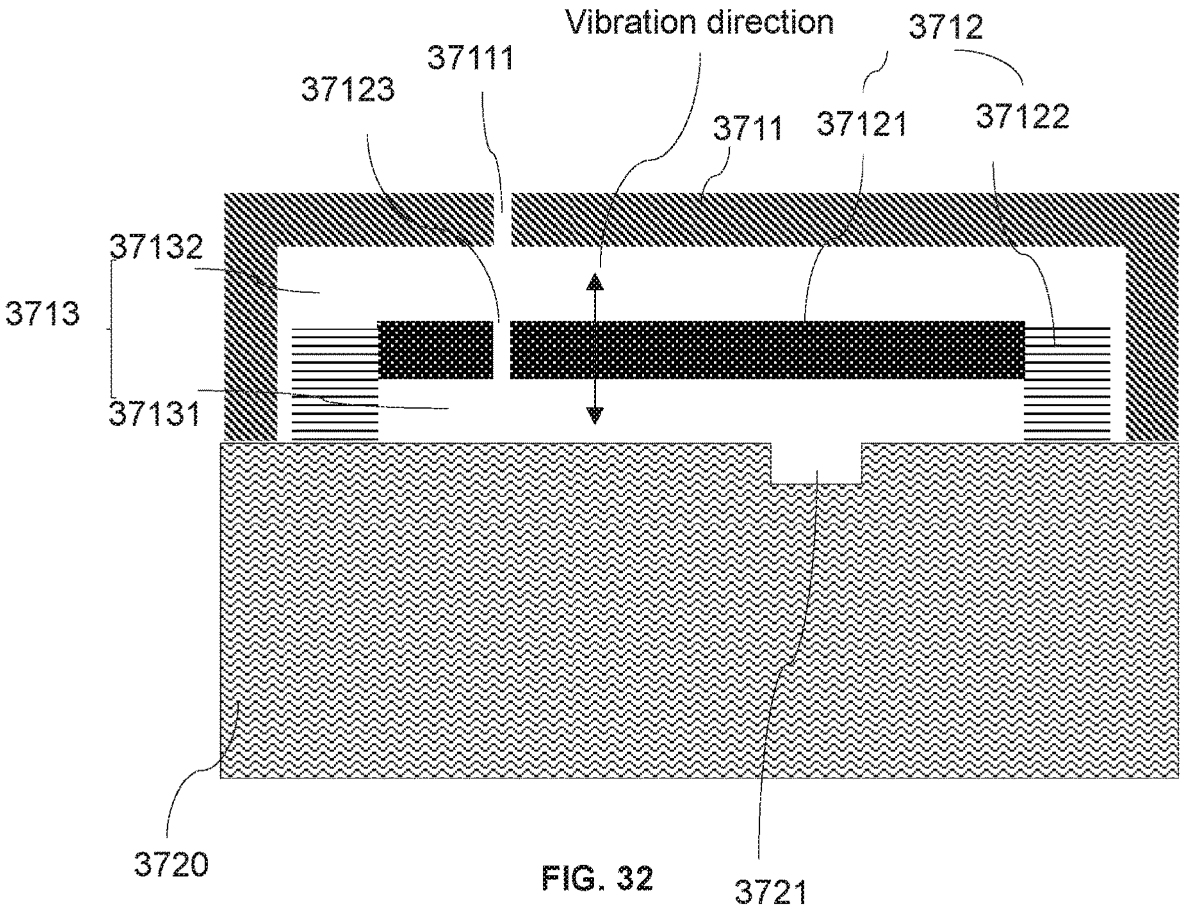
FIG. 32 is a schematic diagram illustrating a structure of a vibration sensor according to some embodiments of the present disclosure.

FIG. 32 is a schematic diagram illustrating a structure of a vibration sensor according to some embodiments of the present disclosure. As shown in FIG. 32, a vibration sensor 3700 may include a housing 3711, a vibration component 3712, and an acoustic transducer 3720. In some embodiments, the housing 3711 may be connected to the acoustic transducer 3720 to enclose a structure having an acoustic cavity 3713. A connection mode between the housing 3711 and the acoustic transducer 3720 may be a physical connection. In some embodiments, the vibratory component 3712 may be located in the acoustic cavity 3713. In some embodiments, the vibration component 3712 may divide the acoustic cavity 3713 into a first acoustic cavity 37131 and a second acoustic cavity 37132. For example, the vibration component 3712 and the housing 3711 may form the second acoustic cavity 37132. The vibration component 3712 and the acoustic transducer 3720 may form the first acoustic cavity 37131. It should be noted that the housing 3711 here is a housing structure independent of the acoustic transducer 3720. In some embodiments, the housing 3711 may also be a housing structure of an entire vibration sensor 3700, and then the vibration component 3712 and the acoustic transducer 3720 may be located in an inner space of the housing 3711.

In some embodiments, the first acoustic cavity 37131 may be acoustically connected to the acoustic transducer 3720. Merely by way of example, the acoustic transducer 3720 may include a sound pickup hole 3721, and the acoustic transducer 3720 may be acoustically connected to the first acoustic cavity 37131 through the sound pickup hole 3721. It should be noted that the depiction of a single sound pickup hole 3721 as shown in FIG. 32 is for illustration only and is not intended to limit the scope of the present disclosure. It should be understood that the vibration sensor 3700 may include more than one sound pickup hole. For example, the vibration sensor 3700 may include a plurality of sound pickup holes arranged in an array.

In some embodiments, the vibration component 3712 may include a mass element 37121 and an elastic element 37122. In some embodiments, the mass element 37121 and the elastic element 37122 may be physically connected, e.g., gluing. Merely by way of example, the elastic element 37122 may be a material with a certain viscosity, and may be directly bonded to the mass element 7121. In some embodiments, the elastic element 37122 may be a high-temperature resistant material, so that the elastic element 37122 may maintain its performance during a manufacturing process of the vibration sensor 3700. In some embodiments, when the elastic element 37122 is in an environment of 200° C.-300° C., its Young's modulus and shear modulus may have no change or little change (e.g., the change may be within 5%). The Young's modulus is used to characterize the deformation ability of the elastic element 37122 when the elastic element 37122 is stretched or compressed, and the shear modulus is used to characterize the deformation ability of the elastic element 37122 when the elastic element 37122 is sheared. In some embodiments, the elastic element 37122 may be a material with a good elasticity (i.e., easily elastically deformed), so that the vibrating component 3712 may generate vibrations in response to vibrations of the housing 3711. Merely by way of example, the material of the elastic element 37122 may include silicone rubber, silicone gel, a silicone sealant, or the like, or any combination thereof.

In some embodiments, the elastic element 37122 may be connected to a sidewall of the mass element 37121 in a surrounding manner. An inner side of the elastic element 37122 may be connected to the sidewall of the mass element 37121. The inner side of the elastic element 37122 refers to a side where a space surrounded by the elastic element 37122 is located. The sidewall of the mass element 37121 refers to a side of the mass element 37121 parallel to a vibration direction. Upper and lower surfaces of the mass element 37121 may be approximately perpendicular to the vibration direction, and configured to define the second acoustic cavity 37132 and the first acoustic cavity 37131 respectively. Since the elastic element 37122 is connected to the sidewall of the mass element 37121 in a surrounding manner, when the vibration assembly 3712 generates the vibrations along the vibration direction, a momentum of the mass element 37121 may be converted into an acting force on the elastic element 3722, causing the elastic element 37122 to undergo shear deformation. Compared with tensile and compressive deformation, the shear deformation may reduce a spring constant of the elastic element 37122, which may reduce a resonant frequency of the vibration sensor 3700, thereby increasing a vibration amplitude of the mass element 37121 during the vibrations of the vibration component 3712, and improving the sensitivity of the vibration sensor 3700.

In some embodiments, a shape of the elastic element 37122 may conform to a shape of the mass element 37121. For example, the elastic element 37122 may be a tubular structure, and an open end of the tubular structure may have the same cross-sectional shape as that of the mass element 37121 on a cross section perpendicular to the vibration direction of the mass element 37121. The open end of the elastic element 37122 may be an end connected to the mass element 37121. The shape of the mass element 37121 on the cross section perpendicular to the vibration direction of the mass element 37121 may be quadrilateral, and a region surrounded by the elastic element 37122 may be tubular. The tubular shape may have a quadrilateral hole on the cross section perpendicular to the vibration direction of the mass element 37121. Merely by way of example, the shape of the mass element 37121 on the cross section perpendicular to the vibration direction of the mass element 37121 may also include regular shapes (e.g., a circle, an ellipse, a sector, a rounded rectangle, and a polygon) and irregular shapes. Correspondingly, a shape of the tubular shape surrounded by the elastic element 37122 on the cross section perpendicular to the vibration direction of the mass element 37121 may include a tubular shape with an aperture of a regular shape or an irregular shape. The shape of the tubular elastic element 37122 may not be limited in the present disclosure. An outer side of the elastic element 37122 may be a side opposite an inner side 37124 of the elastic element 37122. For example, a shape of the outer side of the tubular elastic element 37122 may include a cylindrical shape, an elliptical cylindrical shape, a conical shape, a rounded rectangular pillar, a rectangular pillar, a polygonal pillar, an irregular pillar, or the like, or any combination thereof.

In some embodiments, the elastic element 37122 may extend towards the acoustic transducer 3720 and be directly or indirectly connected to the acoustic transducer 3720. For example, one end of the elastic element 37122 extending towards the acoustic transducer 3720 may be directly connected to the acoustic transducer 3720. A connection manner between the elastic element 37122 and the acoustic transducer 3720 may be a physical connection, e.g., gluing. In some embodiments, the elastic element 37122 and the housing 3711 may be directly contacted or separated. For example, as shown in FIG. 32, there may be a gap between the elastic element 37122 and the housing 3711. A size of the gap is adjusted by the designer according to a size of the vibration sensor 3700.

In some embodiments, at least one first hole part 37123 may be arranged on the mass element 37121. The first hole part 37123 may penetrate through the mass element 37121, and the first hole part 37123 may make gas in the first acoustic cavity 37131 and the second acoustic cavity 37132 communicate, thereby balancing an air pressure change inside the first acoustic cavity 37131 and the second acoustic cavity 37132 caused by a temperature change during the preparation process (e.g., a reflow soldering process) of the vibration sensor 3700, reducing or preventing damage to components of the vibration sensor 3700 caused by the air pressure change, e.g., cracking, deformation, etc. In some embodiments, the first hole part 37123 may also be arranged on the elastic element 37122, and the first hole part 37123 may penetrate through the sidewall of the elastic element 37122, so that the first acoustic cavity 37131 may be spatially connected to the second acoustic cavity 37132. In some embodiments, the first hole part 37123 may be arranged on the mass element 37121 and the elastic element 37122 simultaneously.

In some embodiments, at least one second hole part 37111 (or third hole part) may be arranged on the housing 3711, and the second hole part 37111 may penetrate through the housing 3711. When the mass element 37121 generate the vibrations, the second hole part 37111 may be used to reduce damping generated by the gas inside the second acoustic cavity 37332.

In some embodiments, the first hole part 37123 or the second hole part 37111 may be a single hole. In some embodiments, a diameter of the single hole may be in a range of 1-50 μm. Preferably, the diameter of the single hole may be in a range of 2-45 μm. More preferably, the diameter of the single hole may be in a range of 3-40 μm. More preferably, the single hole may have a diameter of 4-35 um. More preferably, the diameter of the single hole may be in a range of 5-30 μm. More preferably, the diameter of the single hole may be in a range of 5-25 μm. More preferably, the diameter of the single hole may be in a range of 5-20 μm. More preferably, the diameter of the single hole may be in a range of 6-15 μm. More preferably, the diameter of the single hole may be in a range of 7-10 μm. In some embodiments, the first hole part 37123 or the second hole part 37111 may be an array composed of a certain count of micropores. Merely by way of example, the count of micropores may be in a range of 2-10. In some embodiments, a diameter of each micropore may be in a range of 0.1-25 μm. Preferably, the diameter of each micropore may be in a range of 0.5-20 μm. More preferably, the diameter of each micropore may be in a range of 0.5-25 μm. More preferably, the diameter of each micropore may be in a range of 0.5-20 μm. More preferably, the diameter of each micropore may be in a range of 0.5-15 μm. More preferably, the diameter of each micropore may be in a range of 0.5-10 μm. More preferably, the diameter of each micropore may be in a range of 0.5-5 μm. More preferably, the diameter of each micropore may be in a range of 0.5-4 μm. More preferably, the diameter of each micropore may be in a range of 0.5-3 μm. More preferably, the diameter of each micropore may be in a range of 0.5-2 μm. More preferably, the diameter of each micropore may be in a range of 0.5-1 μm.

In some embodiments, air conduction sound in the environment may affect the use performance of the vibration sensor 3700. In order to reduce the impact of the air conduction sound in the environment, after the vibration sensor 3700 is prepared, for example, after reflow soldering, at least one second hole part 37111 on the housing 3711 may be sealed with a sealing material. Merely by way of example, the sealing material may include epoxy glue, a silicon sealant, or the like, or any combination thereof.

In some embodiments, there may be no hole parts on the housing 3711 or the mass element 37121. In some embodiments, when the second hole part is not arranged in the housing 3711 or the mass element 37121, a connection strength between the parts of the vibration sensor 3700 may be increased (e.g., the connection strength of the glue connecting the parts may be enhanced), to prevent the components of the vibration sensor 3700 from being damaged due to an air pressure change in the first acoustic cavity 37131 and the second acoustic cavity 37332.

It should be noted that the description of the vibration sensor 3700 and components thereof is only for illustration and description, and does not limit the scope of application of the present disclosure. For those skilled in the art, various modifications and changes can be made to the vibration sensor 3700 under the guidance of the present disclosure. In some embodiments, at least one hole part may be arranged on the acoustic transducer 3720, and the hole part may be spatially connected to the acoustic cavity 3713 through the sound pickup hole 3721 and the first hole part 37123. Such amendments and changes are still within the scope of the present disclosure.

The basic concept has been described above, obviously, for those skilled in the art, the above detailed disclosure is only an example, and does not constitute a limitation to the present disclosure. Although not expressly stated here, those skilled in the art may make various modifications, improvements, and corrections to the present disclosure. Such modifications, improvements, and corrections are suggested in the present disclosure, so such modifications, improvements, and corrections still belong to the spirit and scope of the exemplary embodiments of the present disclosure.

Meanwhile, the present disclosure uses specific words to describe the embodiments of the present disclosure. For example, "one embodiment", "an embodiment", and/or "some embodiments" refer to a certain feature, structure, or characteristic related to at least one embodiment of the present disclosure. Therefore, it should be emphasized and noted that references to "one embodiment," "an embodiment" or "an alternative embodiment" two or more times in different places in the present disclosure do not necessarily refer to the same embodiment. In addition, certain features, structures, or characteristics in one or more embodiments of the present disclosure may be properly combined.

In addition, unless clearly stated in the claims, the sequence of processing elements and sequences described in the present disclosure, the use of counts and letters, or the use of other names are not used to limit the sequence of processes and methods in the present disclosure. While the foregoing disclosure has discussed by way of various examples some embodiments of the invention that are presently believed to be useful, it should be understood that such detail is for illustrative purposes only and that the appended claims are not limited to the disclosed embodiments, but rather, the claims are intended to cover all modifications and equivalent combinations that fall within the spirit and scope of the embodiments of the present disclosure. For example, although the implementation of various components described above may be embodied in a hardware device, it may also be implemented as a software-only solution, e.g., an installation on an existing server or mobile device.

In the same way, it should be noted that in order to simplify the expression disclosed in this disclosure and help the understanding of one or more embodiments of the invention, in the foregoing description of the embodiments of the present disclosure, sometimes multiple features are combined into one embodiment, drawings or descriptions thereof. This method of disclosure does not, however, imply that the subject matter of the disclosure requires more features than are recited in the claims. Rather, claimed subject matter may lie in less than all features of a single foregoing disclosed embodiment.

In some embodiments, counts describing the quantity of components and attributes are used. It should be understood that such counts used in the description of the embodiments use the modifiers "about", "approximately" or "substantially" in some examples. Unless otherwise stated, "about", "approximately" or "substantially" indicates that the stated figure allows for a variation of ±20%. Accordingly, in some embodiments, the numerical parameters used in the disclosure and claims are approximations that can vary depending on the desired characteristics of individual embodiments. In some embodiments, numerical parameters should consider the specified significant digits and adopt the general digit retention method. Although the numerical ranges and parameters used in some embodiments of the present disclosure to confirm the breadth of the range are approximations, in specific embodiments, such numerical values are set as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A vibration sensor, comprising:

an acoustic transducer and a vibration component; and a housing configured to accommodate the acoustic transducer and the vibration component, and generate vibrations based on an external vibration signal, wherein the vibration component and the acoustic transducer form a plurality of acoustic cavities including a first acoustic cavity, the first acoustic cavity being spatially connected to the acoustic transducer, the vibration component causing a sound pressure change of the first acoustic cavity in response to the vibrations of the housing, the acoustic transducer generating an electrical signal based on the sound pressure change of the first acoustic cavity, and the vibration component includes a first hole part, a mass element, and an elastic element, the first acoustic cavity being spatially connected to the other acoustic cavities of the plurality of acoustic cavities through the first hole part, the mass element being connected to the elastic element, the elastic element being connected to the housing or the acoustic transducer, the first hole part being located at the elastic element or the mass element, both the mass element and the elastic element are made of a gas-permeable material.

2. The vibration sensor of claim 1, wherein the first hole part includes a first sub-hole part, the first sub-hole part is located on the elastic element, and the first sub-hole part is spatially connected to the first acoustic cavity and the other acoustic cavities.

3. The vibration sensor of claim 2, wherein the first sub-hole part is located in a region on the elastic element not covered by the mass element.

4. The vibration sensor of claim 3, wherein the acoustic transducer has a first resonant frequency, a vibration component has a second resonant frequency, and the second resonant frequency is lower than the first resonant frequency.

5. The vibration sensor of claim 3, wherein the mass element includes a plurality of sub-mass elements separated from each other, and the plurality of sub-mass elements are distributed in different regions of the elastic element.

6. The vibration sensor of claim 1, wherein the housing includes a second hole part, and the first acoustic cavity, the other acoustic cavities, and the acoustic transducer are spatially connected to outside through the second hole part.

7. The vibration sensor of claim 6, wherein when the vibration sensor is in an operating state, the second hole part is in a closed state.

8. The vibration sensor of claim 1, wherein the housing includes a third hole part located at a portion of the housing corresponding to an acoustic cavity formed by the vibration component and the housing.

9. The vibration sensor of claim 8, wherein a diameter of the third hole part is in a range of 5 μm-20 μm.

10. The vibration sensor of claim 8, wherein the third hole part and the first hole part are distributed along a direction perpendicular to a vibration direction of the vibration component in a staggered manner.

11. The vibration sensor of claim 1, wherein the acoustic transducer includes a diaphragm that vibrates in response to the sound pressure change of the first acoustic cavity, and the diaphragm includes a fourth hole part.

12. The vibration sensor of claim 11, wherein the diaphragm is made of a breathable material.

13. The vibration sensor of claim 1, wherein the vibration component includes at least two elastic elements and one or more mass elements, each elastic element of the at least two elastic elements is connected to at least one mass element of the one or more mass elements; and the vibration component is configured to make a sensitivity of the vibration sensor greater than a sensitivity of the acoustic transducer in one or more target frequency ranges.

14. The vibration sensor of claim 1, wherein the elastic element is a multi-layer composite film structure, and stiffnesses of two layer films in the multi-layer composite film structure are different.

15. The vibration sensor of claim 1, wherein the acoustic transducer includes a sound pickup device and a substrate, the substrate is connected to the housing through a peripheral side of the substrate, and the sound pickup device is located on a side of the substrate away from the vibration component.

16. The vibration sensor of claim 15, wherein the substrate includes a sound pickup hole, the first acoustic cavity is spatially connected to the acoustic transducer through the sound pickup hole, the acoustic transducer obtains a sound pressure change of the first acoustic cavity, and converts the sound pressure change of the first acoustic cavity into an electrical signal.

* * * * *